United States Patent [19]
Eastman

[11] Patent Number: 5,087,913
[45] Date of Patent: Feb. 11, 1992

[54] SHORT-RECORD DATA COMPRESSION AND DECOMPRESSION SYSTEM

[75] Inventor: Willard L. Eastman, Lexington, Mass.

[73] Assignee: Unisys Corporation, Blue Bell, Pa.

[21] Appl. No.: 572,647

[22] Filed: Aug. 27, 1990

[51] Int. Cl.⁵ ............................................. H03M 7/30
[52] U.S. Cl. .................................... 341/95; 341/65
[58] Field of Search ................. 341/65, 67, 79, 95, 341/51

[56] References Cited

U.S. PATENT DOCUMENTS

| | | | |
|---|---|---|---|
| 4,464,650 | 8/1984 | Eastman et al. | 341/67 X |
| 4,558,302 | 12/1985 | Welch | 341/95 X |
| 4,814,746 | 3/1989 | Miller et al. | 341/95 |
| 4,876,541 | 10/1989 | Storer | 341/51 |
| 4,906,991 | 3/1990 | Fiala et al. | 341/51 |

Primary Examiner—A. D. Pellinen
Assistant Examiner—Marc S. Hoff
Attorney, Agent, or Firm—Albert B. Cooper; Mark T. Starr

[57] ABSTRACT

Short-data records are compressed and decompressed by Lempel-Ziv compression and decompression utilizing a fixed searchtree database, an encoder and a decoder. The searchtree database is incrementally grown by a file preprocessor from a sample of the input data. The searchtree is fixed either when the data sample or the storage space for the searchtree is exhausted. The encoder maintains an encoded-record directory for locating the compressed records. A record located by the directory is decompressed by the decoder, and may be modified and recompressed by the encoder. Lempel-Ziv compresssion and decompression of the type of U.S. Pat. No. 4,464,650 is utilized. The preprocessor also constructs, as part of the searchtree database, a last-descendant list for use by the decoder to extend internal nodes received as leaf pointers by the appropriate number of repetitions of the first encountered symbol of the alphabet.

6 Claims, 21 Drawing Sheets

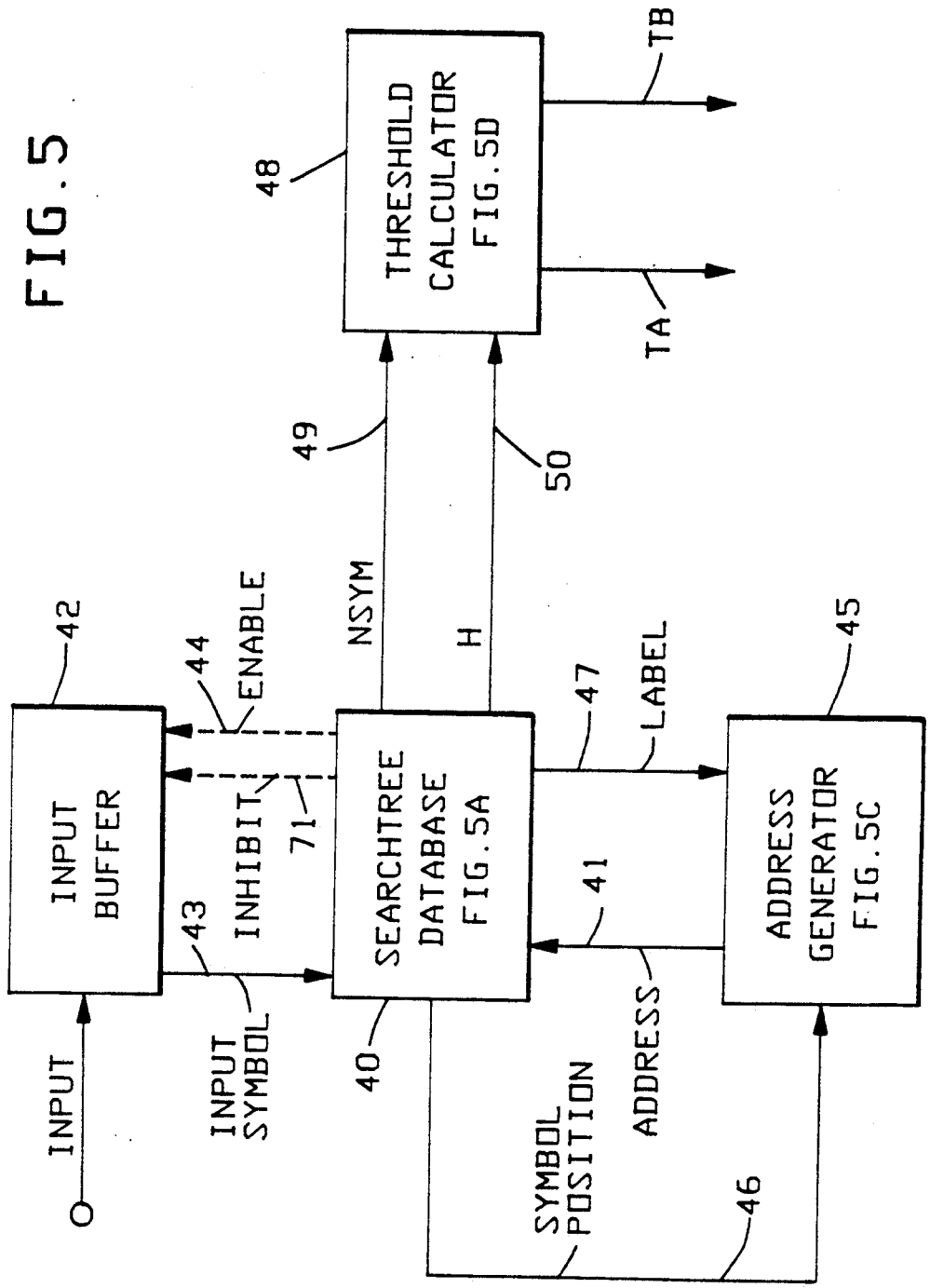

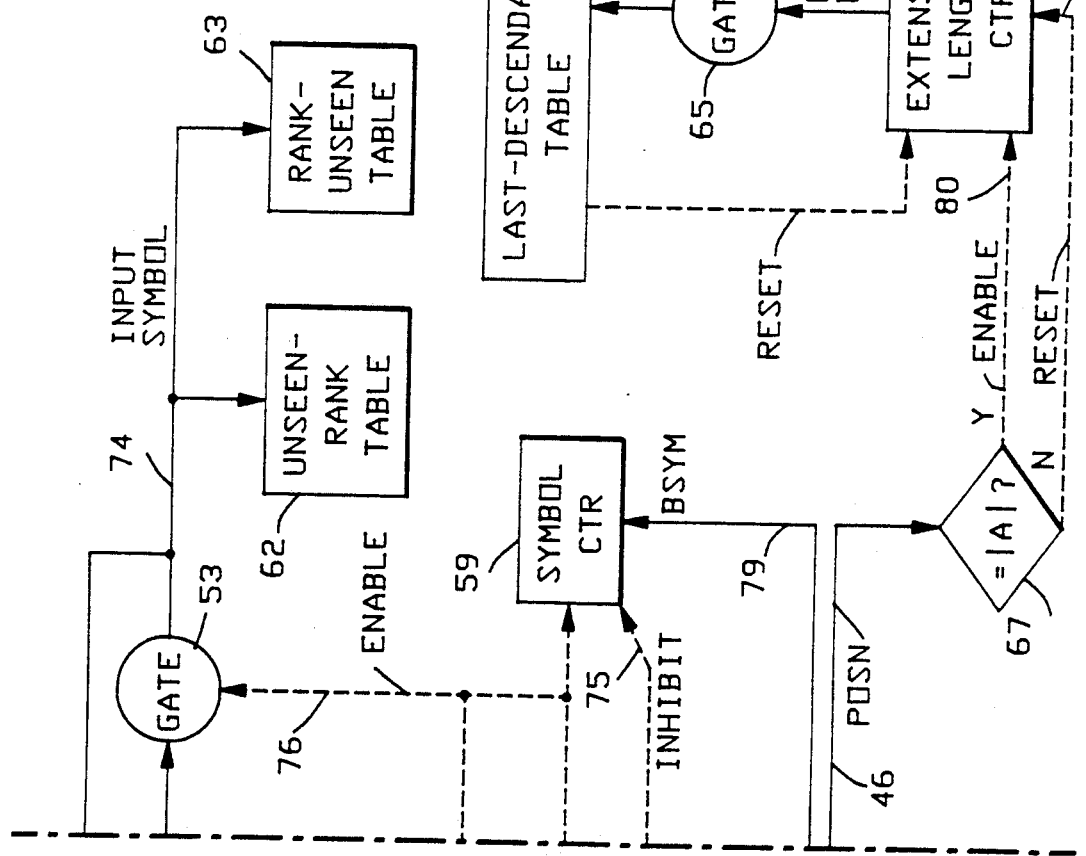

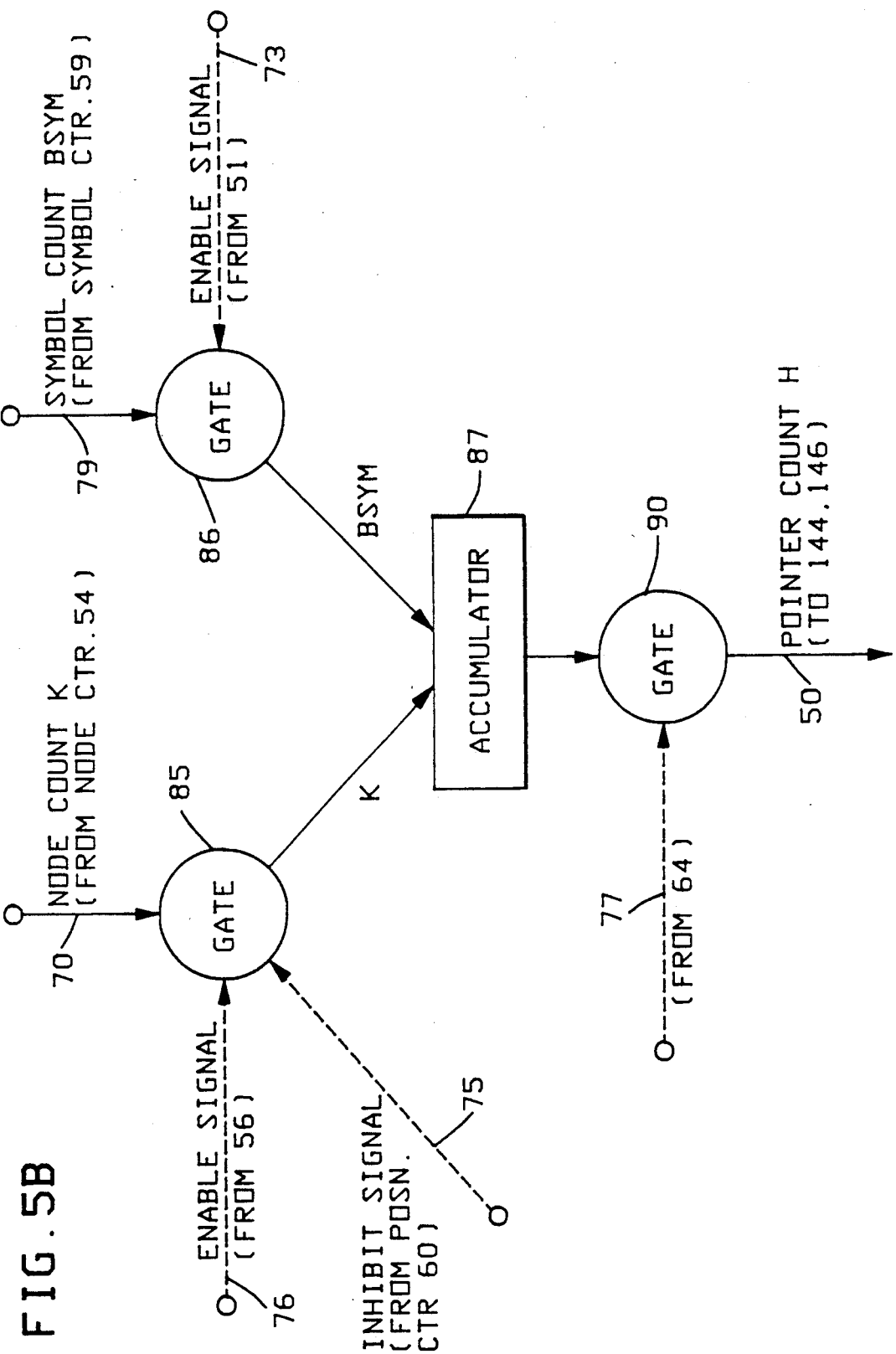

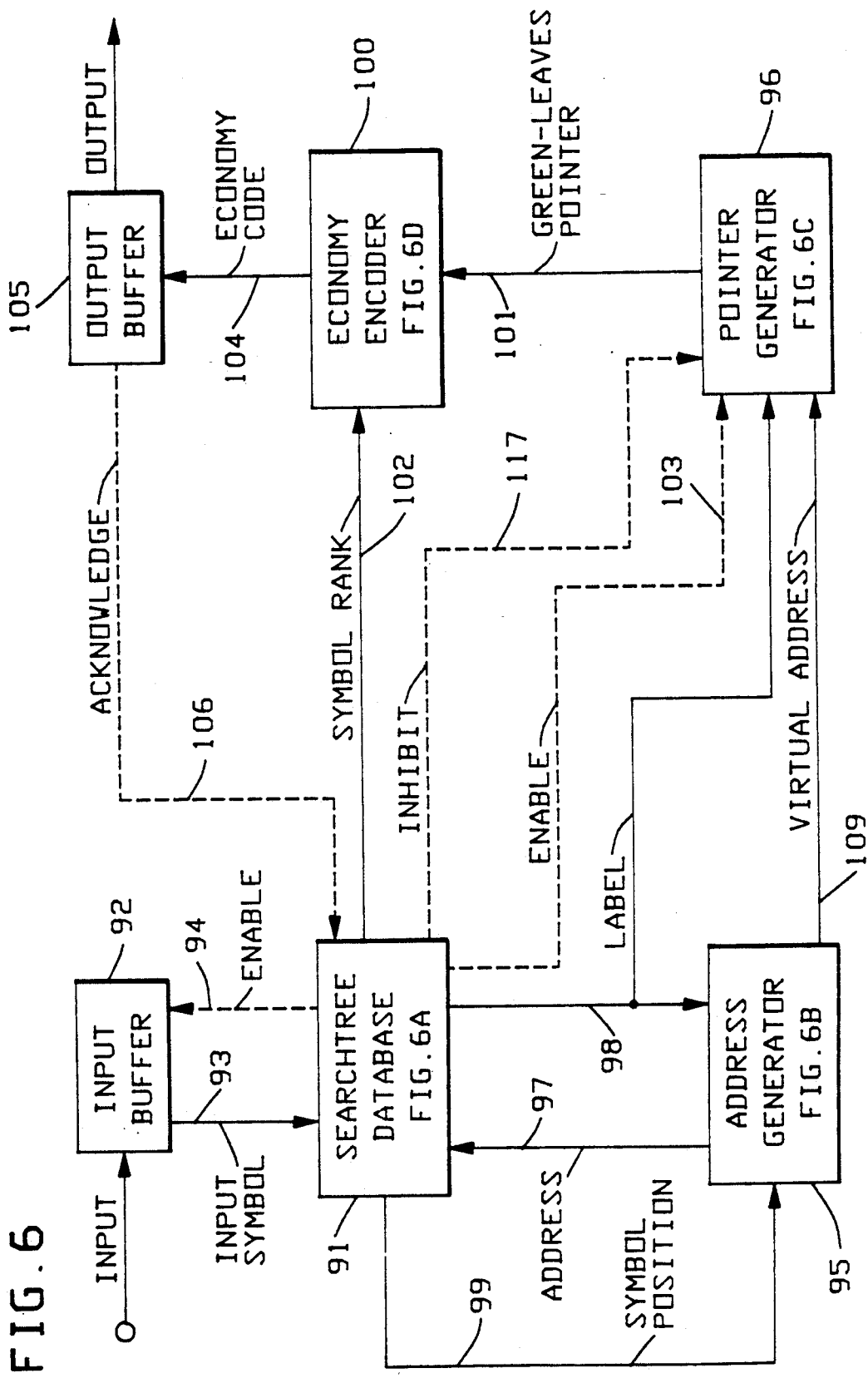

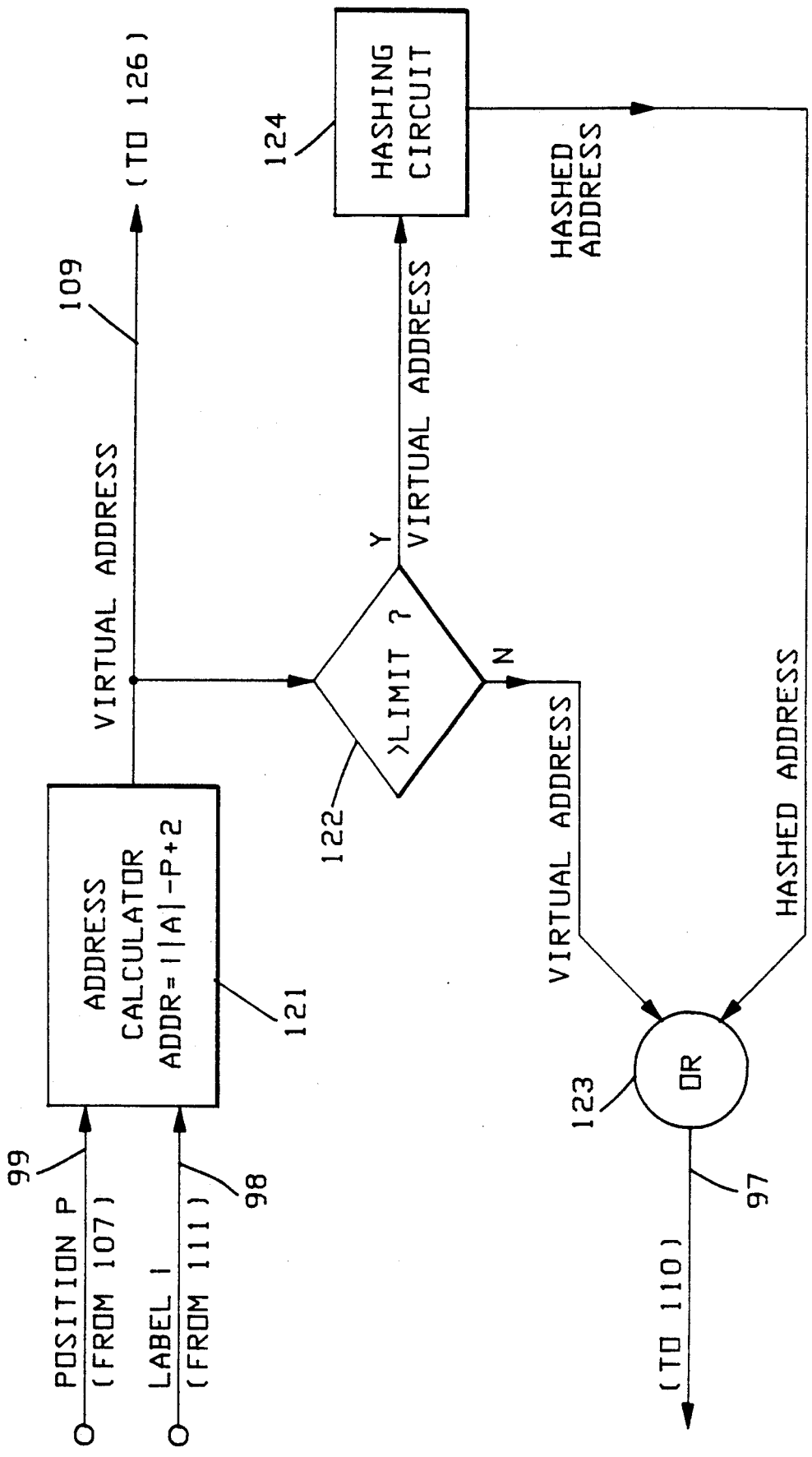

SHORT-RECORD DATA COMPRESSION AND DECOMPRESSION SYSTEM

BACKGROUND OF THE INVENTION

1. Field of the Invention

The invention relates to data compression and decompression particularly with respect to processing short records.

2. Description of the Prior Art

The prior art is exemplified by U.S. Pat. No. 4,464,650; issued Aug. 7,1984; entitled "Apparatus And Method For Compressing Data Signals And Restoring The Compressed Data Signals"; by Eastman et al. and by U.S. Pat. 4,558,302; issued Dec. 10, 1985; entitled "High Speed Data Compression And Decompression Apparatus And Method"; by Welch. Said U.S. Pat. Nos. 4,464,650 and 4,558,302 are incorporated herein by reference in their entirety. The systems of said U.S. Pat. Nos. 4,464,650 and 4,558,302 are practical implementations of Lempel-Ziv data compression and represent the state of the art in this technology.

The data compression and decompression systems of said U.S. Pat. Nos. 4,464,650 and, 5,558,302 have a disadvantage which limits the usefulness thereof in certain applications. In order to decompress any section of compressed data, it is necessary first to decompress any and all data which precedes the desired section of data in the original input file. This process can be slow and cumbersome in applications where frequent access to individual records of a file is required. Heretofore it has not been possible to retrieve and decompress individual records from a file without having to decompress preceding records in the file. Additionally, the prior art did not provide the capability of decompressing an individual record, altering the record and recompressing the altered record without having to decompress and recompress the preceding records in the file.

SUMMARY OF THE INVENTION

The present invention overcomes the above-described limitation of the prior art while retaining the advantages of the systems of said U.S. Pat. Nos. 4,464,650 and 4,558,302. In the present invention, a file preprocessor constructs a searchtree database utilizing a sample of the data. Once the preprocessed searchtree is formed, it is maintained fixed. A short record encoder utilizes the preprocessed searchtree to compress individual data records and to generate an encoded-record directory to denote stored locations of the compressed individual records. A short record decoder utilizes the preprocessed searchtree to decompress compressed records which are accessed utilizing the encoded-record directory. Individual decompressed records can be changed and recompressed by the short-record encoder utilizing the preprocessed searchtree and restored in compressed file storage. The encoded-record directory maintains cognizance of the locations of altered and recompressed records.

BRIEF DESCRIPTION OF THE DRAWINGS

FIG. 5 is a schematic block diagram of an embodiment of the File Preprocessor of the present invention.

FIG. 5b is a schematic block diagram illustrating details of the pointer counter of the searchtree database of FIG. 5a.

FIG. 6 is a schematic block diagram of an embodiment of the short-record encoder of the present invention.

FIG. 6b is a schematic block diagram illustrating details of the address generator of the encoder of FIG. 6.

DESCRIPTION OF THE PREFERRED EMBODIMENTS

The present invention compresses digital data contained in a file, record by record, in such a manner that individual records can be accessed and decompressed, changed if necessary, recompressed and restored to the compressed file in compressed form. This is achieved at a small additional cost in hardware and a small amount of preprocessing of the input data. The invention provides the capability of retrieving and decompressing individual records from a file without having to decompress any other records of the file. Additionally, changes can be made in individual records and the records can be recompressed without having to recompress any other records of the file.

The invention is a modification of the system disclosed in said U.S. Pat. No. 4,464,650 retaining all of the advantages and properties of the system as described in the patent. Many of the algorithms and hardware components of the present system are the same as those described in said U.S. Pat. No. 4,464,650.

Figure 1:
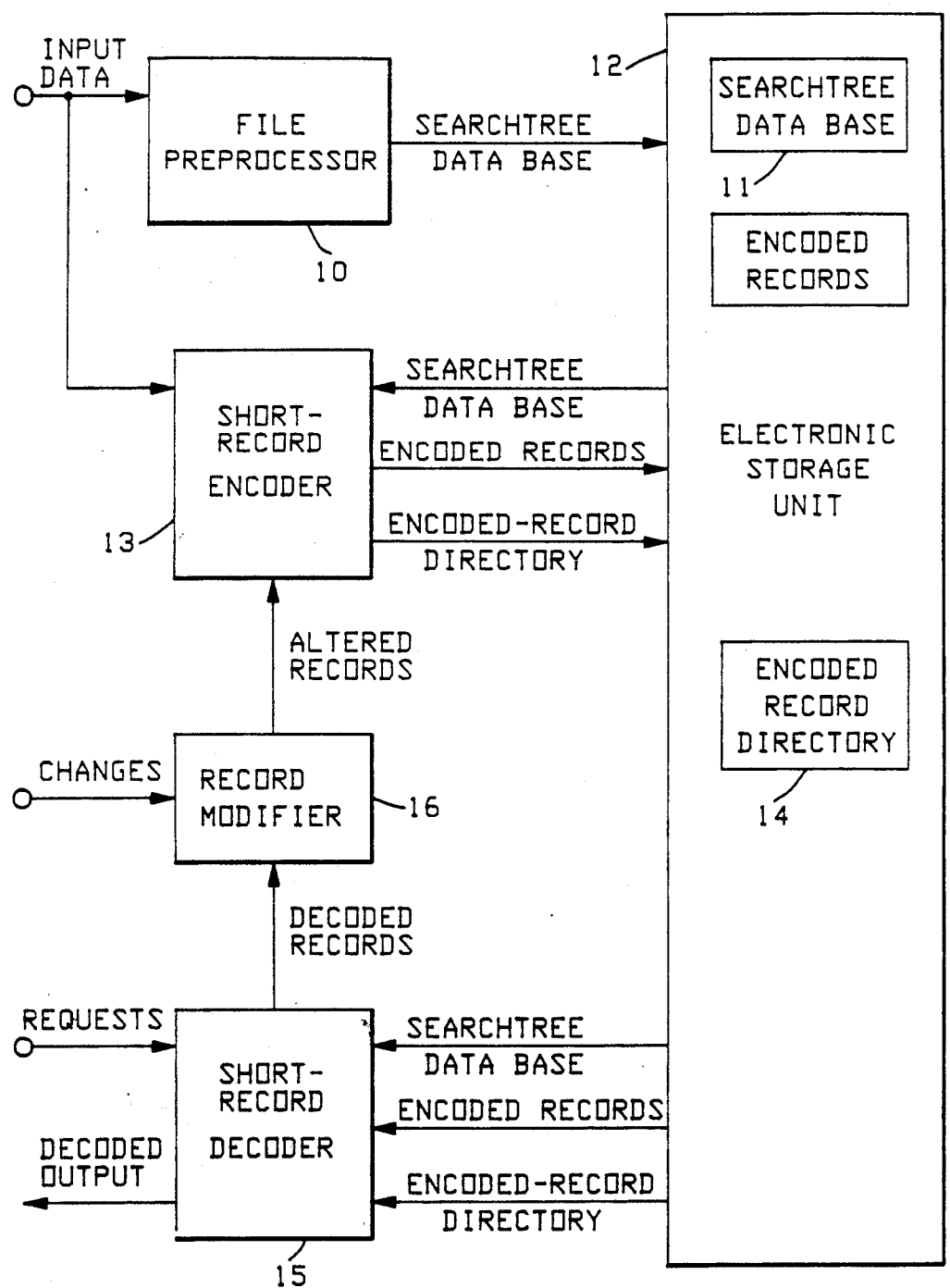
FIG. 1 is a schematic block diagram of the short-record data compression and decompression system of the present invention.

Referring to FIG. 1, the system of the present invention is comprised of a file preprocessor 10, a searchtree database 11, an electronic storage unit 12, a short-record encoder 13, an encoded-record directory 14 and a short-record decoder 15.

The file processor 10 operates on a modest-sized sample of the input data to produce the searchtree database 11 used by the encoder 13 and decoder 15. The searchtree database 11 produced by the preprocessor 10 is stored in the electronic storage unit 12. Once built, it is fixed and unchanging and, unlike its counterpart in said U.S. Pat. No. 4,464,650, will not adapt to subsequent changes in the input data. The electronic storage unit 12 holds the searchtree database 11 produced by the preprocessor 10, and the encoded records and encoded-record directory 14 produced by the short-record encoder 13. The short-record encoder 13 uses the searchtree database 11 produced by the preprocessor 10 to compress, and after changes to records by a record modifier 16, to recompress individual data records. It produces both the compressed records and the encoded-record directory 14, both of which are stored in the electronic storage unit 12. The encoded-record directory 14 contains the starting location for each compressed record in the compressed file, and is consulted whenever it is desired to retrieve and decompress an individual compressed record. The short-record decoder 15 decompresses an individual record whenever requested or needed in its original form.

The file preprocessor 10 utilizes those portions of the encoder of said U.S. Pat. No. 4,464,650 used for constructing the searchtree database and eliminates those components utilized to construct and transmit the compressed code therefrom. The file preprocessor 10 also inverts the tables constructed in generating the forward searchtree utilized by the short-record encoder to provide the backward searchtree tables utilized by the short-record decoder. The short-record encoder 13 utilizes those portions of the encoder of said U.S. Pat. No. 4,464,650 used in tracing a path through the forward searchtree and in encoding the leaf pointers for generation of the compressed code. In addition, the short-record encoder 13 builds the encoded-record directory. The short-record encoder 13 eliminates the portions of the encoder of said U.S. Pat. No. 4,464,650 utilized for updating the searchtree.

In a similar manner, the short-record decoder 15 utilizes the portions of the decoder of said Pat. No. 4,464,650 that traced a backward path through the searchtree and retrieved and reversed the symbol strings. The short-record decoder 15 eliminates from the decoder of said U.S. Pat. No. 4,464,650 those portions that updated the searchtree.

The short-record parsing procedure will now be described. The parsing procedure comprises the rules for parsing the input data into segments. The parsing procedure for the system of said Pat. No. 4,464,650 is described therein and the short-record parsing procedure used by the short-record encoder 13 is a modification thereof. The short-record parsing procedure uses the searchtree constructed by the preprocessor 10, but does not effect any further changes or additions thereto. Let K denote the final number of internal nodes present in the incrementally grown searchtree constructed by the file preprocessor 10 in accordance with said U.S. Pat. No. 4,464,650. The short-record parsing procedure is as follows:

Initially, set step k=1, and $n_0=0$.

At step k, find $i<K$ such that $X_i$ is the longest segment which is a prefix of $x(n_{k-1}+1, L(x))$. Set $n_k = n_{k-1} + L(X_i)$.

The following property of the short-record parsing procedure is observed: Since $X_k = X_{ik}$, where $i_k \leq K$ is the value of i in the $k^{th}$ iteration of the short-record parsing procedure, it follows that it is possible to determine $X_k$ recursively if the database provided by the searchtree constructed by the file preprocessor 10 in accordance with the process described in said U.S. Pat. No. 4,464,650 has been retained.

The searchtree database is the key to implementation of the parsing procedure described above and to the encoding and decoding of parsed segments. The searchtree database is constructed by the file preprocessor 10. The searchtree is utilized by the encoder 13 both for parsing the input data into segments and for encoding the parsed segments. The searchtree database is utilized by the decoder 15 for decoding the encoded segments. As described in said U.S. Pat. No. 4,464,650, and in a manner to be further described below, the searchtree database is actually stored as a set of tables or lists, which in effect define the searchtree over a finite alphabet. For an understanding of the searchtree database, reference is made to the definitions in said U.S. Pat. No. 4,464,650, column 9, line 19, through column 10, line 21.

The growth of $(T_k, B_k)$ by the file preprocessor 10 terminates with a tree $(T_K, B_K)$ containing K internal nodes whenever either the storage allotted for the tree is completely used or the portion of the input file to be scanned for building the tree has been completely parsed. The growth of $(T_k, BB_k)$ is described in said U.S. Pat. No. 4,464,650 with respect to the encoder thereof. The searchtree is then stored in the electronic storage unit 12 for subsequent use in encoding and decoding of individual records of the file. There are seven tables or lists which comprise the database: the label table (forward tree) (encoder); the address table (backward tree) (decoder); the last-descendant list (decoder); the symbol-position table (encoder); the position-symbol table (decoder); the unseen-rank table (encoder), and the rank-unseen table (decoder).

All but the last-descendant list have been described in detail in said U.S. Pat. No. 4,464,650. The last-descendant list is utilized, when required, when translating the encoded pointer back into a virtual address. If the last symbol in a parsed segment was also the first symbol encountered in the file, the address obtained is not that of a leaf, but that of an interior node. For each virtual address, the last-descendant list provides the length d of a path composed entirely of rightmost arcs, which path connects the interior node to a leaf. The decoder 15 can then begin decoding at the interior node, knowing that d repetitions of the first file-symbol are to be attached to the end of the decoded segment.

Briefly, with respect to the other tables and lists, the label table array is utilized to encode when traversing the searchtree in the forward direction. For any labeled node k and arc label, the address of the appropriate son node is computed by a shift-and-add operation. The label of the son node is then obtained from the label table. The address table is utilized to decode by traversing the searchtree in the backward direction. For any virtual address, the node label of the appropriate father node is computed by a shift-and-add operation. The virtual address of the father is then obtained from the address table. The symbol-position table provides the arc position assigned to each symbol encountered in the file by the preprocessor 10. The rightmost (highest) position is assigned to the first symbol encountered, the second rightmost (second highest) to the second symbol, etc. The position-symbol table, which is the inverse of the symbol-position table, provides for each arc position the symbol which has been assigned to that position. The unseen-rank table provides for each potential symbol never encountered previously, the symbol's rank among all the unseen symbols. It is more efficient to encode the rank of any new symbol encountered by the encoder 13, rather than to encode the symbol itself. The rank-unseen table assigns an unseen but potential symbol to each rank up to the number of unseen symbols. The rank-unseen table is the inverse of the unseen-rank table utilized by the encoder 13.

The searchtree database is used by the short-record encoder 13 for encoding, as well as for parsing individual data records. The number of possible joint events (comma, innovation) is identical to the number of leaves in the tree $(T_K, B_K)$. Thus, if the leaves are numbered consecutively by the integers from 0 to $K(|B_K|-1)$, then these numbers, denoted as leaf pointers, provide an efficient encoding of the parsed segment $X_k$. An efficient binary encoding of the leaf pointer is then provided by the economy binary tree described in said U.S. Pat. No. 4,464,650 and described below. The decoding process utilizes the same searchtree built by the preprocessor 10. Given the $(T_K, B_K)$, current encoded segment $(Y_k)$, can be decoded to identify $v_k$. By tracing the backward path from $v_k$ to the root, in the manner described in said U.S. Pat. No. 4,464,650, the arc labels and associated symbols are obtained. Thus, the searchtree generated by the preprocessor 10 provides for parsing the input data, encoding the parsed segments, and decoding the compressed records.

The preferred embodiments of the invention described herein comprise software and hardware embodiments. The software embodiment comprises Fortran V programs for the file preprocessing, the short-record encoding and the short-record decoding. The Fortran V versions of the programs are provided in the Appendix hereto. It is appreciated, that other embodiments of the invention can be realized by, for example, microprogrammed or hardwired electronic devices such as those described herein with respect to the hardware embodiment. A discussion of the preprocessing, encoding and decoding programs now follows.

The file preprocessing program constructs the searchtree described above. The encoder and decoder programs utilize the searchtree, tracing paths through the tree to encode and decode segments of data. Forward (encoding) and backward (decoding) path tracing through the searchtree is described in detail in said U.S. Pat. No. 4,464,650 with respect to the incrementally growing searchtree $(T_k, B_k)$. In the present invention, the detailed operations described in said U.S. Pat. No. 4,464,650 are considered with respect to the fixed searchtree $(T_k, B_k)$ constructed by the file preprocessor 10. Node labels are stored in the label table (array F) built by the preprocessor 10 either directly or by hashing, as described in said U.S. Pat. No. 4,464,650. Virtual addresses of father nodes are obtained from an array G (address table) which is the inverse of F and also constructed by the preprocessor 10.

Said U.S. Pat. No. 4,464,650 describes utilizing a label table in backward path tracing. Although this approach can be utilized in the present invention, a last-descendant list technique is described. Initially, before the backward trace is started, the last-descendant list is consulted to determine how many (if any) repetitions of the initial symbol $x_1$ to append to the decoded string.

The preprocessor 10 also constructs the symbol-position table and the position-symbol table, which are inverses of each other, in the manner described in said U.S. Pat. No. 4,464,650 and maintains the unseen-symbol rank table, updating the table each time the preprocessor 10 encounters a new symbol. This table is subsequently inverted by the encoder 13 to provide the decoder with the rank-unseen table. Both tables are required if re-encoding of records is performed.

The encoding and decoding of the leaf pointers are described in detail in said U.S. Pat. No. 4,464,650, at column 16, line 29 through column 18, line 64. It is appreciated, however, that the present invention utilizes the fixed searchtree $(T_K, B_K)$ rather than the incrementally growing searchtree $(T_k, B_k)$ described in said U.S. Pat. No. 4,464,650. Thus, although all references to the encoded output segment $Y_k$ and the symbols $X_k$ are applicable herein, all other references in the denoted section of said U.S. Pat. No. 4,464,650 to "k" are utilized herein as "K" so as to refer to the fixed searchtree. It is also appreciated that the threshold TB is provided herein by the preprocessor 10 in a manner to be described. Additionally, the last-descendant list is utilized to complete the leaf pointer decoding translation, rather than a forward tree label table as described in said U.S. Pat. No. 4,464,650. To complete the decoding translation of the leaf pointer, the last-descendant list is referenced to determine whether the virtual address referred to in column 18, line 26 of said U.S. Pat. No. 4,464,650 is the address of a leaf or an internal node. If the address is that of a leaf, the backward decoding trace begins therefrom. If the virtual address is that of an internal node, the decoded segment begins with a string of XL symbols all equal to $x_1$, where XL is the extension length returned from the last-descendant list. The backward decoding trace then begins from the internal node whose address is the referred to virtual address.

The encoding and decoding of new symbols are performed herein in the manner described in said U.S. Pat. No. 4,464,650 (see column 19, line 33 through column 21, line 5, and elsewhere), except that the thresholds TA and TB are provided by the preprocessor 10 and the unseen-rank and rank-unseen tables stored as the list DR are maintained by the preprocessor 10.

The software embodiment of the invention will now be described with reference to the flow charts of FIGS. 2-4 and the Fortran V program appended hereto. With respect to FIGS. 2-4, the program flow is designated by the YES and NO arrows denoted by the legends. The line numbers referred to below, refer to the lines of code referenced to the section of the software being discussed. It is appreciated, that present day computer systems with which the invention may be utilized usually provide appropriate subroutines in their software libraries suitable for calling by the appended programs. Comments are provided with the appended preprocessor, encoder and decoder programs to explain the functions thereof.

Figure 2:
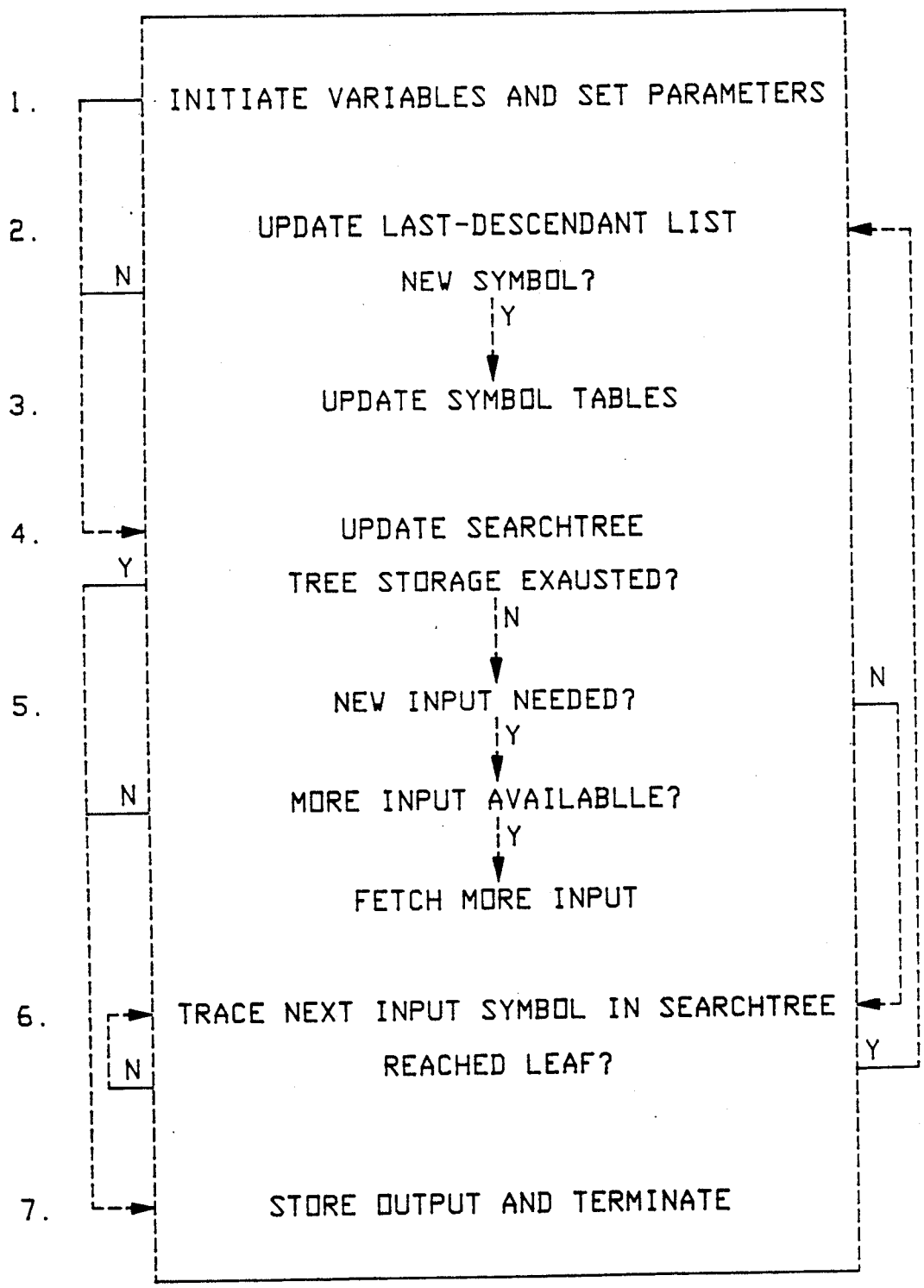
FIG. 2 is a flow chart depicting the operation of the File Preprocessor of the present invention.

Referring to FIG. 2 and the associated file preprocessor program in the appendix, the program for the file preprocessor is divided into seven sections: initialization, last-descendant list update, symbol-table update, searchtree update, input testing, path tracing, and termination.

The initialization section of the program defines initial values for a number of program variables, sets up the unseen-rank table DR, and partitions the available storage for the searchtree between direct and hashed parts. Initialization is concluded by a jump to section 4 to define the initial two-node searchtree.

Section 2 completes the updating of the last-descendant list. The length of the extension to the last descendant is stored in an array GE at line 16. To conclude the second section a jump is made to section 3 or section 4 according as the last symbol processed is or is not a new symbol.

Section 3 updates the symbol tables. The unseen-rank table DR is updated by the DO loop at lines 2-3 The count of unseen symbols is decremented at the fourth line, and, if any remain, a new green leaf is created for every internal node of the searchtree.

Section 4 of the program performs the updating of the incrementally growing searchtree. The count K of internal nodes is incremented and the internal node label K is stored at the appropriate address in the array F. The count H of green leaves is augmented by BSYM, the number of symbols B, and if necessary, the value of (H), called B in the program, is corrected. The definition of (H) is given in said U.S. Pat. No. 4,464,650 as the least integer not less than $\log_2 H$. At the last line of the section, a jump is made to the termination section 7 if the storage allotted for the searchtree has been completely filled.

In section 5 the virtual address C of the current node is reset to 1, the leaves-only pointer value D is reset to zero, and the extension length XL is reset to 1 in preparation for the next search. A test is then made to determine whether additional input is needed and available. If not available, an exit is made to the program termination section 7. Otherwise, if input is needed, it is obtained from the source thereof.

Section 6 is the parsing procedure of said U.S. Pat. No. 4,464,650: Input symbols are traced along a forward path of the incrementally growing searchtree from the root to a leaf. Separate coding is executed in accordance with whether the current node C belongs to the direct or hashed portion of the tree. The next input symbol is first read and replaced by its arc position, given by the symbol-position table SYM. At line 24 the virtual address for the new son is calculated and replaces C. The extension length XL, which keeps track of the number of repetitions of the symbol $x_1$, is incremented at line 25, but is reset to 1 at line 27 if the current symbol is not $x_1$. The leaves-only pointer is updated at line 28 as $D=C-E-1$ unless the current symbol is $x_1$. Next, the internal node label E for the node C is sought from the label table F. The tracing continues until no node label is returned from F for the node with address C. A leaf has now been reached, and an exit is made to section 2.

In the termination section 7 the searchtree database is stored in the electronic storage unit, and the program run is terminated.

Figure 3:
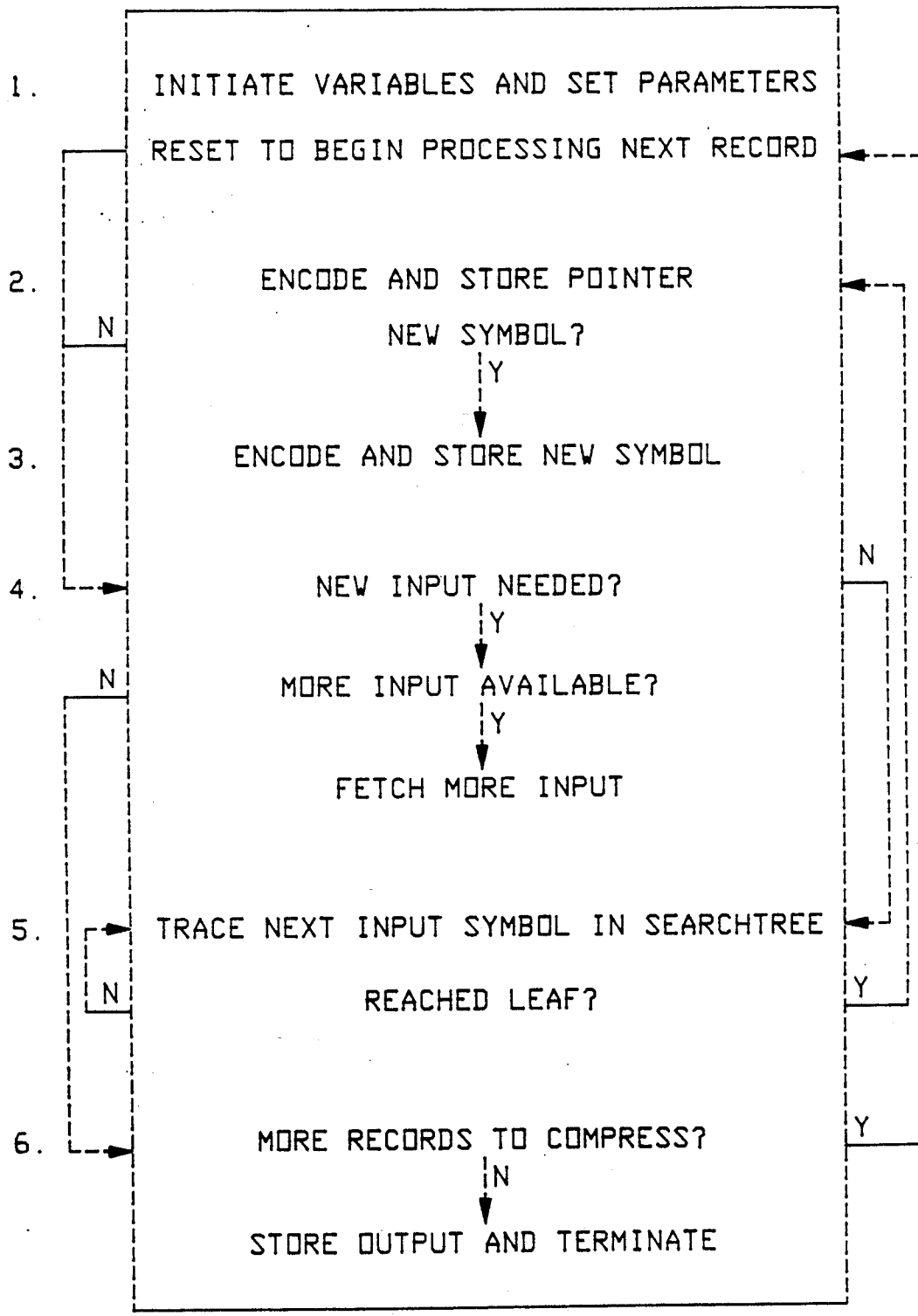
FIG. 3 is a flow chart depicting the operation of the Short-Record Encoder of the present invention.

Referring to FIG. 3 and the associated short-record encoder program in the Appendix, the program for the short-record encoder is divided into six sections: initialization, pointer encoding, symbol encoding, input testing, path tracing, and termination.

The initialization section of the program defines initial values for a number of program variables and obtains the symbol-position table SYM and the unseen-rank table DR from the electronic storage unit. In the lines following label 10, the searchtree pointer is reset to the root of the tree to begin processing of the next record to be compressed. This section is concluded by an unconditional jump to section 4.

Section 2 completes parts 2 and 3 of the encoding of the leaf pointer as described in said U.S. Pat. No. 4,464,650 and below with respect to the hardware embodiment. The second line of code in the section converts the leaves-only value of the pointer into the green-leaves value. The fifth line tests the pointer against the threshold and modifies the pointer when necessary. The encoded pointer is then stored (lines 6-18) in an output array Z which, when full, is emptied into the electronic storage unit. To conclude section 2 a jump is made to section 3 or section 4 according as the last symbol processed is or is not a new symbol.

Section 3 encodes the new symbol rank. At line 4 the rank is modified if the threshold is exceeded. Lines 5-17 are concerned with storing the encoded symbol in the output array Z.

At line 2 of section 4 the leaves-only pointer value D is reset to zero in preparation for the next search. Next, a test is made to determine whether additional input is needed and available. If not available, an exit is made to section 6. Otherwise, if input is needed, it is obtained from the source thereof and read into the input buffer array R. The virtual address C of the current node is reset to 1 to begin a new search from the root in section 5.

Section 5 is the short-record parsing procedure: input symbols are traced along a forward path of the searchtree from the root to a leaf. Separate coding is executed in accordance with whether the current node C belongs to the direct or hashed portion of the tree. The next input symbol is first read and replaced by its arc position, using the symbol-position table SYM (lines 9-22). At line 23 the virtual address for the new son is calculated and replaces C. The leaves-only pointer is updated at line 24 as $D=C-E-1$ unless the current symbol is $x_1$. Next, the internal node label E for the node C is sought from the label table F. The tracing continues until no node label is returned from F for the node with address C. A leaf has now been reached, and an exit is made to section 2.

When section 6 is reached, processing of the current record has been completed. A pointer to the encoded record is stored in the array OP (lines 6-8), and a test is made at line 11 to determine whether there are more records to be compressed. If there remain records to compress, then a return is made to section 1 to reset the searchtree pointer to the root to begin processing of the next record. Otherwise, the array OP is stored as the encoded record directory, any remaining encoded output in the array Z is stored in the electronic storage unit, and the program run is terminated.

Figure 4:
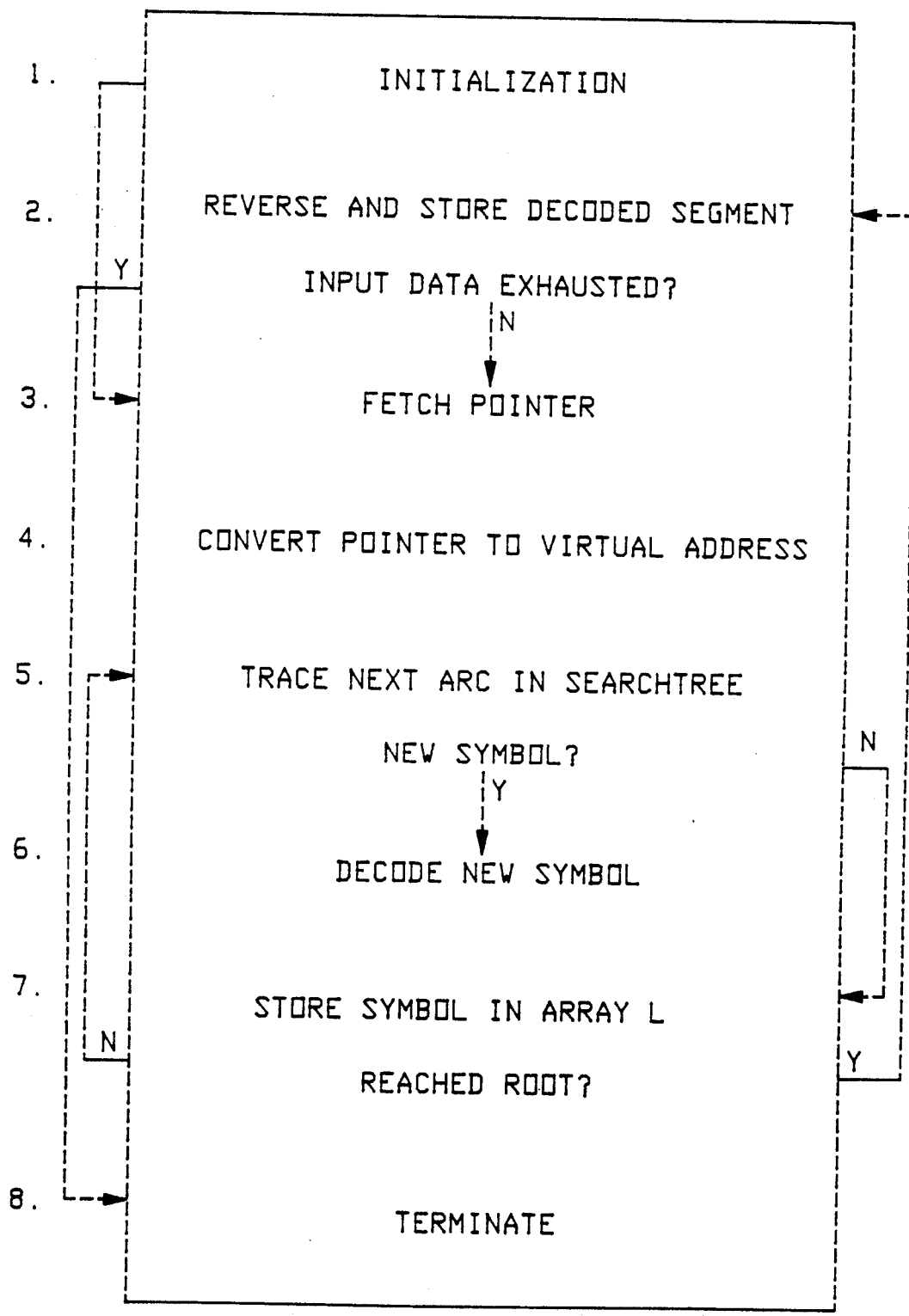
FIG. 4 is a flow chart depicting the operation of the Short-Record Decoder of the present invention.

Referring to FIG. 4 and the associated short-record decoder program in the Appendix, the program for the short-record decoder is divided into eight sections: initialization, store decoded segment, fetch pointer, convert pointer to address, backward trace, fetch new symbol, store decoded symbol, and termination.

The initialization section is similar to that for the encoder, but also includes obtaining the position-symbol and rank-unseen tables, the searchtree, the encoded-record directory, and the encoded record. It is concluded by a jump to section 3.

At the start of section 2 the array L (Pushdown Stack) contains the symbols of the decoded segment $X_k$, but in reverse order. In section 2 the order of the symbols is reversed, and $X_k$ is stored in the output buffer R. At the conclusion of the section a jump is made to the termination section 8 if the record has been completely decoded.

In section 3 the encoded pointer $Y_k$ is extracted from the input data stream and converted to its green-leaves value, as described in said U.S. Pat. No. 4,464,650 and below with respect to the hardware embodiment.

At line 1 of section 4 the green-leaves value of the pointer is replaced by the leaves-only value. At line 2 the leaves-only value is converted to the virtual address of a node of the searchtree. The extension length XL to the last descendant is obtained at line 18. If XL is not zero, then the decoded string L is started with XL repetitions of the initial symbol $x_1$ (lines 22-26).

In section 5 one step is made along the backward path to the root. At line 6 the internal node label of the father of the current node C is derived, and at line 7, C is replaced by the virtual address of the father, obtained from the address table G. At line the position of the arc from son to father is obtained. Section 5 is completed by a jump to section 7 if the position-symbol table SYM returns a nonzero value. Otherwise, section 6 is executed next to read the new symbol.

In section 6 a new symbol rank is extracted from the input compressed data stream. The encoded rank is decoded (lines 2-14), and the correct symbol is obtained by reference to the rank-unseen table DR (line 15).

In section 7 the symbol associated with the arc traversed in section 5 is stored in the Pushdown Stack L. Since the path to the root encounters the symbols of the segment $X_k$ in reverse order, the string of symbols formed in L must be reversed (in section 2) before they can be stored in the output buffer R. At the end of section 7 a test is made to determine whether the root has been reached. If it has, then a jump is made back to section 2 to reverse and store the decoded segment; if not, then a return is made to section 5 of the program to traverse the next arc in the backward path and obtain the next (earlier) symbol of $X_k$.

In the termination section 8 the decoded record is printed, and the program is terminated.

The encoded-record directory built by the encoder contains the starting location for each compressed record in the compressed file. The encoded record directory is consulted whenever retrieval and decompression of an individual record from the compressed file is desired. The length of the compressed version, if required, is obtained by additionally using the directory to yield the start position of the ensuing record. This procedure for obtaining the length may require modification if the system alters and recompresses retrieved records since the recompressed record may require more space than the original and thus require repositioning elsewhere in the compressed file. In this situation, if the length of the compressed version is desired, it may be necessary to store end points as well as start locations for each record.

It is often the case that the records comprising the original input file are all of fixed known length. In this situation it will not be necessary to include the end points in the directory, since the decoder knows in advance when to stop decoding, even if it does not know in advance where the encoded record ends. In the herein described software embodiment of the invention, the directory contains the start location for each encoded record. The directory itself is stored in a disk file which is loaded into memory at the start of execution of the decoder program. The decoder program obtains the start locations for both the record to be decoded and its successor in the compressed file. Thus, the decoder can calculate the length of the compressed input to be decoded. In the fixed length input case the decoder further knows the length of the output in advance, and therefore can halt processing either when the decoder input is exhausted or when it has decoded an entire record.

The hardware embodiment of the invention is now described with reference to FIGS. 5, 5a-5d, 6, 6a-6d, 7 and 7a-7f. The functions performed by the preprocessing, encoding and decoding programs described above are now performed by electronic subsystems denoted as the File Preprocessor, the Short-Record Encoder and the Short-Record Decoder. The components of these subsystems are illustrated in the drawings and described hereinbelow. In these drawings, solid lines denote data paths while dashed lines represent control signal paths. With respect to the labeled blocks of the drawings described below, additional descriptive material is found in said U.S. Pat. No. 4,464,650 with respect to identically labeled blocks of the drawings thereof.

Figure 5A:
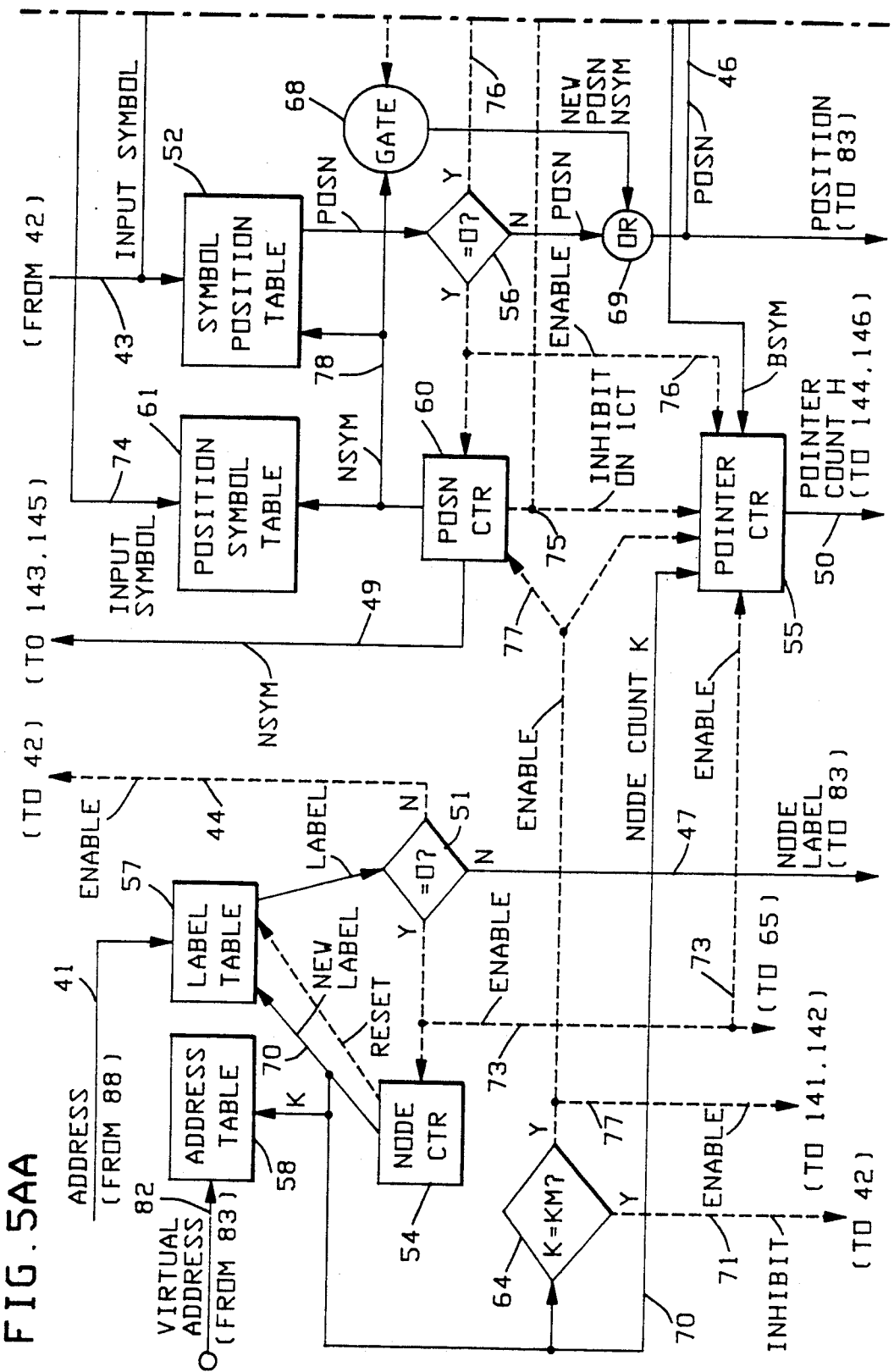
FIGS. 5a, which consists of FIGS. 5aa and 5ab taken together is a schematic block diagram illustrating details of the searchtree database of the preprocessor of FIG. 5.
Figure 5C:
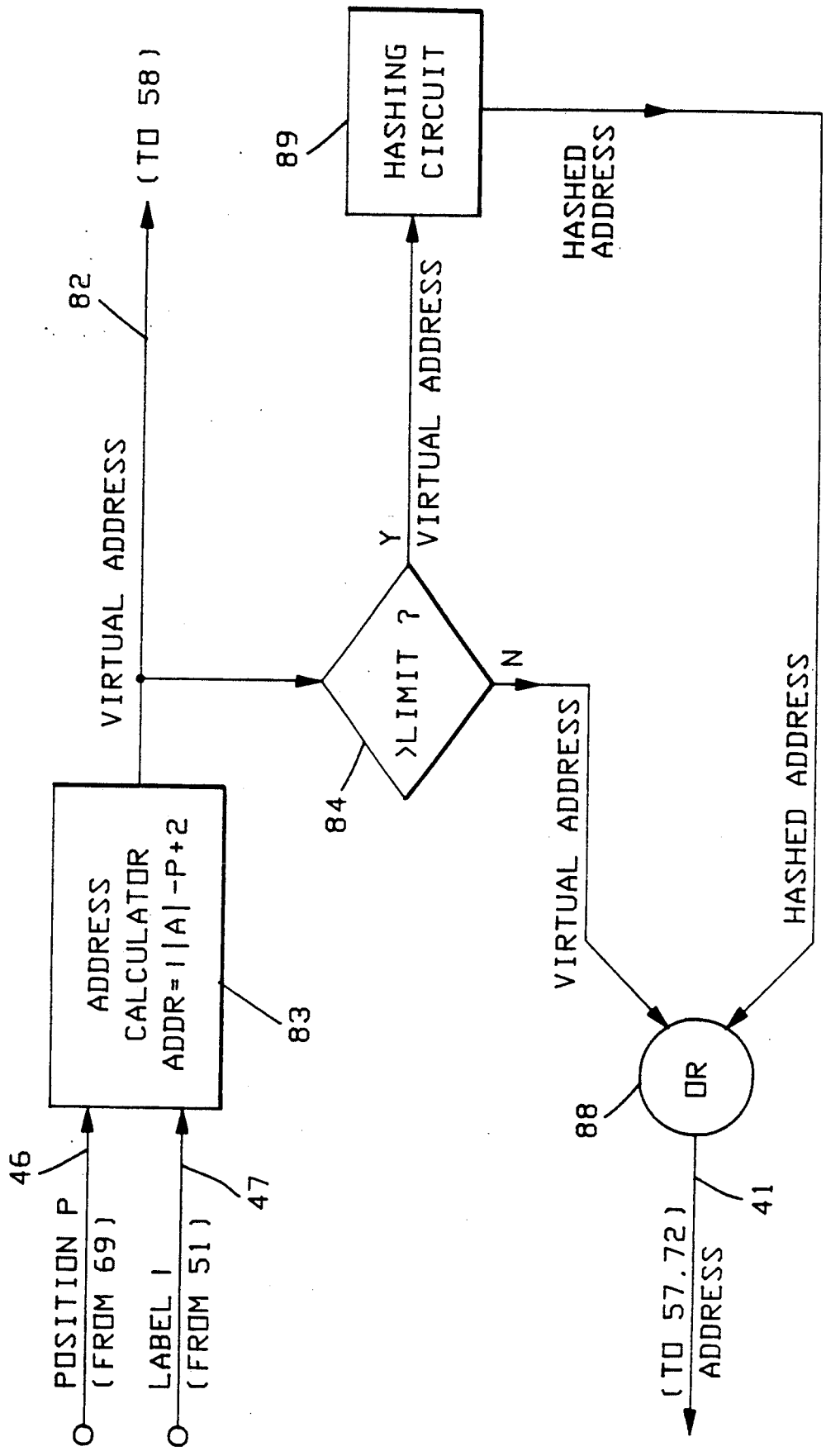
FIG. 5c is a schematic block diagram illustrating details of the address generator of the preprocessor of FIG. 5.
Figure 5D:
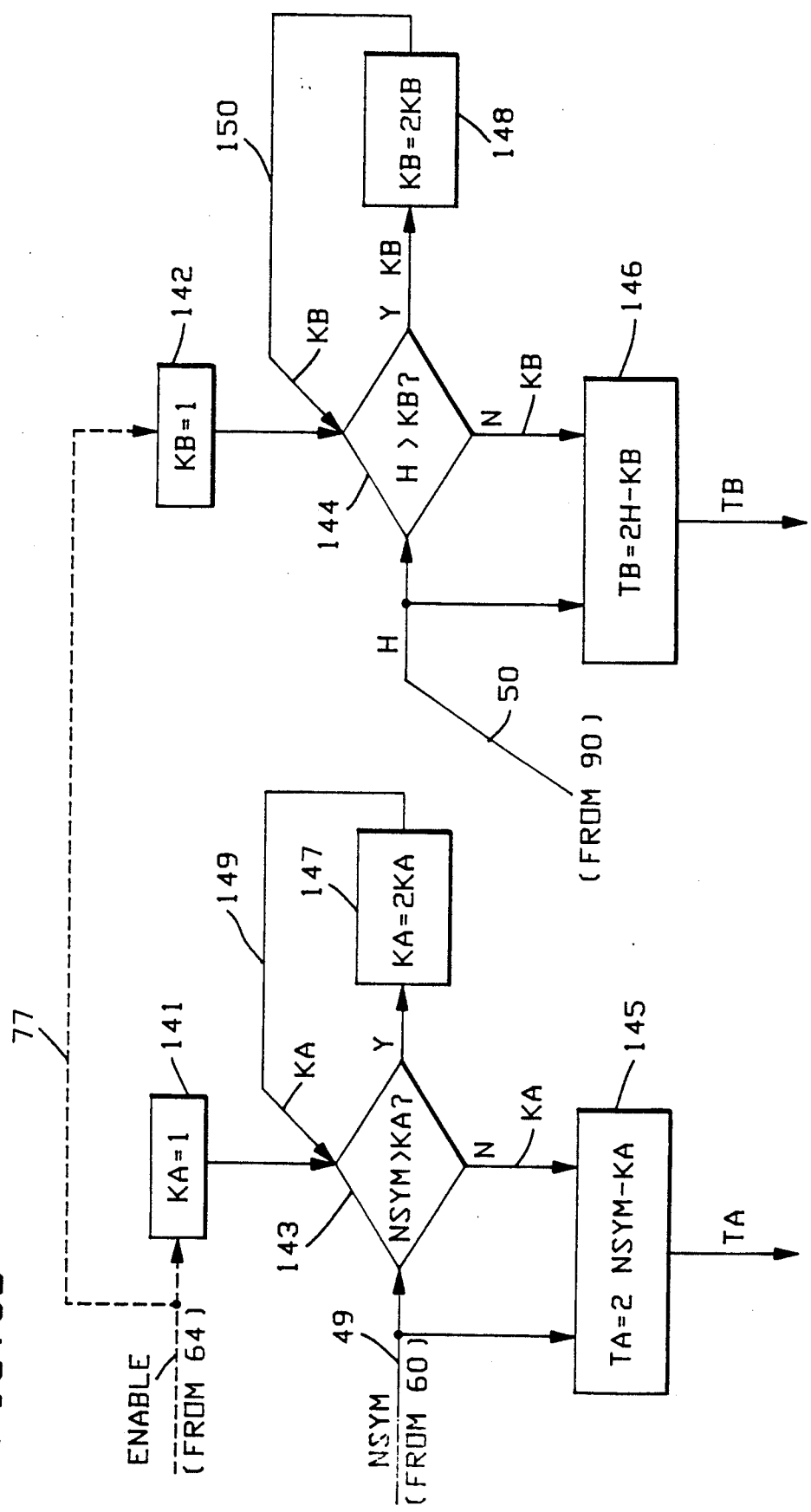
FIG. 5d is a schematic block diagram illustrating details of the threshold calculator of the preprocessor of FIG. 5.

Referring to FIGS. 5 and 5a-5d, the basic components of the File Preprocessor are an Input Buffer 42, a Searchtree Database 40, an Address Generator 45, and a Threshold Calculator 48. An overview of the Preprocessor organization is illustrated in FIG. 5, with three of the four components shown in greater detail in FIGS. 5a-5d. The Input Buffer 42 consists of storage elements which hold a portion of the input data stream which is currently undergoing processing. It supplies the current input symbol to the Searchtree Database 40 via a lead 43 when called for by an enable pulse transmitted on a lead 44.

The Searchtree Database 40 is used by the Preprocessor to parse the input data. Subsequently, the database values obtained by the Preprocessor will be used by the Encoder for parsing and encoding data and by the Decoder for decoding compressed data. Therefore, the Searchtree Database 40 (FIG. 5a) contains collections of storage elements capable of storing the three tables required by the Preprocessor to parse and by the Encoder to parse and encode the input data: the label table 57, the symbol-position table 52, and the unseen-rank table 62 described above and in said U.S. Pat. No. 4,464,650; storage elements capable of storing the four tables required by the Decoder to decode: the address table 58, the last-descendant table 72, the position-symbol table 61, and the rank-unseen table 63; four comparators: the label comparator 51, the position comparator 56, the KM comparator 64, and the first-position comparator 67; four simple counters: the position counter 60, the symbol counter 59, the node counter 54, and the extension-length counter 66; one complex counter: the pointer counter 55; and several gates (53,65,68,69). The storage elements comprising the label table 57 are capable of being accessed under control of an address supplied on a lead 41 by the Address Generator 45 so as to return a successor label. The resulting sequences of labels can be viewed as paths through the tree which serve to record all segments previously encountered during the encoding. The last element in such a sequence is distinguished as a leaf when the label zero is returned by the label table for the current address The label table initially contains a 1 in the label column for address 1 (the root), and zeros for all other addresses. The tree is updated by storing the next available label at the current address, in effect creating $|B_k|$ new leaves, one for each symbol which has been seen, and one for the alpha branch to represent all unseen symbols.

The storage elements comprising the address table 58 are potentially capable of being addressed under control of a label so as to return a new address. The resulting sequences of addresses can be viewed as backward paths through the tree which serve to record the decoded segments in reverse order. The last element in such a sequence is distinguished as the root when the address one is returned by the address table for the current label. The address table is not actually used by the File Preprocessor, but, along with the last-descendant table 72, the position-symbol table 61, and the rank-unseen table 63, is constructed, or loaded, by the File Preprocessor for later use by the Decoder. The address table initially contains a 1 in the address column for the label 1 (the root), and zeros for all other labels. At the end of each parsing cycle, the tree is updated by storing the virtual address of the leaf where forward tracing ends at the next available slot in the address table. This is the slot K at the cycle where internal node K is created.

The sequence of events occurring during a single parsing cycle, as viewed by the Searchtree Database 40, is as follows. At the start of a cycle the address 1 is applied to the label table 57, which, upon receiving an address, sends the corresponding node label to the label comparator 51. The label comparator 51 compares the label with zero. Whenever the label is not zero, it is passed on via lead 47 to the Address Generator 45 (FIG. 5c). At the same time, an enable pulse is sent along lead 44 to the Input Buffer 42, which then releases the next input symbol. The new input symbol is applied to the symbol-position table 52, which sends the position assigned to the symbol on to the position comparator 56, where it is compared with zero. If not zero, the position is sent along via the or-gate 69 and lead 46 to the Address Generator 45, which, when it has received both a new label and a new position from the Database, generates a new address which is returned to the label table 57 via lead 41 to continue the cycle.

Whenever the new symbol position is zero, however, the position comparator 56 generates an enable signal which is sent via lead 76 to the position counter 60, the symbol counter 59, the pointer counter 55, the gate 68, which passes the new position NSYM obtained from the position counter 60 along to the Address Generator 45 via the or-gate 69 and the lead 46, and to the gate 53 preceding the unseen-rank table 62. The enable pulse sent to the gate 53 allows the input symbol on lead 43 to be applied via lead 74 to the unseen-rank table 62 as well as to the rank-unseen table 63 and to the position-symbol table 61. The unseen-rank table 62 initially contains the ranks 1 to $|A|$ in the slots opposite to the symbols 0 to $|A|-1$, respectively, while the rank-unseen table 63, its inverse, initially contains the symbols 0 to $|A|-1$ in the slots opposite to the ranks 1 to $|A|$, respectively. The unseen-rank and rank-unseen tables are updated by removing the new symbol, in effect, decrementing the rank of each symbol appearing later in the tables. The position-symbol table 61 initially contains zeros in the slots opposite to the positions 1 to $|A|$, while the symbol-position table initially contains zeros in the slots opposite to the symbols 0 to $|A|-1$. The position-symbol table 61 is updated by storing the new input symbol on lead 74 in the slot opposite to the position NSYM obtained from the position counter 60. The symbol-position table 52 is also updated at this time by storing the position NSYM obtained from the position counter 60 in the slot opposite to the new symbol which has just been obtained from the Input Buffer 42 on lead 43. Following this update, the position counter contents are decremented. If the contents are reduced to 1, the inhibit lead 75 is activated, preventing further incrementation of the symbol counter 59 and also inhibiting further increases in the pointer count by the node count K, as discussed below.

The symbol counter 59 counts BSYM, the number of distinct input symbols which have been seen. Each time it receives an enable pulse on lead 76 from the position comparator 56 it increments the count, unless the inhibit lead 75 is active. The count BSYM is sent via lead 79 to the pointer counter 55, where it is used to augment the pointer count H each time a new internal node is created. When all but one symbol have been seen, however, the alpha branch is no longer needed, so that the count should be augmented by $BSYM-1$ rather than BSYM. For this reason, the final incrementation of BSYM is inhibited by activation of the lead 75 whenever the position counter 60 contains the count one.

The position counter 60 is initially loaded with the alphabet size $|A|$. It keeps track at all times of NSYM, the number of potential, but as yet unseen, symbols. Whenever it receives an enable pulse on lead 76 from the position comparator 56, it sends the current count NSYM along the lead 78 to the symbol-position table 52 to be stored in the slot opposite to the new input symbol, and to the position-symbol table 61, which is updated by storing the new symbol in the slot opposite to the count NSYM. The count NSYM is also sent via lead 78 to the gate 68, which, when activated by a pulse on lead 76 from the position comparator 56, passes the new symbol position NSYM to the or-gate 69. The count NSYM is then decremented. When, however, the count reaches one, an inhibit pulse is sent on the lead 75 to the symbol counter 59, as discussed above, and to the pointer counter 55, as will be discussed below. At the end of the preprocessing run an enable pulse on lead 77 from the KM comparator 64 causes the final NSYM count to be released on lead 49 by the position counter 60 for use by the Threshold Calculator 48 (FIG. 5d) in calculating the rank threshold TA for the Encoder and Decoder in a manner to be discussed below.

The or-gate 69 receives either the nonzero position from the position comparator 56 or the new position NSYM from the position counter 60 via lead 78 and gate 68, and passes it on as the current position to the Address Generator 45 and a first-position comparator 67, using the lead 46. The first-position comparator 67 compares the position received on lead 46 with the first position, namely, the alphabet size $|A|$. If the two positions agree, an enable pulse is sent via lead 80 to the extension-length counter 66, causing incrementation of its contents, the extension length XL. If, however, the two positions disagree, then a reset pulse is sent via lead 81 to the extension-length counter 66, causing its contents XL to be reset to 1. The contents XL of the extension-length counter 66 are passed to a gate 65, which is enabled by a pulse on lead 73 from the label comparator 51 whenever a leaf is attained. The extension length XL is then passed through the gate 65 to the last-descendant table 72, which is updated by storing the length XL in the slot opposite to the current address, obtained on lead 41 from the Address Generator 45. Upon completion of the update, the table 72 sends a reset signal to the extension-length counter 66, causing its contents XL to be reset to 1. Initially, the last-descendant table 72 contains zeros for all addresses. Note that the address received on lead 41 may be a hashed address.

When the new node label obtained from the label table 57 is zero, a leaf has been reached. The label comparator 51 sends an enable signal on the lead 73 to the node counter 54, the pointer counter 55, and the gate 65. The pointer counter 55 is discussed below. The enable pulse sent to the gate 65 allows the updating of the last-descendant table 72 by permitting the extension length XL to pass from the extension-length counter 66. Upon receipt of the enable pulse on lead 73 the node counter 54 sends the node count K via the lead 70 to the pointer counter 55, to the label table 57 where it is stored in the slot opposite to the current address, to the address table 58 which is updated by storing the virtual address returned by the Address Generator 45 in the slot of the table opposite to the node count K, and to the KM comparator 64. If the count K equals the maximum tree size KM, the comparator 64 sends an inhibit pulse on lead 71 to the Input Buffer 42 to stop all further processing of input, and an enable pulse on lead 77 to the position counter 60, the pointer counter 55, and the Threshold Calculator 48 to initiate calculation of the rank and pointer thresholds. After sending out the node count K on lead 70, the node counter is incremented, and a reset signal is sent to the label table 57 to initiate the next parsing cycle.

The pointer counter 55 (FIG. 5b) is a more complex arithmetic circuit than the other four counters. It consists of an accumulator 87, two input gates 85 and 86, and an output gate 90. It receives the node count K on lead 70 from the node counter 54 and the symbol count BSYM on lead 79 from the symbol counter 59 and computes the pointer count H, the number of green-leaves in the tree. Whenever a new node is defined, an enable pulse sent on lead 73 to gate 86 by the label comparator 51 causes the count to be increased by BSYM, or by BSYM$-1$ if all potential symbols have been seen. Whenever a new symbol is encountered, an enable pulse sent on lead 76 to gate 85 by the position comparator 56 causes the pointer count to be increased by the node count K. However, this increase does not occur if all $|A|$ potential symbols have been seen. This is prevented by an inhibit pulse sent on lead 75 to gate 85 by the position counter 60 whenever it contains the count one. The same inhibit pulse inhibits incrementation of the symbol counter 59, which as a result will not count beyond $|A|-1$. The pointer count H is not used by the File Preprocessor until the end of the preprocessing run. At this time an enable pulse on lead 77 to the gate 90 from the KM comparator 64 causes the final pointer count H to be released on lead 50 to the Threshold Calculator 48 for use in the calculation of the pointer threshold TB.

The Address Generator 45 (FIG. 5c) contains a shift-and-add address calculator 83, an address comparator 84, an or-gate 88, and a standard hashing circuit 89. It receives the current input symbol position p on the lead 46 from the or-gate 69 of the Searchtree Database 40 and the current node label i on the lead 47 from the label comparator 51 of the Searchtree Database. It calculates a new virtual address for the next node to be visited, using the formula $$address = i|A| - p + 2$$

with the multiplication by $|A|$ accomplished by shifting the label i to the left by M places, where M is the symbol size in bits. This virtual address is returned via lead 82 to the address table 58, where it is stored in the slot opposite to the node count K, thus updating the backward tree for the Decoder. It is also sent to the address comparator 84, where it is compared with the limit established for the size of direct storage in the label table. If greater than the limit, then the address is sent on to the hashing circuit 89 to be hashed; otherwise it is sent directly without change to the or-gate 88. The resulting calculated address, hashed or unhashed as the case may be, is selected by the or-gate 88 and returned via lead 41 to the label table 57 of the Searchtree Database for the next label-table lookup and to the last-descendant table 72.

The Threshold Calculator 48 (FIG. 5d) is activated only at the end of a preprocessing run, after the KM comparator 64 has found equality. At this time, the comparator 64 sends an inhibit pulse on the lead 71 to the Input Buffer 42 to stop further processing of input data, and an enable pulse on lead 77 to the position counter 60, the pointer counter 55, and the Threshold Calculator 48. The Threshold Calculator 48 consists of two identical parts, one which calculates the rank threshold TA, and one which calculates the pointer threshold TB. Each part consists of a storage register 141 (142) for the initial value 1 of the parameter KA (KB), a comparator 143 (144), a doubler 147 (148), and an adder 145 (146). The rank threshold calculator will now be described, the operation of the pointer threshold calculator being essentially the same.

The rank threshold calculator is activated by the enable pulse on lead 77 from the KM comparator 64, causing the initial value 1 for KA to be fed to the comparator 143. The comparator 143 compares the current value of KA with the value of NSYM on the lead 49 from the position counter 60 of the Searchtree Database 40. If NSYM exceeds KA, then KA is passed to the doubler 147, which doubles its value by shifting one place to the left. The doubled value is returned to the comparator 143 on the lead 149 to continue the cycle. When NSYM no longer exceeds the value of KA, KA is passed to the adder 145, which calculates the rank threshold TA by the formula TA=2*NSYM$-$KA. The value TA obtained for the rank threshold is saved for future use by the Encoder and Decoder.

In addition to the four basic components shown in FIG. 5, the File Preprocessor also contains a Clock, connected to all components, and Sequence Control Units, which control the sequencing of operations by the components. These are not shown in FIG. 5.

Figure 6A:
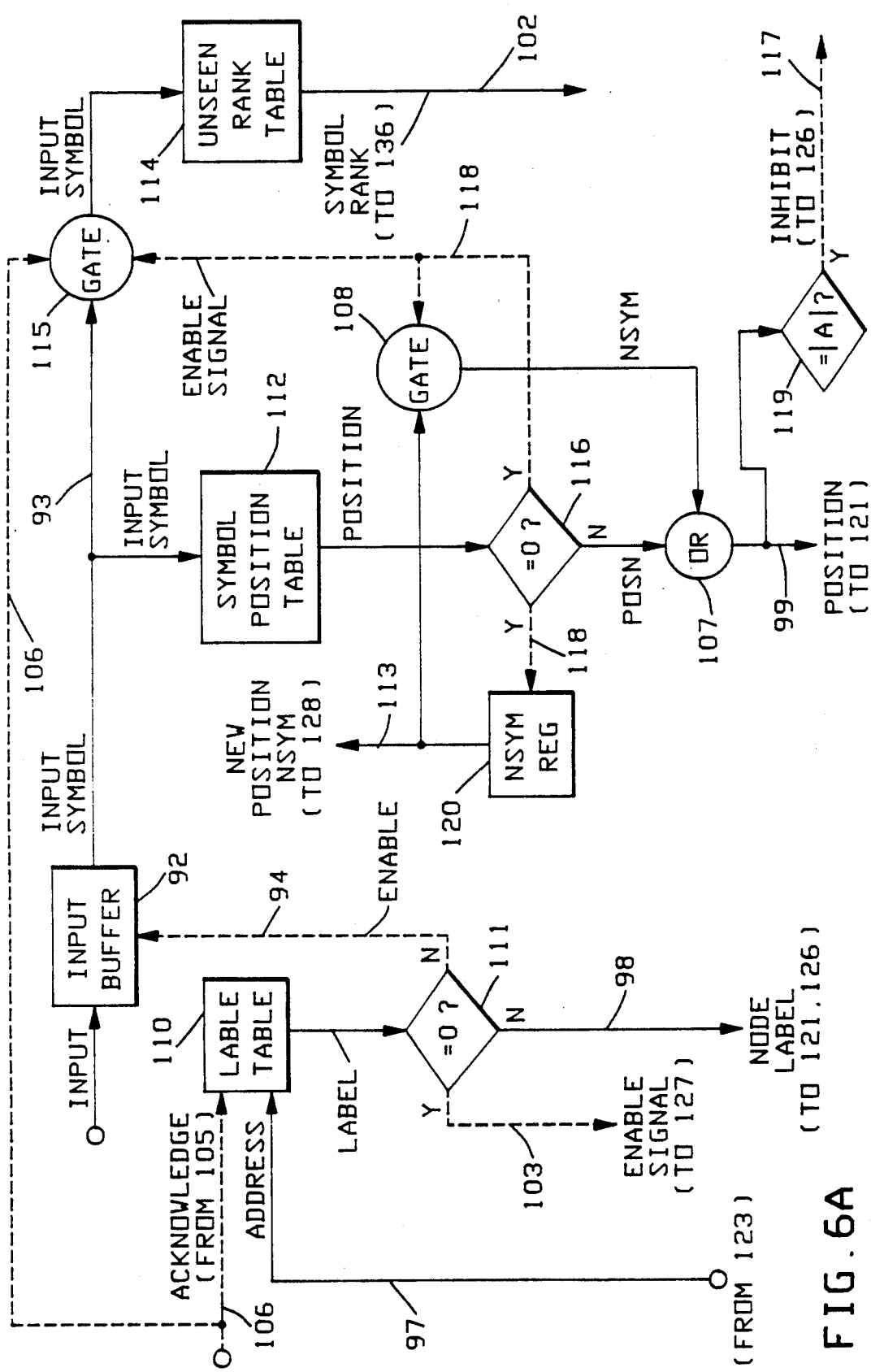
FIG. 6a is a schematic block diagram illustrating details of the searchtree database of the encoder of FIG. 6.
Figure 6C:
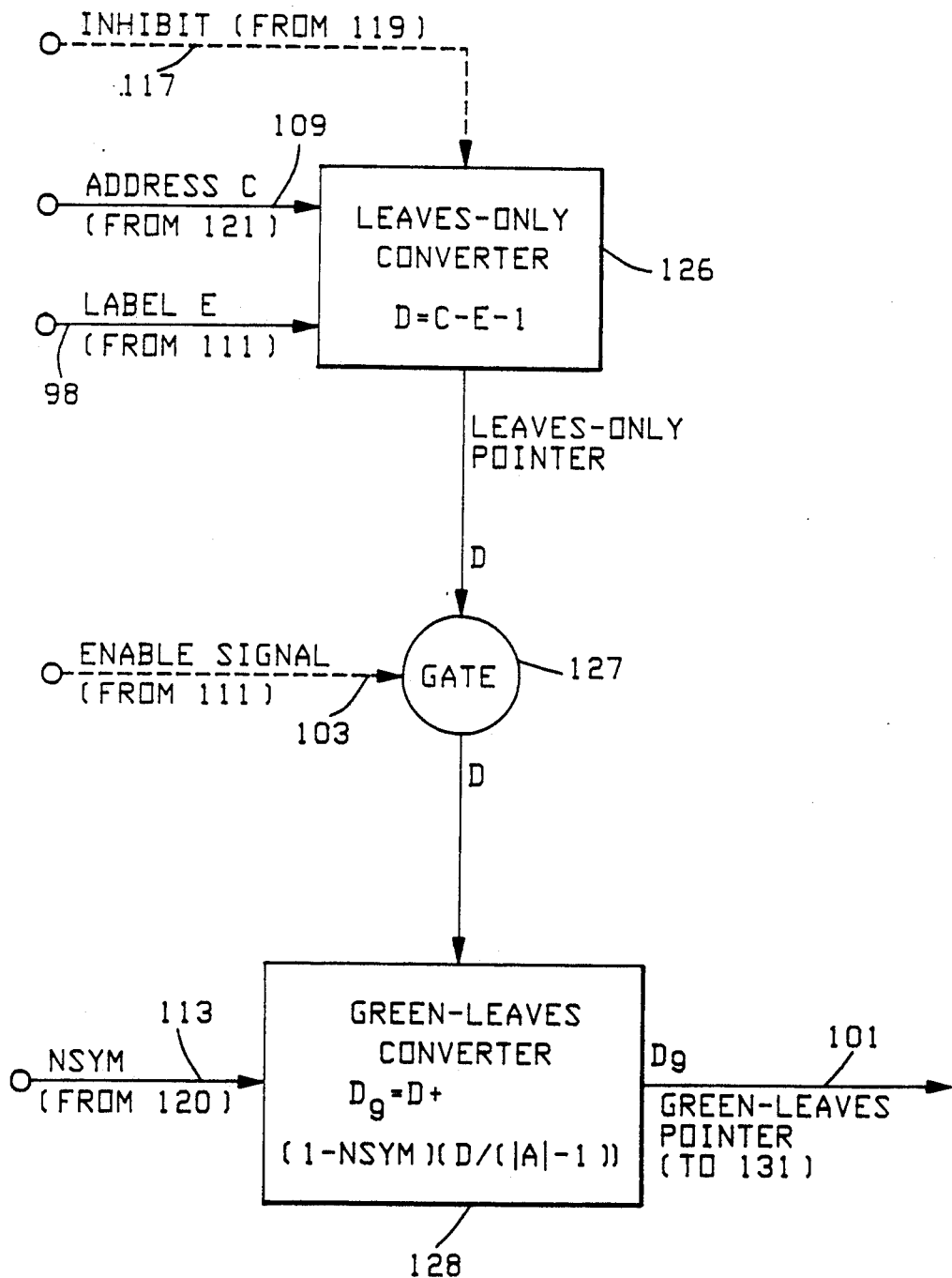
FIG. 6c is a schematic block diagram illustrating details of the pointer generator of the encoder of FIG. 6.
Figure 6D:
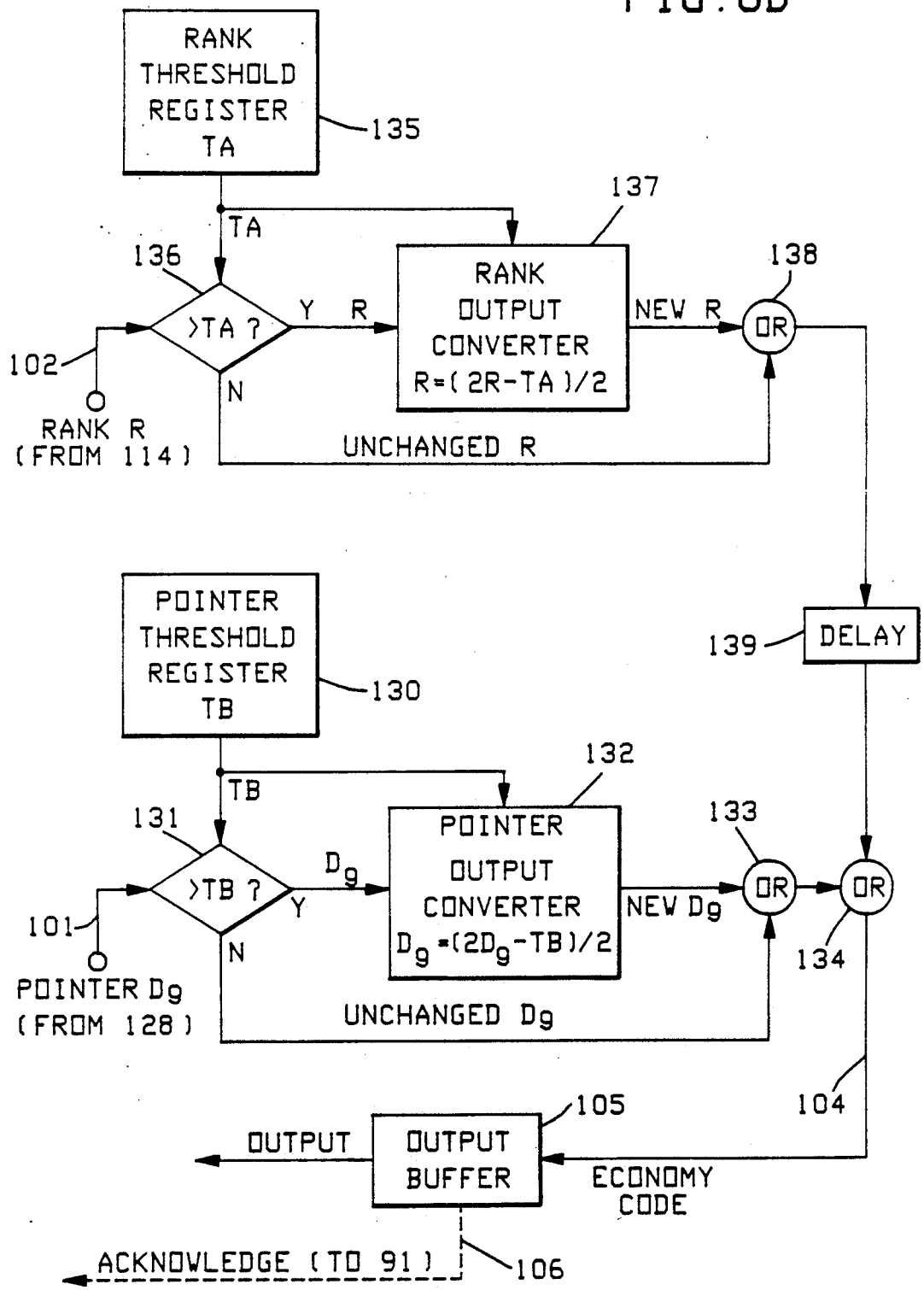
FIG. 6d is a schematic block diagram illustrating details of the economy encoder of the encoder of FIG. 6.

Referring to FIGS. 6 and 6a-6d, the basic components of the Short-Record Encoder are an Input Buffer 92, a Searchtree Database 91, an Address Generator 95, a Pointer Generator 96, an Economy Encoder 100, and an Output Buffer 105. An overview of the Encoder organization is illustrated in FIG. 6, with four of the six components shown inn greater detail in FIGS. 6a-6d. The input records to be compressed are processed one at a time by the Encoder. The Input Buffer 92 consists of storage elements which hold the input record which is currently undergoing processing. It supplies the current input symbol on a lead 93 to the searchtree Database 91 when called for by an enable pulse from the Database sent on a lead 94. The Output Buffer 105 consists of storage elements which receive and store temporarily, until completion of compression of the current input record, the encoded outputs sent by the Economy Encoder 100 via a lead 104. When the entire record has been processed, the Output Buffer stores the compressed version of the record in the Electronic Storage Unit (FIG. 1) and stores the start location for the next record to be compressed in the Encoded-Record Directory.

The Searchtree Database 91 (FIG. 6a) contains collections of storage elements capable of storing the three tables required by the Encoder to parse and encode the input data: the label table 110, the symbol-position table 112, and the unseen-rank table 114. These tables are loaded with the values obtained for the corresponding tables of the File Preprocessor during the preprocessing run. These values are never changed during processing by the Encoder. The Searchtree Database also contains three comparators: the label comparator 111, the position comparator 116, and the first-position comparator 119; three gates 107, 108, and 115; and a register 120 to hold NSYM, the count of unseen symbols. The value of NSYM is obtained from the position counter 60 of the File Preprocessor after the preprocessing run and is never changed by the Encoder. NSYM is passed by the gate 108 to the or-gate 107 for use as the symbol position whenever an unseen symbol is encountered in the input data. NSYM is also transmitted on the lead 113 to the green-leaves converter 128 of the Pointer Generator 96 (FIG. 6c).

The sequence of events occurring during a single parsing and encoding cycle, as viewed by the Searchtree Database 91, is as follows. At the start of a cycle the address 1 is applied to the label table 110, which, upon receiving an address, sends the corresponding node label to the label comparator 111. The label comparator 111 compares the label with zero. Whenever the label is not zero, it is passed on via lead 98 to the Address Generator 95 (FIG. 6b). At the same time, an enable pulse is sent along lead 94 to the Input Buffer 92, which then releases the next input symbol. The new input symbol, as in the case of the File Preprocessor, is applied via lead 93 to the gate 115 and to the symbol-position table 112, which sends the position assigned to the symbol on to the position comparator 16, where it is compared with zero. If not zero, the position is sent along via the or-gate 107 and lead 99 to the first-position comparator 119 and to the Address Generator 95, which, when it has received both a new label and a new position from the Database, generates a new address which is returned via lead 97 to the label table to continue the cycle. The first-position comparator 119 compares the position with the initial position, the alphabet size $|A|$. If the two positions agree (that is, the current input symbol is the initial input symbol $x_1$ seen by the File Preprocessor), then the pointer should not be updated, and the comparator 119 sends an inhibit pulse on the lead 117 to the Pointer Generator (FIG. 6c) to prevent the update. Whenever the new symbol position is zero, the position comparator 116 generates an enable signal which is sent via lead 118 to the NSYM register 120 and to the gates 115 and 108. Upon receipt of the enable pulse, the NSYM register 120 releases the NSYM value to the gate 108, which passes it through the or-gate 107. The or-gate 107 sends it on to the Address Generator 95 via lead 99 as the current symbol position, and to the first-position comparator 119. The enable signal on lead 118 also activates the gate 115, which allows the input symbol on lead 93 to be applied to the unseen-rank table 114. This table then sends the rank of the new symbol on to the Economy Encoder 100 (FIG. 6d) via the lead 102. Gate 115 does not operate, however, until there is also an enable pulse on the lead 106 from the Output Buffer 105, indicating that the last encoded pointer has been received and stored. This prevents the transmission of the rank by the unseen-rank table 114 until the Economy Encoder 100 is ready to receive it. Each time that a symbol which had not been seen by the Preprocessor is encountered it must be encoded and included in the encoded output for the record. There is no updating of either the symbol-position table or the unseen-rank table.

When the new node label obtained from the label table 110 is zero, a leaf has been reached. The label comparator 111 then sends an enable signal on lead 103 to the Pointer Generator 96. The parsing-encoding cycle is completed when the label table 110 receives an acknowledge signal from the Output Buffer 105 on the lead 106. The address 1 is then applied to the table to initiate a new cycle. The acknowledge signal on lead 106 also opens the gate 115 if there is an active enable signal on lead 118, allowing encoding of the new symbol rank to take place.

The Address Generator 95 (FIG. 6b) contains a shift-and-add address calculator 121, an address comparator 122, an or-gate 123, and a standard hashing circuit 124, identical to the circuit 89 of FIG. 5c. The Address Generator 95 differs only slightly from its counterpart in the File Preprocessor (FIG. 5c). As before, it receives the current input symbol position p on the lead 99 from the or-gate 107 of the Searchtree Database 91 and the current node label i on the lead 98 from the label comparator 111 of the Searchtree Database. It calculates a new virtual address for the next node to be visited, using the formula $$address = i|A| - p + 2$$

with the multiplication by $|A|$ accomplished by shifting the label i to the left by M places, where M is the symbol size in bits. The calculated virtual address is sent on lead 109 to the Pointer Generator 96 for use in updating the leaves-only pointer and to the address comparator 122, where it is compared with the limit established for the size of direct storage in the label table. If greater than the limit, then the address is sent on to the hashing circuit 124 to be hashed; otherwise it is sent unaltered directly to the or-gate 123. The resulting calculated address, hashed or unhashed as the case may be, is then returned by the or-gate 123 to the label table 110 of the Searchtree Database 91 via the lead 97 for the next label-table lookup.

The Pointer Generator 96 (FIG. 6c) is comprised of two arithmetic circuits: a leaves-only converter 126, a green-leaves converter 128, and a gate 127. The green-leaves converter 126 receives the node label E of the father from the label comparator 111 of the Searchtree Database 91 on the lead 98, and the virtual address C of the son on the lead 109 from the address calculator 121 of the Address Generator 95. It converts the address into the leaves-only value of the pointer by the formula $$D = C - E - 1$$

where D is the leaves-only pointer. This conversion does not take place, however, if there is an inhibit pulse on the lead 117 from the first-position comparator 119. As discussed above, the comparator 119 sends an inhibit pulse whenever the current symbol position equals the first position $|A|$. Upon receipt of an enable pulse on the lead 103 from the label comparator 111 of the Searchtree Database 91, the gate 127 passes the leaves-only pointer D on to the green-leaves converter 128, which transforms it into the green-leaves pointer $D_g$ by carrying out the calculation $$D_g = D + (1 - NSYM)(D/(|A|-1))$$

where all arithmetic is integer, and NSYM, the number of unseen symbols, is obtained from the NSYM register 120 of the Searchtree Database 91 via the lead 113. The green-leaves value $D_g$ is then transmitted to the Economy Encoder 100 via the lead 101.

The Economy Encoder (FIG. 6d) is a mechanized version of the economy binary tree. It is used to calculate the Economy Code for the parsed input segment (new symbol rank). It consists of two threshold registers 130 and 135, two threshold comparators 131 and 136, two output converters 132 and 137, three gates 133, 134, and 138, and a delay 139. The rank threshold register 135 is loaded initially with the rank threshold TA computed by the adder 145 of the Threshold Calculator 48 (FIG. 5d) of the File Preprocessor at the end of the preprocessing run. The pointer threshold register 130 is loaded initially with the pointer threshold TB computed by the adder 146 of the Threshold Calculator 48 (FIG. 5d) of the File Preprocessor at the end of the preprocessing run. The rank threshold comparator 136 receives the threshold TA from the rank threshold register 135 and the symbol rank R on the lead 102 from the unseen rank table 114. The two inputs are compared, and if the threshold TA is not the smaller, the unchanged rank R is sent to the or-gate 138 as the Economy Code for the new symbol rank. If the rank R exceeds the threshold TA, then R is first sent to the rank output converter 137, where it is changed to $(2R-TA)/2$ by shift-and-add circuitry. The output from the converter 137 is then sent to the or-gate 138 as the Economy Code for the new symbol rank.

The pointer threshold comparator 131 receives the threshold TB from the pointer threshold register 130 and the green-leaves pointer $D_g$ on the lead 101 from the green-leaves converter 128 of the Pointer Generator 96 (FIG. 6c). The two inputs are compared, and if the threshold TB is not the smaller, the unchanged pointer $D_g$ is sent to the or-gate 133 as the Economy Code for the green-leaves pointer $D_g$. If the green-leaves pointer $D_g$ exceeds the threshold TB, then $D_g$ is first sent to the pointer output converter 132, where it is changed to $(2D_g - TB)/2$ by shift-and-add circuitry. The output from the converter 132 is then sent to the or-gate 133 as the Economy Code for the green-leaves pointer. The or-gates 133 and 138 transmit the selected Economy Codes to the Output Buffer 105 via the gate 134 and the lead 104. The delay 139 delays the encoded symbol rank until after the transmittal of the encoded pointer. The Output Buffer 105 completes the parsing-encoding cycle by sending a reset signal on lead 106 to the Searchtree Database 91 after receiving the Economy Code or Codes.

In addition to the six basic components shown in FIG. 6, the Short-Record Encoder also contains a Clock, connected to all components, and Sequence Control Units, which control the sequencing of operations by the components. These are not shown in FIG. 6.

Figure 7:
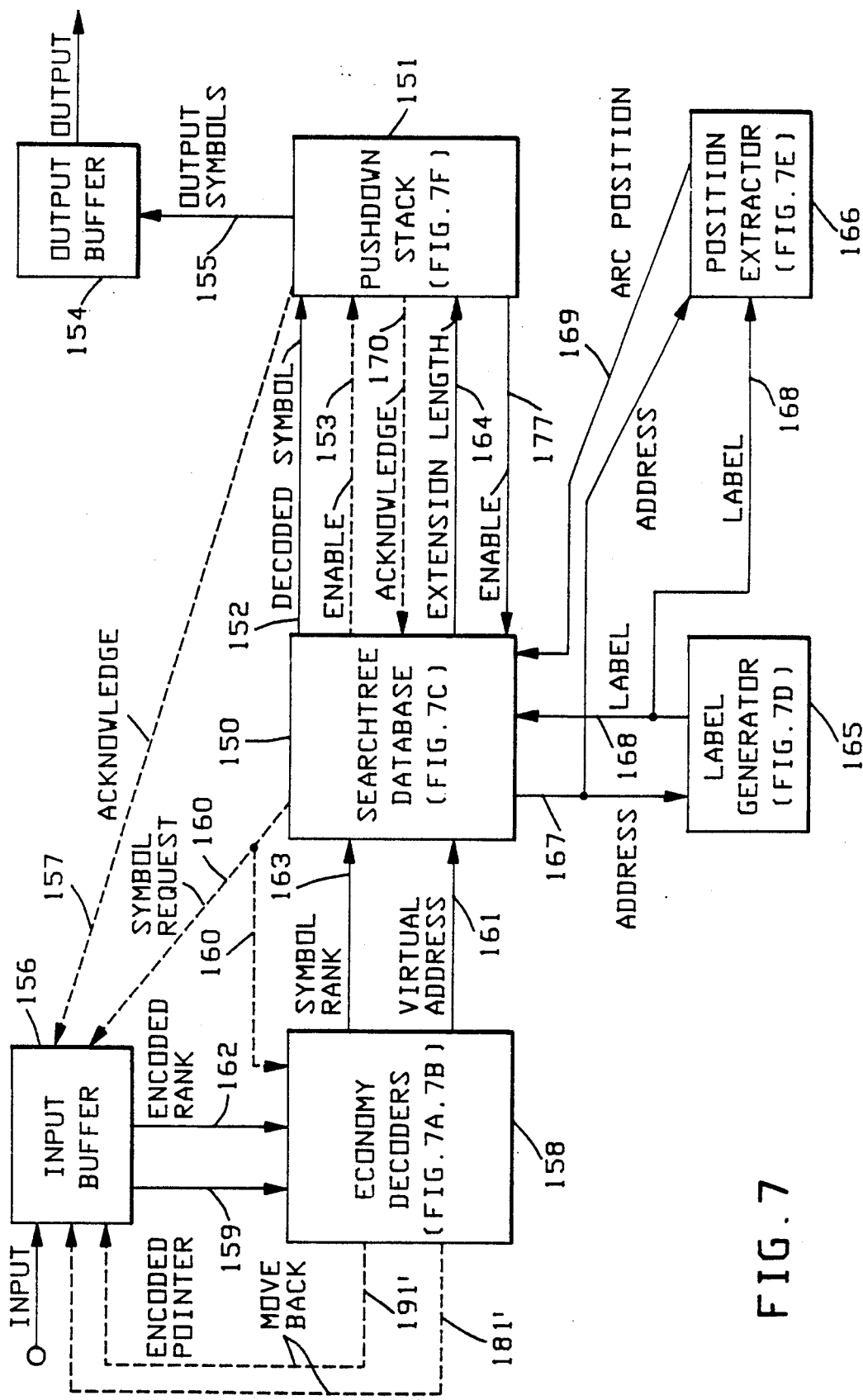
FIG. 7 is a schematic block diagram of an embodiment of the short-record decoder of the present invention.
Figure 7A:
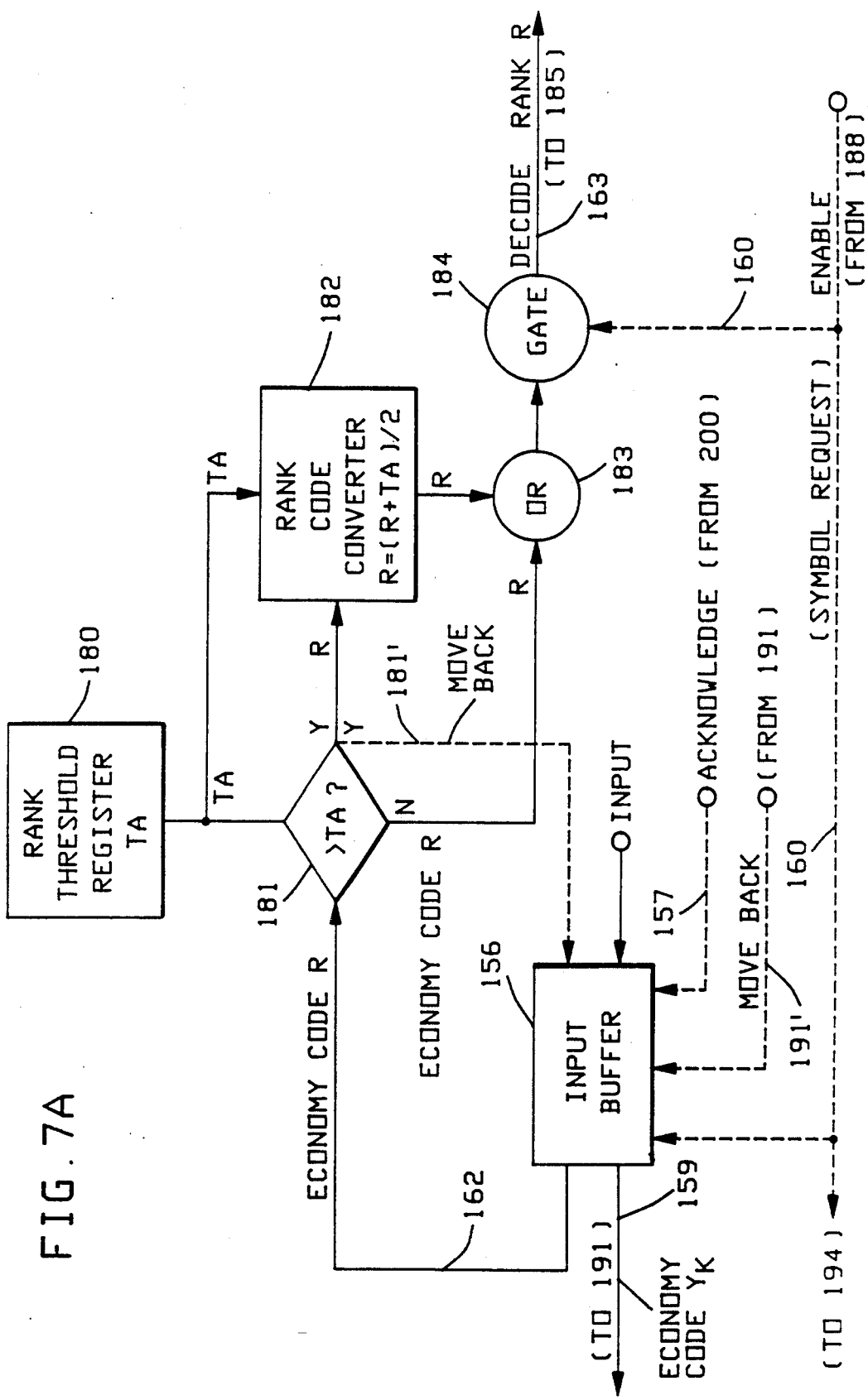
FIGS. 7a and b are schematic block diagrams illustrating details of the economy decoders of the decoder of FIG. 7.

Referring to FIGS. 7 and 7a-7f, the basic components of the Short-Record Decoder are an Input Buffer 156, a Searchtree Database 150, and an Output Buffer 154, similar to their counterparts in the Short-Record Encoder, plus an Economy Decoder 158, a Label Generator 165, a Position Extractor 166, and a Pushdown Stack 151. An overview of the Decoder organization is illustrated in FIG. 7, with five of the seven components shown in greater detail in FIGS. 7a-7f. The Decoder inverts the compressed code by means of a retrieval tree constructed by the File Preprocessor and identical to that used by the Encoder.

The Input Buffer 156 is comprised of storage elements which hold the compressed data record which is currently undergoing processing. The Input Buffer 156 supplies the current encoded symbol rank on the lead 162 to the Economy Decoder 158 when called for by an enable pulse from the Searchtree Database 150 sent on a lead 160. The Input Buffer 156 supplies the current encoded pointer on a lead 159 to the Economy Decoder 158 whenever it receives an acknowledge signal on a lead 157 from the Pushdown Stack 151. Processing of a record is initiated by a request from outside, and the Encoded-Record Directory is consulted for a given record, say J. The Encoded-Record Directory supplies the starting location at which the encoded version of record J is to be found in storage. The encoded record J is then read from the Electronic Storage Unit 12 (FIG. 1) into the Input Buffer 156, and decompression of the record can commence.

Figure 7B:
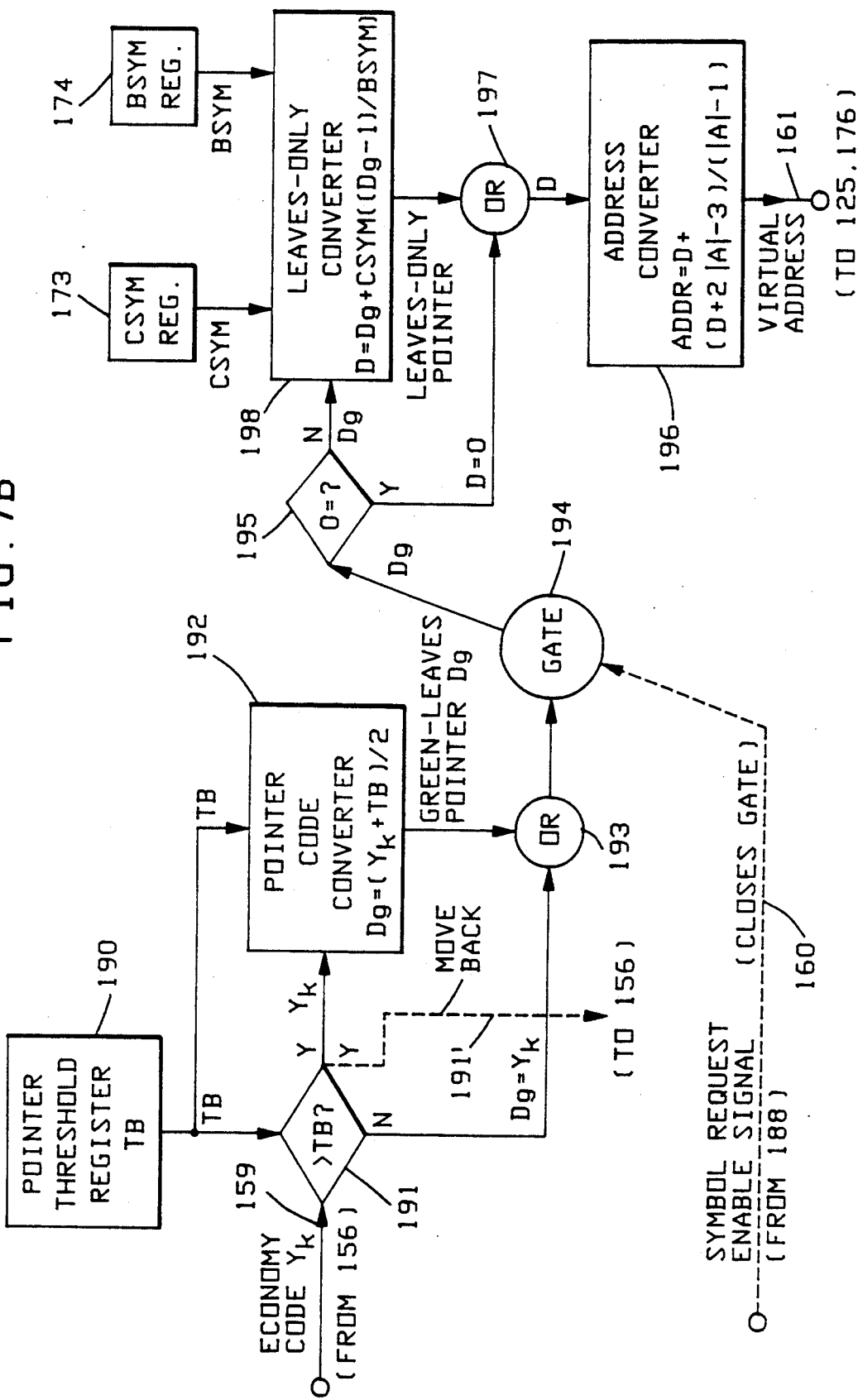
FIG. 7c is a schematic block diagram illustrating details of the searchtree database of the decoder of FIG. 7.
FIG. 7d is a schematic block diagram illustrating details of the label generator of the decoder of FIG. 7.
FIG. 7e is a schematic block diagram illustrating detail of the position extractor of the decoder of FIG. 7;.
FIG. 7f is a schematic block diagram illustrating detail of the push-down stack of the decoder of FIG. 7.

The Economy Decoder 158 is comprised of two parts: the rank decoder (FIG. 7a) and the pointer decoder (FIG. 7b). The rank decoder is comprised of a rank threshold register 180, loaded initially with the value TA computed by the Threshold Calculator 48 of the File Preprocessor at the end of the preprocessing run, a rank threshold comparator 181, a rank code converter 182, and two gates 183 and 184. When the Input Buffer 156 receives a symbol request pulse on the lead 160 from the symbol comparator 188 of the Searchtree Database 150 (FIG. 7c), it sends the economy code R for the new symbol rank to the rank threshold comparator 181 on the lead 162. The comparator 181 compares the rank R with the threshold TA obtained from the rank threshold register 180. If the rank does not exceed the threshold, it is passed directly without change to the or-gate 183; if, however, the rank R exceeds the threshold TA, it is passed to the rank code converter 182, where it is converted by the integer equation $$R = (R + TA)/2$$

and then on to the Or-gate 183. Additionally, if $R > TA$ the comparator 181 sends a signal via lead 181' to the Input Buffer 156 to inform the Input Buffer 156 where the encoded rank ended (i.e. to move back 1 bit). The or-gate 183 passes the appropriate R value on to the rank-unseen table 185 of the Searchtree Database 150 (FIG. 7c) via the gate 184, which is only open when an enable pulse is active on lead 160 from the symbol comparator 188 of the Searchtree Database 150, and via the lead 163.

The pointer decoder (FIG. 7b) is comprised of a pointer threshold register 190, loaded initially with the pointer threshold TB computed by the Threshold Calculator 48 of the File Preprocessor at the end of the preprocessing run, a pointer threshold comparator 191, a pointer code converter 192, a pointer comparator 195, a leaves-only converter 198, an address converter 196, two registers 173 and 174, and three gates 193, 194, and 197. The threshold comparator 191 receives the pointer threshold TB from the threshold register 190 and the Economy Code $Y_k$ from the Input Buffer 156 on the lead 159. If the Economy Code $Y_k$ exceeds the threshold TB, it is sent to the pointer code converter 192 to be transformed into the green-leaves pointer $D_g$ by the integer equation $$D_g=(Y_k+TB)/2$$

and passed to the or-gate 193. Additionally, if $Y_k > TB$, the comparator 191 sends a signal via lead 191' to the Input Buffer 156 to inform the Input Buffer 156 to move the pointer back 1 bit. If the threshold is not exceeded, then the Economy Code $Y_k$ is passed directly without alteration to the or-gate 193 as the green-leaves pointer. The green-leaves pointer is passed by the or-gate 193 to the pointer comparator 195 by way of the gate 194, which is normally open, but is closed if there is an active enable pulse (symbol request) on the lead 160 from the symbol comparator 188. The pointer comparator 195 compares the pointer with zero: if zero, it is passed directly to the or-gate 197 as the leaves-only pointer D; if not zero, it must first go to the leaves-only converter 198 to be converted to the leaves-only pointer D by the integer equation $$D=D_g+(CSYM (D_g-1)/BSYM)$$

where CSYM and BSYM are obtained from the CSYM register 173 and the BSYM register 174, respectively. The CSYM register 173 is loaded initially with the value CSYM, which is taken to be NSYM−1 if NSYM>0, and 0 otherwise. NSYM is provided by the contents of the position counter 60 (FIG. 5a) at the end of the preprocessing run. The BSYM register 174 is loaded with BSYM, the contents of the symbol counter 59 (FIG. 5a) at the end of the preprocessing run. Finally, the leaves-only pointer D is converted into a virtual address by the address converter 196, which implements the integer equation $$address=D+(D+2|A|-3)/(|A|-1).$$

Figure 7C:
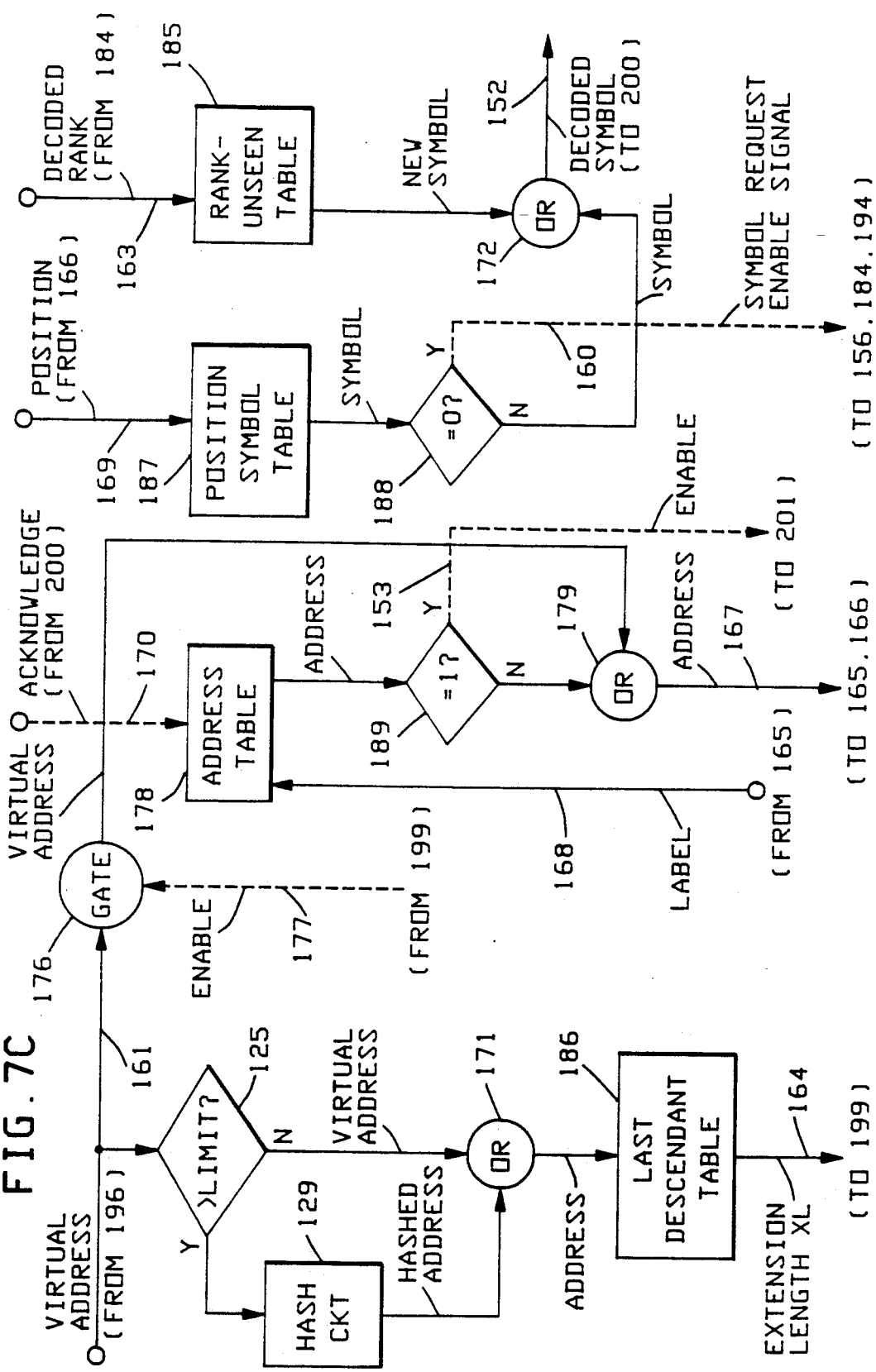

This computed virtual address is then sent back via lead 161 to the gate 176 and to the limit comparator 125 of the Searchtree Database 150 (FIG. 7c).

The Searchtree Database 150 is comprised of collections of storage elements capable of storing the four tables required by the Decoder: the address table 178, the last-descendant table 186, the position-symbol table 187, and the rank-unseen table 185 described above; three comparators: the address comparator 189, the symbol comparator 188, and the limit comparator 125; a standard hashing circuit 129, identical to the circuit 89 of the Address Generator 45 of the File Preprocessor (FIG. 5c); and four gates 171, 172, 176, and 179. The four tables are loaded initially with the values obtained by the File Preprocessor during the preprocessing run. These values are never changed or updated by the Decoder. The storage elements comprising the address table 178 are capable of being accessed under control of a label supplied by the Label Generator 165 so as to return a new address. The resulting sequences of addresses can be viewed as backward paths through the tree which serve to record the decoded segments in reverse order. The last element in such a sequence is distinguished as the root when the address one is returned by the address table 178 for the current label.

Figure 7D:
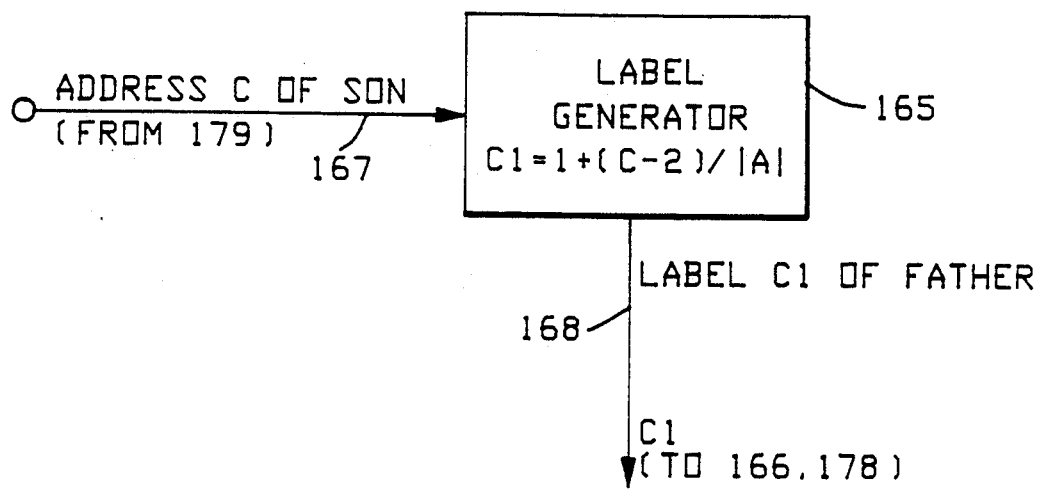
Figure 7E:
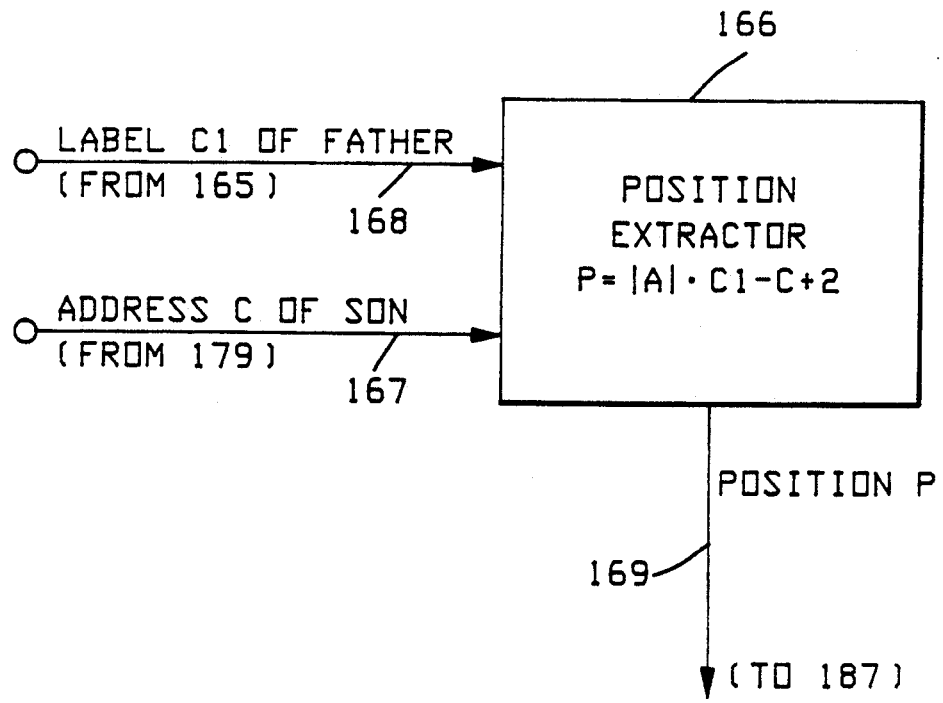
Figure 7F:
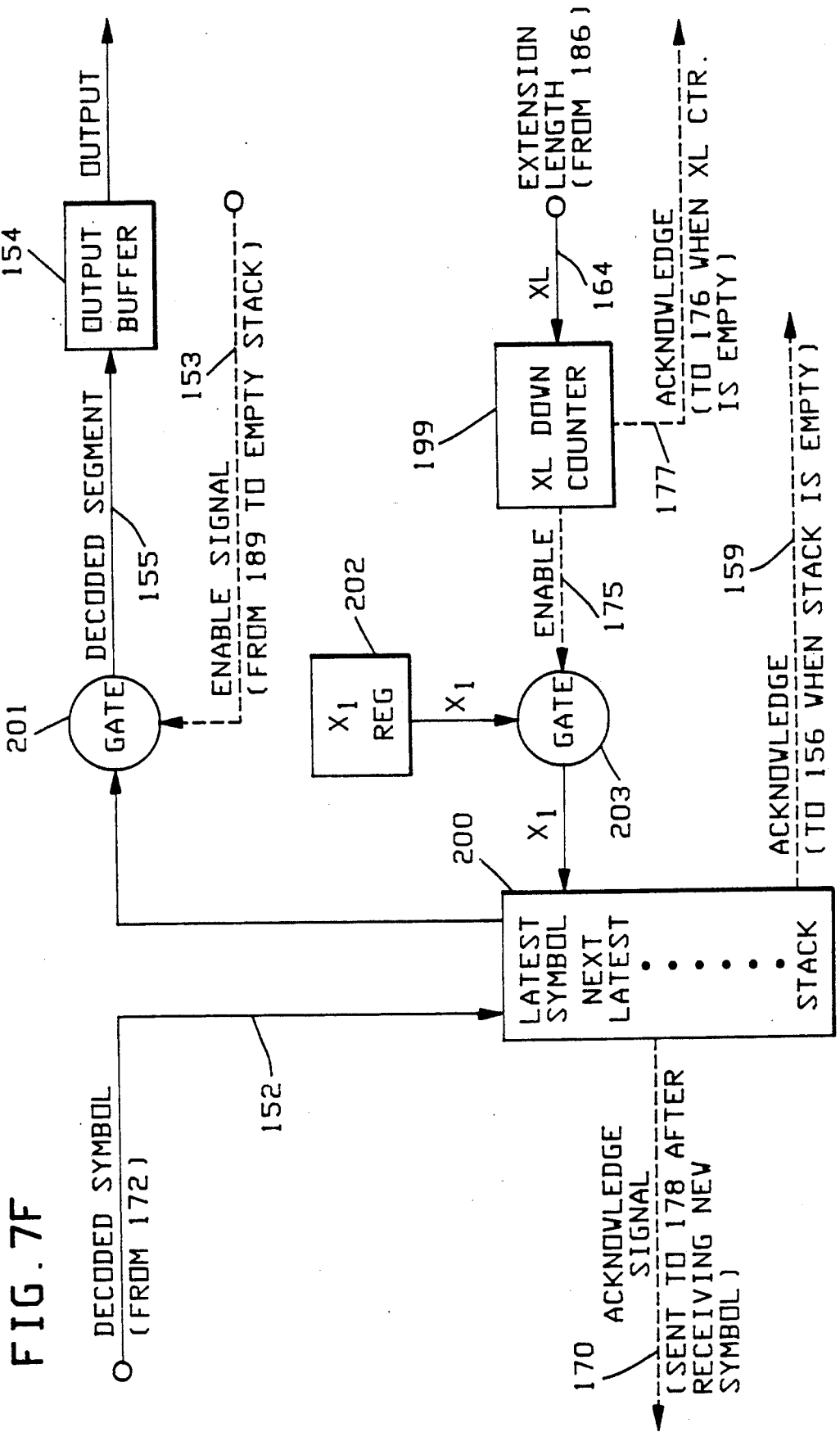

The address which is sent back to the Searchtree Database by the Economy Decoder 158 may be the address, not of a leaf, but of an internal node, since in computing leaves-only values, the pointer value of the father is passed on to its $x_1$−son, where $x_1$ is the first symbol encountered by the File Preprocessor during the preprocessing run. Before beginning the traceback, the Decoder determines whether this address is the address of a leaf or an internal node. The Decoder employs the last-descendant table 186 of the Searchtree Database for this purpose The virtual address returned by the pointer decoder on the lead 161 is tested by the limit comparator 125 against the limit established for the size of direct storage. If greater than the limit, then the address is sent on to the hashing circuit 129 to be hashed; otherwise it is sent directly without change to the or-gate 171. The resulting calculated address, hashed or unhashed as the case may be, is selected by the or-gate 171 and applied to the last-descendant table 186. The decoded segment begins with a string of XL symbols, all equal to $x_1$, where XL is the extension length returned by the last-descendant table 186 in response to the applied address. These XL repetitions of $x_1$ are applied to the Pushdown Stack 151 (FIG. 7f), in a manner to be discussed below. When this has been completed, the Pushdown Stack returns an enable pulse on the lead 177 which opens the gate 176, allowing the virtual address on lead 161 from the address converter 196 of the pointer decoder to be passed, via the or-gate 179 and lead 167, to the Label Generator 165 (FIG. 7d). The backward decoding trace is then ready to commence.

At each cycle of the backward trace, the current node label is supplied on lead 168 to the address table 178, which returns the virtual address of the node. This address is sent to the address comparator 189, where it is compared with one. If not equal to one, the new address is sent via the or-gate 179 and lead 167 to the Position Extractor 166, which then computes the position of the arc being traversed. The new address on lead 167 is also sent to the Label Generator 165, which then computes the label of the father to be visited next. This label is sent on lead 168 both to the Position Extractor 166 and back to the address table 178 to continue the traceback. When the address comparator 189 finally receives the address one, the root of the tree has been reached, and the traceback ends. The comparator 189 then sends an enable pulse on lead 153 to the Pushdown Stack 151 (FIG. 7f), which can then send its contents on to the Output Buffer 154.

The Label Generator 165 (FIG. 7d) is a shift-and-add circuit which computes the label of the father node from the virtual address of the son. It receives the address C from the address table 178 via the address comparator 189, the or-gate 179, and lead 167 of the Searchtree Database and returns the label C1 of the father to the address table 178 and to the Position Extractor 166 via the lead 168. (The first address in each decoding cycle comes directly from the address converter 196 of the Economy Decoder 158 via lead 161 and the gates 176 and 179 of the Searchtree Database, instead of from the address table.) The label is calculated by shift-and-add using the equation $$C1 = 1 + (C-2)/|A|$$

where C1 is the label of the father, C is the address of the son, $|A|$ is the alphabet size, and integer arithmetic is used.

The Position Extractor 166 (FIG. 7e) is a shift-and-add circuit that receives the node label C1 of the father on the lead 168 from the Label Generator 165 and the virtual address C of the son on the lead 167 from the address table 178 via the address comparator 189 and the or-gate 179 of the Searchtree Database. (Again, the first address in each decoding cycle comes directly from the Economy Decoder 158 via the gates 176 and 179 of the Searchtree Database, instead of from the address table.) It computes the position p of the arc joining the son to the father and returns this position via the lead 169 to the position-symbol table 187 of the Searchtree Database. The position p is calculated by shift-and-add, using the integer equation $$p = |A|C1 - C + 2$$

The position p returned by the Position Extractor 166 is applied to the position-symbol table 187 of the Searchtree Database (FIG. 7c). This table then sends the symbol assigned to position p to the symbol comparator 188, where it is compared to zero. If not zero, it is sent on to the or-gate 172, which passes it on via lead 152 to the Pushdown Stack 151 for temporary storage until the traceback is completed. Whenever the symbol value is zero, however, it is known that a new symbol has been encountered. The comparator 188 then sends an enable pulse (symbol request) via the lead 160 to both the rank decoder (FIG. 7a) and the pointer decoder (FIG. 7b) of the Economy Decoder 158 and to the Input Buffer 156. The enable pulse sent to the pointer decoder inhibits operation of that unit during the rank decoding by closing the gate 194 (FIG. 7b). The Input Buffer 156, upon receiving the enable pulse on lead 160, sends the encoded symbol rank via lead 162 to the rank decoder for decoding. The decoded symbol rank is then sent by the rank decoder (FIG. 7a) via the lead 163 to the rank-unseen table 185 of the Searchtree Database. This table then supplies the new symbol value, which is sent to the Pushdown Stack 151 via the or-gate 172 and lead 152.

The Pushdown Stack (FIG. 7f) consists of a last in-first out (LIFO) stack 200, a register 202 loaded with $x_1$, the first input symbol seen by the File Preprocessor during the preprocessing run, a countdown counter 199, and two gates 201 and 203. At the beginning of a traceback cycle, the pointer decoder (FIG. 7b) sends the decoded virtual address to the last-descendant table 186 of the Searchtree Database 150 (FIG. 7). The last-descendant table then sends XL, the extension length to a leaf via $x_1$ arcs, to the countdown counter 199 on the lead 164. Whenever the countdown counter 199 contains a positive integer, it emits an enable signal on lead 175 to the gate 203, opening the gate and allowing the symbol $x_1$ to be passed from the register 202 to the stack 200, where it is stored in the lowest empty slot. The counter 199 is then decremented, and the process is repeated until the counter is empty. When the count goes from 1 to 0, an enable signal is emitted on the lead 177, which opens the gate 176 of the Searchtree Database, initiating the traceback cycle by passing the first node address to the or-gate 179 (FIG. 7c).

During the traceback the LIFO stack 200 receives the decoded symbols one at a time on the lead 152 from the or-gate 172 of the Searchtree Database. After storing the received symbol in the lowest empty slot, the stack sends an acknowledge signal on lead 170 to the address table 178 of the Searchtree Database to continue the backward decoding trace. When the root of the tree is finally reached, the address comparator 189 of the Searchtree Database sends an enable signal on lead 153 to open the gate 201. The contents of the LIFO stack 200 are emptied into the Output Buffer 154 in the reverse order to which they were acquired by the stack. This completes the decoding of the current parsed segment. When the stack 200 is finally empty, it sends the Input Buffer 156 an acknowledge signal on the lead 157, telling it to send the next encoded pointer to the Economy Decoder for decoding.

In addition to the seven basic components shown in FIG. 7, the Short-Record Decoder also contains a Clock, connected to all components, and Sequence Control Units, which control the sequencing of operations by the components. These are not shown in FIG. 7.

In operation, a request for a particular record, say J, is received from the outside and the short-record decoder 15 (FIG. 1) by conventional circuitry (not shown) calls for the encoded record J using the encoded-record directory 14 and places this record into the decoder input buffer 156. The record is decoded as described above, and from the Output Buffer 154 is altered if desired by the record modifier 16 (FIG. 1). The altered record is applied to the encoder 13 (FIG. 1), recompressed and stored back to the electronic storage unit 12. As described above, the altered record may or may not be stored back in the previous location. If not, the encoded-record directory 14 is accordingly modified as described above. It will be further appreciated from the foregoing, that if all of the symbols of the alphabet has not been encountered when the searchtree database is fixed, the encoder and decoder will process each as yet unseen symbol as a newly encountered symbol irrespective of the number of times it continues to appear.

While the invention has been described in its preferred embodiment, it is to be understood that the words which have been used are words of description rather than limitation and that changes may be made within the purview of the appended claims without departing from the true scope and spirit of the invention in its broader aspects.

APPENDIX 1

HARDWARE POLLING ROUTINE ()

```
**   CV: CODE VIOLATION FLAG
**   FC: FLOW CONTROL ERROR FLAG
**   RT: ROUND TRIP ERROR FLAG
**   SEND_IDHY: FLAG WHICH REQUIRES LINK UNIT
**              TO SEND IDHY ("I DON'T HEAR YOU") COMMANDS
```

```
LOOP:

CLEAR INT_CV, INT_FC, INT_RT

FOR N = 1 TO 5

DELAY (1 MILLISECOND)

READ CV, FC AND RT FLAGS
        FROM STATUS REGISTERS IN LINK UNIT

INT_CV = INT_CV + CV
        INT_FC = INT_FC + FC
        INT_RT = INT_RT + RT
    END

IF (INT_CV .GE. 3  .OR.  INT_FC .GE. 3)
        SET SEND_IDHY          ** SEND IDHY COMMANDS
        SET HW.LINK_STATUS = DEAD
    ELSE
        RESET SEND_IDHY        ** DON'T SEND IDHY COMMANDS
        IF INT_RT .GE. 3
            SET HW.LINK_STATUS = DEAD
        ELSE
            SET HW.LINK_STATUS = ALIVE
        END
    END

CALL MESSAGE_EXCHANGE (LINK_STATUS)

ENDLOOP
```

APPENDIX 2

```
MESSAGE_EXCHANGE ROUTINE (
      HW.LINK_STATUS : STATUS
)

READ HW.LINK_STATUS FROM HARDWARE POLLING ROUTINE

IF ME.LINK_STATUS = HW.LINK_STATUS = DEAD
    RETURN
ENDIF

IF ME.LINK_STATUS = ALIVE .AND. HW.LINK_STATUS = DEAD
    SET ME.LINK_STATUS = DEAD
    CALL STATUS CHANGE FILTER
    RETURN
END

IF ME.LINK_STATUS = HW.LINK_STATUS = ALIVE
    AND 5_SECOND MESSAGE TIMER HAS EXPIRED

CALL KEEP ALIVE MESSAGE
    RESTART 5_SECOND MESSAGE TIMER
    RETURN
END

IF HW.OLD_STATUS = DEAD .AND. HW.LINK_STATUS = ALIVE
    IF 15_SECOND_DEAD_TO_ALIVE TIMER HAS EXPIRED
        SET ME.LINK_STATUS = ALIVE
        CALL KEEP ALIVE MESSAGE
        IF ME.LINK_STATUS = ALIVE
            RESTART 15_SECOND_DEAD_TO_ALIVE TIMER
```

```
                    CALL STATUS CHANGE FILTER
            END
        END
        RETURN
END

KEEP ALIVE MESSAGE SUBROUTINE

SEND KEEP ALIVE PACKET TO REMOTE LINK UNIT
WAIT FOR ACKNOWLEDGMENT MESSAGE
IF ACKNOWLEDGMENT MESSAGE RECEIVED
        ACKNOWLEDGE THE ACKNOWLEDGEMENT MESSAGE
        SET ME.LINK_STATUS = ALIVE
ELSE
        REPEAT ACKNOWLEDGEMENT
        MESSAGE SEVERAL TIMES

IF ACKNOWLEDGEMENT STILL NOT RECEIVED
            SET ME.LINK_STATUS = DEAD
            CALL STATUS CHANGE FILTER
        END
END MESSAGE_EXCHANGE
```

APPENDIX 3

CHANGE STATUS FILTER ROUTINE ()

```
READ ME.LINK STATUS FROM MESSAGE EXCHANGE ROUTINE

IF FILTER.STATUS = ME.LINK_STATUS = DEAD
        RETURN
END

IF FILTER.STATUS = ME.LINK_STATUS = ALIVE
        RETURN
END

IF FILTER.STATUS = ALIVE .AND. ME.LINK_STATUS = DEAD
        FILTER.STATUS = DEAD
        CALL RECONFIGURATION ROUTINE
END

IF FILTER.STATUS = DEAD .AND. ME.LINK_STATUS = ALIVE
        IF 30_SECOND_FILTER TIME HAS EXPIRED
            FILTER.STATUS = ALIVE
            RESTART 30_SECOND_FILTER TIMER
            CALL RECONFIGURATION ROUTINE
        END
END
```

APPENDIX 4

TREE POSITION DATA STRUCTURES AND SUBROUTINES

```
TreePos DATA STRUCTURE:
    root    : UID      ** UID of switch believed to be the
                       ** root
    depth   : LEN      ** believed depth of switch S in the
                       ** tree
    parent  : UID      ** UID of switch believed to be parent
                       ** of switch S
    uplink  : LPN      ** local port number that is believed
                       ** to be the uplink for switch S
```

```
COMPARE_TREE_POS SUBROUTINE ( a : TreePos; b : TreePos ) :
    IF a.root < b.root      THEN RETURN "LT"; END;
    IF a.root > b.root      THEN RETURN "GT"; END;

IF a.depth < b.depth    THEN RETURN "LT"; END;
    IF a.depth > b.depth    THEN RETURN "GT"; END;

IF a.parent < b.parent  THEN RETURN "LT"; END;
    IF a.parent > b.parent  THEN RETURN "GT"; END;

IF a.uplink < b.uplink  THEN RETURN "LT"; END;
    IF a.uplink > b.uplink  THEN RETURN "GT"; END;

RETURN "EQ";
END

DERIVE_TREE_POS SUBROUTINE (
    s2:  UID      ** Switch UID of message sender
    p :  LPN      ** local port number on which message
                  ** was received
    t2:  TreePos  ** sender's tree position
) : TreePos;
    t1.root   = t2.root
    t1.depth  = t2.depth + 1
    t1.parent = s2
    t1.uplink = p
    RETURN t1
END
```

---

APPENDIX 5

PORT INFORMATION AND MESSAGE DATA STRUCTURES

INFO[P] (PORT INFORMATION) DATA STRUCTURE:
```
    TYPE    : Char       ** 'S' for switches,
                         ** 'H' for hosts
                         ** 'D' for dead links
    R_POS   : TreePos    ** tree position last reported
                         ** by neighbor on port P
    E_POS   : TreePos    ** echo of tree position
    R_STB   : Boolean    ** received stability report
    E_STB   : Boolean    ** echo of stability report
    R_UID   : UID        ** UID of neighbor on port P
    R_PORT  : Integer    ** port number of neighbor
    NEW     : Boolean    ** new info received from
                         ** neighbor
```

MESSAGE DATA STRUCTURE:
```
    EPOCH : epoch        ** epoch number of sender
    S_UID : UID          ** sender's UID
    TYPE  : Char         ** sender is switch/host
    S_POS : TreePos      ** sender's current tree position
    E_POS : TreePos      ** echo of receiver's last
                         ** reported tree position
    S_STB : Boolean      ** sender's stability report
    E_STD : Boolean      ** echo of receiver's last
                         ** stability report
    NEW   : Boolean      ** sender believes that message
                         ** contains new information
```

APPENDIX 6

<u>START_RECONFIGURATION ROUTINE</u> ()

```
EPOCH = EPOCH + 1
IF EPOCH OVERFLOWS
     CALL SUICIDE_PACT ROUTINE
END

STOP ALL LINK UNITS AND PURGE ALL MESSAGE PACKETS

SET UP DEFAULT TREE POSITION AND STABILITY RECORD:
  NUL_POS : TreePos
     NUL_POS.ROOTID  = NIL_UID      ** WORST POSSIBLE UID
     NUL_POS.DEPTH   = INFINITY     ** WORST POSSIBLE DEPTH
     NUL_POS.PARENT  = NIL_UID      ** WORST POSSIBLE UID
     NUL_POS.UPLINK  = NIL_PORT     ** WORST POSSIBLE UPLINK CLEAR PORT INFORMATION RECORDS
     FOR P = ALL ALIVE LINK PORTS COUPLED TO A SWITCH
          INFO[P].R_POS   = NUL_POS
          INFO[P].E_POS   = NUL_POS
          INFO[P].R_STB   = .FALSE.
          INFO[P].E_STB   = .FALSE.
     END DEFINE CPOS : TreePos          ** CURRENT TREE POSITION
     CPOS.ROOTID = S           ** THIS SWITCH'S UID
     CPOS.DEPTH  = 0
     CPOS.PARENT = NIL_UID
     CPOS.UPLINK = NIL_PORT
     CSTB = .FALSE.

*** SEND RECONFIGURATION MESSAGES:
  FOR P = ALL ALIVE LINK PORTS COUPLED TO A SWITCH
     R_MSG: MESSAGE =
          R_MSG.EPOCH = EPOCH
          R_MSG.S_UID = S = THIS SWITCH'S UID
          R_MSG.S_POS = CPOS
          R_MSG.E_POS = INFO[P].R_POS
          R_MSG.S_STB = CSTB
          R_MSG.E_STB = INFO[P].R_STB
          R_MST.NEW   = .TRUE.

SEND R_MSG ON LINK P
  END

RETURN
```

APPENDIX 7

<u>RECEIVE_MESSAGE ROUTINE</u> (
```
     p : LPN       ** port on which message is received
     m : Message   ** message received
)

IF NOT LIVE(p) THEN RETURN; END;

IF m.epoch > EPOCH        ** test for new epoch
     EPOCH = m.epoch
     STOP ALL LINK UNITS AND PURGE ALL MESSAGE PACKETS
```

```
        *** CLEAR PORT INFORMATION RECORDS:
        FOR x = ALL ALIVE LINK PORTS COUPLED TO A SWITCH
            INFO[x].R_POS   = NUL_POS
            INFO[x].E_POS   = NUL_POS
            INFO[x].R_STB   = .FALSE.
            INFO[x].E_STB   = .FALSE.
        END

CPOS = NUL_POS           ** CLEAR CURRENT POSITION
    END

IF m.epoch < EPOCH  THEN RETURN; END;  ** Ignore old epochs

IF m.S_POS > INFO[p].R_POS  THEN ABORT; END;
        ** (violates monotonic position improvement)

IF m.E_POS > INFO[p].E_POS  THEN ABORT; END;
        ** (violates monotonic position improvement)

INFO[p].R_POS = m.S_POS
    INFO[p].E_POS = m.E_POS
    INFO[p].R_STB = m.S_STB
    INFO[p].E_STB = m.E_STB
    INFO[p].NEW   = m.NEW         ** must reply if sender says
                                  ** this is new information
    REPLY_RQ = m.NEW              ** Indicates if Reply is Rqd XPOS = DERIVE_TREE_POS( m.S_UID, p, m.S_POS )
    IF XPOS < CPOS
        CPOS = XPOS
        REPLY_RQ = .TRUE.
    END CALL EVALUATE()    ** REPLY_RQ =.TRUE. if CSTB changes
                       ** in value

IF REPLY_RQ  THEN CALL SEND_MSG(); END;
    END RECEIVE_MESSAGE ROUTINE

EVALUATE SUBROUTINE ()
    ** SWITCH IS NOT STABLE IF:
    ** (1) THE SWITCH'S CURRENT TREE POSITION DOES NOT
    **     MATCH THE POSITION LAST ECHOED BY ANY NEIGHBOR
    ** OR
    ** (2) ANY CHILD OF THE SWITCH IS NOT STABLE

OLD_CSTB = CSTB
    CSTB = .TRUE.
    FOR P = ALL ALIVE LINK PORTS COUPLED TO A SWITCH
        IF (CPOS # INFO[P].E_POS) .OR.
           ((INFO[P].R_POS.PARENT = S)
            .AND. (NOT INFO[P].R_STB))
              CSTB = .FALSE.
        END
    END
    IF CSTB # OLD_CSTB
        REPLY_RQ = .TRUE.
    END
END

SEND_MSG ROUTINE()
    ** SEND UPDATE MESSAGES TO:
    ** (1) ALL LINKS WHICH DON'T KNOW
    **      CURRENT TREE POSITION OF SWITCH
```

```
**  (2) ALL LINKS ON WHICH NEW INFORMATION HAS BEEN
**      RECEIVED SINCE THE LAST UPDATE MESSAGE
**      WAS SENT TO IT
**  AND
**  (3) PARENT OF SWITCH IF STABILITY OF SWITCH HAS
**      CHANGED

M.S_POS = CPOS
    M.S_STB = CSTB

FOR P = ALL ALIVE LINK PORTS COUPLED TO A SWITCH
        M.NEW = .FALSE.

IF INFO[P].E_POS # CPOS
            M.NEW = .TRUE.
        END

IF ( P = CPOS.UPLINK ) .AND.
           ( INFO[P].E_STB # CSTB )
            M.NEW = .TRUE.
        END
```

---

SEND_MSG ROUTINE, continued:

```
        IF M.NEW .OR. INFO[P].NEW
            M.E_POS = INFO[P].R_POS
            M.E_STB = INFO[P].R_STB
            SEND MESSAGE M ON PORT P
            INFO[P].NEW = .FALSE.
            IF M.NEW  .AND.  MSG_TIMER HAS EXPIRED
                RESTART MSG_TIMER
                ENABLE MESSAGE_TIMER ROUTINE
            END
        END

IF CSTB .AND. (P = CPOS.UPLINK) .AND.
           (INFO[P].E_STB # CSTB)
            CALL SEND_NETLIST_UP (P)
        END
    END                                ** END OF LOOP
END SEND_MSG

MESSAGE_TIMER ROUTINE()
    ** This routine calls the SEND_MSG routine
    ** periodically (e.g., every 2 milliseconds) to make
    ** sure that all messages containing new information
    ** are acknoweldged IF MSG_TIMER IS RUNNING
        WAIT UNTIL MSG_TIMER EXPIRES
        CALL SEND_MSG()
    END
END MESSAGE_TIMER
```

APPENDIX 8

NETLIST DATA STRUCTURE AND ROUTINES

NETLIST (NETWORK TOPOLOGY) DATA STRUCTURE:
```
    COMPLETE : Boolean   ** True when netlist of entire
                         ** network
    NN       : Int       ** Number of network members
                         ** in netlist
```

```
    NODES       : list      ** sorted list of UIDs and
                            ** ShortIDs of network members
                            ** in netlist
    CNCT[1]     : list      ** list of network members
                            ** connected to each port of first
                            ** network member in netlist.
     ...
    CNCT[NN]    : list      ** list of network members
                            ** connected to each port of last
                            ** network member in netlist.

SEND_NETLIST_UP(
    p : LPN
)
    **   Note:
    **   An initial Netlist "nlst" is built using data in
    **   INFO[] at the beginning of Phase 2
    **   of the Reconfiguration Process.

SEND nlst ON PORT p
END SEND_NETLIST_UP

SEND_NETLIST_DOWN
    **  SEND NETLIST TO ALL SWITCHES FOR WHICH SWITCH S
    **  IS THE PARENT

FOR P = ALL ALIVE PORT LINKS COUPLED TO A SWITCH
        IF INFO[P].R_POS.UPLINK = INFO[P].R_PORT
            SEND nlst ON PORT P
        END
    END
END SEND_NETLIST_DOWN RECEIVE_NETLIST(
    n : NETLIST
)
    ** If the received netlist is incomplete,
    ** generate new netlist nlst combining the
    ** information in nlst and the received netlist IF .NOT. n.COMPLETE
        MERGE n into nlst
    END

*** If this switch is the root, and is stable,
    *** Phase 2 of Reconfiguration is done,
    *** Netlist is Complete,
    *** and Phase 3 begins.

IF CSTB .AND. CPOS.root = S
        ASSIGN SHORTIDs TO NETWORK MEMBERS IN nlst
        SET nlst.COMPLETE = .TRUE.
        CALL SEND_NETLIST_DOWN()
        CALL COMPUTE_ROUTE_TABLE
        RETURN
    END IF n.COMPLETE                        *** Complete Netlist
        REPLACE nlst WITH n              *** is sent down the
        CALL SEND_NETLIST_DOWN           *** tree and is also
        CALL COMPUTE_ROUTE_TABLE         *** used to compute
        RETURN                           *** routing table
    END

END RECEIVE_NETLIST
```

APPENDIX 9

ROUTING TABLE DATA STRUCTURES AND ROUTINE

ROUTING TABLE:
```
    BC[0:32767]          : BINARY ** BROADCAST BIT
    LINKV[0:32767, 1:13) : BINARY ** 13 BIT LINK VECTOR
```

SUBNET TABLE:
```
    SUBNET[0:15, 0:127]  : BINARY ** SUBNET OF SWITCHES
```

COMPUTE_ROUTE_TABLE()

*** FIRST COMPUTE LEGAL ROUTES BETWEEN SWITCHES:

```
    SET ALL SUBNET[] = 0
    FOR I = ALL LINKS OF SWITCH
        FOR J = ALL SHORTIDS IN THE NETWORK
            IF ( IT IS POSSIBLE TO GET TO SWITCH J VIA
                 LINK I WITHOUT VIOLATING THE UP/DOWN
                 ROUTING RULE, ON A PATH NO MORE THAN N
                 LINKS LONGER THAN SHORTEST PATH TO
                 SWITCH J)
                 SUBNET[I,J] = 1
            END
        END
    END
```

** EXPAND SUBNET TO FILL ROUTING TABLE

```
    RESET ENTIRE ROUTING TABLE WITH BC[*]=1, LINKV[*]=0

FOR L = ALL ALIVE INPUT LINKS            ** 4-BITS
        FOR M = ALL LINK NUMBERS
            FOR J = ALL SHORTIDS IN NETWORK   ** 11-BITS

IF J = SHORTID OF THIS SWITCH
                LINKV[L,M,J] = 1 IF LINK M IS ALIVE

ELSE

IF LINK L IS A DOWN LINK OR A HOST
                    LINKV[L,M,J] = SUBNET[M,J]

ELSE    ** LINK L IS AN UP LINK
                    IF LINK J IS A DOWN LINK
                        LINKV[L,M,J] = SUBNET[M,J]
                    END
                END
            END
        END
    END
```

---

** COMPUTE BROADCAST ROUTING ENTRIES:

FOR EVERY PREDEFINED BROADCAST ADDRESS

** HANDLING FOR ALL BUT ROOT NODE:

IF CPOS.ROOT ≠ S

** DOWN LINKS ARE LINKS TO HOSTS AND LISKS FOR
      ** WHICH  INFO[LINK].PARENT = S

** SET LINK VECTORS FOR BC PACKETS
      ** GOING UP THE TREE:

```
            FOR EVERY DOWN LINK
                  ADR = CONCATENATE( LINK_NUMBER,
                                BROADCAST ADDRESS)
                  BC[ADR] = 0
                  LINKV[ADR, CPOS.UPLINK] = 1
            END

** SET LINK VECTORS FOR BC PACKETS
            ** GOING DOWN THE TREE:

ADR = CONCATENATE( CPOS.UPLINK,
                        BROADCAST ADDRESS)
            BC[ADR] = 1
            FOR D = EVERY SPANNING TREE DOWN LINK
                  LINKV[ADR, D] = 1
            END

ELSE

** SPECIAL TREATMENT FOR ROOT NODE

FOR EVERY DOWN LINK
                  ADR = CONCATENATE( LINK_NUMBER,
                              BROADCAST ADDRESS)
                  BC[ADR] = 1
                  FOR D = EVERY SPANNING TREE DOWN LINK
                        LINKV[ADR](D) = 1
                  END
            END
      END
END

** SPECIAL PREDEFINED ADDRESS FOR SENDING
** RECONFIGURATION MESSAGES TO NEIGHBORING SWITCHES

WRITE PREDEFINED LINK VECTOR
FOR PREDEFINED 'NEIGHBORING SWITCH SCP ADDRESS'

END COMPUTE_ROUTE_TABLE
```

APPENDIX

Program WLE38T1B             FILE PREPROCESSOR

```
1           COMPILER (FLD=ABS),(XM=1)
2  C    A      LOG NSYM    NEED A OR A-1 BITS TO ENCODE NEW SYMBOL
3  C    B      LOG H       NEED B OR B-1 BITS TO ENCODE POINTER
4  C    BL     NO. OF DISC SECTORS PER READ-WRITE BLOCK
5  C    BSYM   NO. OF DISTINCT INPUT SYMBOLS SEEN SO FAR
6  C    C      VIRTUAL ADDRESS OF CURRENT NODE DURING TRACE OF FORWARD PATH IN TREE
7  C    C2     REAL ADDRESS OF NODE OBTAINED BY HASHING VIRTUAL ADDRESS C
8  C    D      CURRENT VALUE OF LEAVES-ONLY POINTER REPRESENTING NODE C
9  C    DR     ARRAY GIVING RANK OF AN UNSEEN SYMBOL AMONG THE SET OF NSYM
10 C    E      INTERNAL NODE LABEL FOR NODE C
11 C    EQ     NO. OF LOCATIONS IN HASH STORAGE ARRAY
12 C    F      VIRTUAL ADDRESS ARRAY            HASH KEYS
13 C    F      F(J)=VIRTUAL ADDRESS OF NODE WHOSE LABEL IS FF(J)
14 C    FE     DIRECT STORAGE FOR INTERNAL NODE LABELS   1/2 WORD PER LABEL
15 C    FE(J)=INTERNAL NODE LABEL FOR NODE WHOSE ADDRESS IS J
16 C    FF     INTERNAL NODE LABELS  FOR HASHED NODES
17 C    FF     FF(J)=INTERNAL NODE LABEL OF NODE WHOSE ADDRESS IS GIVEN BY F(J)
18 C    FF     ONE HALF MACHINE WORD USED TO STORE AN INTERNAL NODE LABEL
19 C    G      PARENT LIST     G(K)=ADDRESS OF NODE K
```

```
 20 C      GG      EXTENSION LENGTH LIST (TO LAST DESCENDANT OF NODE)
 21 C      H       NO. OF GREEN LEAVES IN THE INCREMENTAL SEARCH TREE
 22 C      K       NO. OF INTERNAL NODES, PARSED SEGMENTS, COMMAS    CANNOT EXCEED KM
 23 C      KA      2**(A-1)     TEST FOR A UPDATES
 24 C      KB      2**B         TEST FOR B UPDATES
 25 C      M       BIT LENGTH OF SYMBOLS IN INPUT STREAM       LOG ALPHA
 26 C      MM      ALPHABET SIZE     ALPHA      2**M
 27 C      MW      COMPUTER WORD LENGTH IN BITS
 28 C      N       NO. OF COMPUTER WORDS OF INPUT LEFT IN INPUT DISC FILE
 29 C      NSYM    NO. OF POTENTIAL SYMBOLS REMAINING BUT UNSEEN AS YET    (MM-BSYM)
 30 C      R       INPUT BUFFER ARRAY    HOLDS SEQUENCE TO BE ENCODED
 31 C      SL      NO. OF COMPUTER WORDS PER DISC SECTOR
 32 C      STR     START SECTOR FOR  INPUT DATA IN FILE F0
 33 C      SYM     SYMBOL REPRESENTATIVES       SYM(X)=REPRES. OF SYMBOL J, X=J+XCORM
 34 C      TS      TOTAL STORAGE AVAILABLE FOR SEARCH TREE AND SYMBOL ARRAYS
 35 C      XCOR    SIZE OF DIRECT STORAGE  (NO. OF NODES WHOSE LABELS CAN BE IN FE)
 36        IMPLICIT INTEGER (A-Z)
 37        LOGICAL LV
 38        REAL S,SA,SC
 39        COMMON F(24001),G(12000),GG0,GG(24001)
 40        COMMON R(6600)                      @ INPUT DATA
 41        DIMENSION FE(2),SYM(2),DR(2),FF(2),GE(2)
 42        DIMENSION PAR(28)                   @ PARAMETERS TO BE SAVED FOR DECODER
 43        EQUIVALENCE (F,FE,FF),(F(2),DR,SYM),(GE,GG)
 44        EQUIVALENCE   (TS,PAR), (M,PAR(2)),(EQ,PAR(3)),(KM,PAR(4)),(MW,PA
 45       6R(5)),(BL,PAR(6)),(SL,PAR(7)),(N2,PAR(8))
 46        EQUIVALENCE (H,PAR(9)),(K,PAR(10)),(ASYM,PAR(11)),(BSYM,PAR(12)),
 47       6(KA,PAR(13)),(KB,PAR(14)),(AMW,PAR(15)),(BMW,PAR(16)),
 48       2(MM,PAR(17)),( N,PAR(18)),(XC2,PAR(19)),(XCOR2,PAR(20))
 49        EQUIVALENCE  (YCOR,PAR(21)),   (ND,PAR(22)),(A,PAR(23)),
 50       1(B,PAR(24)),(NSYM,PAR(25)),(XCOR,PAR(26)),
 51       2(FS,PAR(27)),(N1,PAR(28))       @ FIRST SYMBOL, NO. OF INPUT RECORDS
 52        EQUIVALENCE (LV,BV)
 53        NAMELIST/DATA/ N,M,TS,BL,STR
 54        DATA N,M,TS,MW,BL,SL/27778,3,6000,36,200,28/       @ 6K TOTAL STORAGE
 55 C
 56 C      1. INITIALIZATION
 57 C
 58        CALL WAITER
 59        X=ITIME(0)                       @ TO INITIATE TIMING OF RUN
 60        READ(5,DATA)
 61        READ(5,7) TS                       @ MAX STORAGE FOR TREE
 62        MM=2**M                          @ MAX NUMBER OF DISTINCT SYMBOLS    ALPHA
 63        MM1=MM-1                         @ ALPHA-1
 64        MM2=2*MM                         @ START LOCATION FOR DIRECT STORAGE FE
 65        MM21=MM2-1                       @ LAST LOCN IN ARRAY DR
 66        KM=2*TS-4*MM                     @ MAX POSSIBLE NO. OF NODES   (ALL DIRECT
 67        KA=MM/2                          @ 2**(A-1)
 68        XCOR=KM/KA+1                     @ SIZE OF DIRECT STORAGE
 69        IF(XCOR.LT.11) XCOR=11
 70        IF(M.EQ.1) XCOR=(5*KM)/6+1
 71        XCOR2=(XCOR+3)/2+MM2             @ START LOCN FOR ARRAY F   IN ARRAY FE
 72        XC0=TS+1-XCOR2                   @ REMAINING STORAGE FOR HASH ARRAYS
 73        XC1=XC0/3                        @ SIZE OF INTERNAL NODE LABEL ARRAY FF
 74        XS=XC0-3*XC1                     @ WASTED STORAGE
 75        KM=KM+2*XS                       @ WILL ASSIGN XS MORE UNITS TO DIRECT ST
 76        XCOR=XCOR+2*XS                   @ WILL ASSIGN XS MORE UNITS TO DIRECT ST
 77        XCOR2=XCOR2+XS
 78        EQ=2*XC1                         @ SIZE OF VIRTUAL ADDR ARRAY F
 79        XC2=EQ+XCOR2                     @ START LOCN FOR ARRAY FF
 80        YCOR=2*XCOR2-3                   @ CAPACITY OF DIRECT STORE FOR DESC LIST
 81        KX=(19*EQ)/20                    @ MAX NO. OF NODES TO BE HASHED
 82        IF(KX.LE.0) KX=1
 83        IF(EQ.LE.0) EQ=1
```

```
84        WRITE(6,11) KM,XCOR,YCOR ,XCOR2,XC1,XC2,EQ,KX,XS
85        MMW=MW-M                        @ COMPUTER WORD - INPUT SYMBOL LENGTH
86        MW2=MW/2                        @ HALF WORD
87        AMW=MMW                         @ MW-A    COMP. WD - OUTPUT SYMBOL LENGTH
88        BMW=MW                          @ MW-B  COMP. WD LENGTH - POINTER LENGTH
89        ND=SL*BL                        @ NO. OF COMPUTER WORDS IN A R/W BLOCK
90        ND1=ND+1
91        NR=ND+1000                      @ WILL READ EXTRA 1000 WORDS UNTIL LAST
92        NRD=-1                          @ USED TO COUNT NO. OF READS -1
93        JL=ND*MW                        @ NO. OF BITS IN A R/W BLOCK
94        NS=N                            @ NO. OF COMP. WDS IN INPUT SEQ.  SAVE N
95        NSYM=MM                         @ NO. OF DISTINCT SYMBOLS REMAINING
96        ASYM=-MM1                       @ 1-NSYM
97        A=M                             @ LOG NSYM    NO. OF BITS FOR NEW SYMBOL
98        H=1                             @ NO. OF GREEN LEAVES
99        KB=1                            @ 2**B
100       V=1                             @ INDEX OF CURRENT OUTPUT WORD
101       G(1)=1
102       K=1                             @ NO. OF LABELLED NODES
103       DO 18 L=0,MM1                   @ FOR ALL POTENTIAL SYMBOLS L
104    18 DR(L+MM)=L                      @ DEFINE RANK OF UNSEEN SYMBOL L
105       C=1                             @ ROOT OF SEARCH TREE
106       C3=1+MM2                        @ LOCATION FOR ROOT IN ARRAY FE
107       C2=HASH(C,EQ)                   @ HASH VIRTUAL ADDRESS C
108       GO TO 47
109 C
110 C     2. UPDATE LAST-DESCENDANT LIST
111 C
112    20 CONTINUE
113       IF(D.LT.YCOR) GO TO 27          @ FOR SMALL D USE DIRECT STORE
114       D2=HASH(D,EQ)                   @ HASH POINTER D TO GET LOCN IN GG
115       GO TO 24
116    26 IF(GG(D5).EQ.D.) GO TO 29       @ ACCEPT LOCN IF VALUE AGRRES WITH D
117       D2=REHASH(X,EQ)                 @ REHASH TO OBTAIN NEW LOCATION
118    24 D5=D2+XCOR2                     @ LOCN FOR STORED VALUE TO CF WITH D
119       IF(GG(D5).NE.0) GO TO 26        @ ACCEPT LOCN IF EMPTY
120       GG(D5)=D                        @ STORE  PTR IDENTIFIER FOR HASH LOCN D3
121    29 D3=(D2+1)/2                     @ WORD CONTAINING DESCENDANT OF D
122       D4=MW2*((D2+1)-2*D3)            @ BIT LOCATION WITHIN D3
123       D3=D3+XC2                       @ WORD CONTAINING DESCENDANT OF D
124       GO TO 28                        @ STORE NEW OR UPDATED DESCENDANT FOR D
125    27 D3=(D+1)/2                      @ DIRECT STORE LOCN FOR DESCENDANT OF D
126       D4=MW2*((D+1)-2*D3)             @ BIT POSITION WITHIN WORD D3
127    28 FLD(D4,MW2,GE(D3))=XL           @ STORE EXTENSION LENGTH TO LAST DESCENDT
128    23 IF(SCOND.EQ.0) GO TO 45         @ NEW SYMBOL?   END OF PTR ENCODING PHASE
129
130 C     3. UPDATE SYMBOL TABLES
131 C
132       Y=DR(SCOND)                     @ REPLACE SYMBOL BY RANK IN UNSEEN LIST
133       DO 37 L=SCOND,MM21              @ FOR ALL SYMBOLS NOT LESS THAN SCOND
134    37 DR(L)=DR(L)-1                   @ DECREMENT RANKINGS IN UNSEEN LIST
135    33 NSYM=NSYM-1                     @ NO. OF DISTINCT SYMBOLS REMAINING
136       IF(NSYM.EQ.0) GO TO 39          @ ANY UNSEEN SYMBOLS LEFT?
137       BSYM=BSYM+1                     @ NO. OF SYMBOLS SEEN SO FAR
138       ASYM=ASYM+1                     @ 1-NSYM
139       H=H+K                           @ ACTIVATE K NEW GREEN LEAVES
140       IF(NSYM.NE.KA) GO TO 39         @ A UPDATE NEEDED?
141       A=A-1                           @ LOG NSYM
142       AMW=AMW+1                       @ MW-A
143       KA=KA/2                         @ 2**(A-1)
144    39 SCOND=0                         @ END OF SYMBOL ENCODING PHASE
145 C
146 C     4. UPDATE SEARCH TREE
147 C
```

```
148      45 I=I-M                         @ RESET NO. OF BITS PROCESSED SO FAR
149         CNT=CNT+1                     @ NO. OF COMMAS  (K IF K<KM)
150         K=K+1                         @ NUMBER OF INTERNAL NODES
151         G(K)=C                        @ VIRTUAL ADDRESS OF NODE K
152         H=H+BSYM                      @ NO. OF GREEN LEAVES
153         IF(C.LT.XCOR) GO TO 47        @ STORE EARLY LABEL IN ARRAY FE
154      46 F(C5)=C                       @ STORE VIRTUAL ADDRESS FOR NEW INTERNAL NODE
155         CY=CY+1                       @ NO. OF HASHED LABELS
156         IF(CY.EQ.KX) KM=K
157         C3=(C2+1)/2                   @ FIND INTERNAL NODE LABEL LOCATION
158         C4=MW2*((C2+1)-2*C3)
159         C3=C3+XC2                     @ LOCN FOR STORED INTERNAL NODE LABEL
160         FLD(C4,MW2,FF(C3))=K          @ STORE INTERNAL NODE LABEL FOR NEW NODE
161         GO TO 44
162      47 FLD(C4,MW2,FE(C3))=K          @ LABEL ASSIGNED TO NODE C
163         CX=CX+1                       @ NO. OF LABELS IN FE (XCOR) AREA
164         GO TO 44
165      42 B=B+1                         @ LOG H
166         BMW=BMW-1                     @ MW-B
167         KB=2*KB                       @ 2**B
168      44 IF(H-KB) 43,43,42             @ B UPDATE NEEDED?
169      43 CONTINUE                      @ END OF SEARCH-TREE UPDATE
170         IF(K.EQ.KM) GO TO 70          @ EXIT IF TREE HAS ATTAINED FULL GROWTH
171 C
172 C       5. TEST FOR EXHAUSTION OF INPUT - GET MORE IF NEEDED AND AVAILABLE
173 C
174         C=1                           @ BEGIN NEXT TRACE AT TREE ROOT
175         D=0                           @ INITIALIZE POINTER VALUE  (CODEWORD)
176         XL=1                          @ INITIALIZE EXTENSION LENGTH
177         IF(I.LT.J) GO TO 66           @ MORE INPUT NEEDED?
178         IF(N.EQ.0) GO TO 70           @ TERMINATE IF END OF INPUT
179         IF(N.GT.NR) GO TO 55          @ COMPLETE DATA BLOCK LEFT?
180         J=MW*N+J                      @ NO. OF INPUT BITS READ SO FAR
181         NR=N                          @ NO. OF WORDS FOR FINAL READ
182         N=0                           @ NO MORE INPUT DATA
183         GO TO 56
184      55 N=N-ND                        @ NO. OF WORDS STILL TO BE READ
185         J=J+JL                        @ NO. OF BITS  READ SO FAR
186      56 NRD=NRD+1                     @ NO. OF INPUT DATA BLOCKS READ SO FAR
187         CALL FSTRD(NR,R,NRD,BL,STR,0) @ GET NEXT ND WORDS OF INPUT FROM FILE FO
188         GO TO 66                      @ END OF INPUT FETCH PHASE
189 C
190 C       6. TRACE NEW INPUT ALONG SEARCH TREE STARTING AT THE ROOT (C=1)
191 C
192      60 IF(F(C5).EQ.0) GO TO 20       @ IF UNDEFINED, RETURN TO PHASE 2
193         C2=REHASH(X,EQ)               @ NEW HASH GIVES REAL ADDRESS C2
194         CZ=CZ+1                       @ NO. OF REHASHES
195      63 C5=C2+XCOR2                   @ LOCN FOR STORED VIRTUAL ADDRESS
196         IF(F(C5).NE.C) GO TO 60       @ DOES STORED VIRTUAL ADDRESS MATCH INPUT
197         C3=(C2+1)/2                   @ MATCH - LOCATE INTERNAL NODE LABEL
198         C4=MW2*((C2+1)-2*C3)          @ COMPLETE LOCATION OF NODE LABEL
199         C3=C3+XC2                     @ LOCN FOR STORED INTERNAL NODE LABEL
200         E=FLD(C4,MW2,FF(C3))          @ INTERNAL NODE LABEL FOR C
201      67 M1=(I+MMW)/MW                 @ TO LOCATE NEXT INPUT SYMBOL
202         M2=(I+MMW)-MW*M1              @ BIT POSN AT WHICH SYMBOL BEGINS
203         M1=M1-NRD*ND                  @ WORD LOCATION IN INPUT ARRAY R
204         IF(MMW.GT.M2) GO TO 62        @ DOES SYMBOL CROSS COMPUTER WD BOUNDARY?
205         M3=MW-M2                      @ NO. OF BITS TO TAKE FROM R(M1)
206         M4=M-M3                       @ NO. OF BITS TO TAKE FROM R(M1+1)
207         Y=FLD(0,M4,R(M1+1))           @ GET TAIL OF SYMBOL FROM R(M+1)
208         FLD(MMW,M3,Y)=FLD(M2,M3,R(M1))@ GET HEAD OF SYMBOL FROM R(M1)
209         GO TO 64
```

```
210      62 Y=FLD(M2,M,R(M1))              @ GET SYMBOL FROM R(M1)
211      64 IF(SYM(Y).NE.0) GO TO 65        @ NEW SYMBOL?
212         SYM(Y)=NSYM                     @ DEFINE NEW SYMBOL REPRESENTATIVE
213         SCOND=Y+MM                      @ SAVE NEW SYMBOL
214      65 Y=SYM(Y)                        @ REPLACE SYMBOL Y BY ITS REPRESENTATIVE
215         C=MM*E-Y+2                      @ REPLACE C BY APPROPRIATE SON NODE
216         XL=XL+1                         @ LENGTH OF EXTENSION TO LAST DESCENDANT
217         IF(Y.EQ.MM) GO TO 66            @ SKIP IF Y IS 1ST SYMBOL
218         XL=1                            @ RESET EXTENSION LENGTH
219         D=C-E-1                         @ REDEFINE LEAVES-ONLY POINTER
220      66 I=I+M                           @ NO. OF BITS PROCESSED - GET NEXT INPUT SYM
221      68 IF(C.LT.XCOR) GO TO 61          @ EARLY LABEL?
222         CU=CU+1                         @ NO. OF TIMES NEED TO HASH ADDRESS
223         C2=HASH(C,EQ)
224         GO TO 63
225      61 C3=(C+1)/2
226         C4=MW2*((C+1)-2*C3)
227         C3=C3+MM2
228         IF(FLD(C4,MW2,FE(C3)).EQ.0) GO TO 20    @ EXIT IF LABEL UNDEFINED
229         E=FLD(C4,MW2,FE(C3))            @ GET LABEL OF NODE C
230         GO TO 67
231 C
232 C       7. TERMINATION
233 C
234      70 N=MW*NS                         @ NO. OF BITS PROCESSED
235         Y=MM*K+1                        @ TOTAL NO. OF NODES IN FULL VIRTUAL TREE
236         WRITE(6,8) Y,H,K
237         BSYM=MM-NSYM
238         WRITE(6,5) BSYM                 @ NO. OF DISTINCT INPUT SYMBOLS FOUND
239         XCOR=XCOR-1
240         WRITE(6,4) XCOR
241         DO 73 J=1,MM
242      73 R(J)=0                          @ CLEAR R TO HOLD SYM INVERSE
243         DO 72 J=0,MM1                   @ FOR ALL SYMBOLS
244         J1=SYM(J)
245      72 R(J1)=J+1                       @ FORM INVERSE OF SYM ARRAY FOR DECODER
246         FS=R(MM)-1                      @ SAVE FIRST SYMBOL FS FOR DECODER
247         WRITE(6,11) (PAR(J),J=1,28)
248         CALL FSTWT(28,PAR,0,0,0,1)
249         CALL FSTWT(TS+1,F,0,0,1,1)      @ SAVE SEARCHTREE
250         Y=(TS+SL)/SL
251         CALL FSTWT(K,G,Y,1,1,1)
252         F(1)=GG0
253         DO 71 J=2,640,2
254         J1=J/2
255         F(J)=FLD(0,18,GG(J1))
256         F(J+1)=FLD(18,18,GG(J1))
257      71 CONTINUE
258         Y=Y+(K+SL-1)/SL
259         CALL FSTWT(TS+2,GG0,Y,1,1,1)    @ EXTENSION LENGTHS
260         Y=Y+TS/SL+1
261         CALL FSTWT(MM,R,Y,1,1,1)        @ STORE SYM INVERSE TABLE FOR DECODER
262         SC=CX
263         SC=SC/XCOR                      @ FREQUENCY OF UNHASHED LABELS
264         W=I/M                           @ NO. OF INPUT SYMBOLS
265         S=CU
266         S = S/W                         @ FREQUENCY OF USE OF HASHED LABELS
267         SA=I
268         SA=SA/N
269         WRITE(6,3) W,CNT,CU,CX,CY,CZ,S,SC,SA
270         X=ITIME(N)                      @ PRINT ELAPSED TIME IN SECONDS
271         CALL UNWAIT
272         STOP                            @ END OF PROGRAM
```

```
273 C
274        2 FORMAT(1X,2I8,2X,F6.4, I9,6H NODES,I9,13H GREEN LEAVES,5I9)
275 3       FORMAT(1H0,6I9,3(2X,F6.4))
276        4 FORMAT(11H0EXTRA CORE,I6)
277        5 FORMAT(1H0,I5,8H SYMBOLS)
278 7       FORMAT()
279        8 FORMAT(1H0,I9,6H NODES,3X,I9,13H GREEN LEAVES,3X,I6,15H INTERNAL N
280         6ODES)
281       10 FORMAT(18H0COMPRESSION RATIO,3X,F6.4)
282       11 FORMAT(1X,20I6)
283       12 FORMAT(7H0COST =,I7)
284          END
```

Program WLE38T2            SHORT-RECORD ENCODER

```
1        COMPILER (FLD=ABS),(XM=1)
2 C   A     LOG NSYM    NEED A OR A-1 BITS TO ENCODE NEW SYMBOL
3 C   B     LOG H       NEED B OR B-1 BITS TO ENCODE POINTER
4 C   BL    NO. OF DISC SECTORS PER READ-WRITE BLOCK
5 C   BSYM  NO. OF DISTINCT INPUT SYMBOLS SEEN SO FAR
6 C   C     VIRTUAL ADDRESS OF CURRENT NODE DURING TRACE OF FORWARD PATH IN TREE
7 C   C2    REAL ADDRESS OF NODE OBTAINED BY HASHING VIRTUAL ADDRESS C
8 C   D     CURRENT VALUE OF LEAVES-ONLY POINTER REPRESENTING NODE C
9 C   DR    ARRAY GIVING RANK OF AN UNSEEN SYMBOL AMONG THE SET OF NSYM
10 C  E     INTERNAL NODE LABEL FOR NODE C
11 C  EQ    NO. OF LOCATIONS IN HASH STORAGE ARRAY
12 C  F     VIRTUAL ADDRESS ARRAY          HASH KEYS
13 C  F     F(J)=VIRTUAL ADDRESS OF NODE WHOSE LABEL IS FF(J)
14 C  FE    DIRECT STORAGE FOR INTERNAL NODE LABELS   1/2 WORD PER LABEL
15 C  FE    FE(J)=INTERNAL NODE LABEL FOR NODE WHOSE ADDRESS IS J
16 C  FF    INTERNAL NODE LABELS  FOR HASHED NODES
17 C  FF    FF(J)=INTERNAL NODE LABEL OF NODE WHOSE ADDRESS IS GIVEN BY F(J)
18 C  FF    ONE HALF MACHINE WORD USED TO STORE AN INTERNAL NODE LABEL
19 C  H     NO. OF GREEN LEAVES IN THE INCREMENTAL SEARCH TREE
20 C  K     NO. OF INTERNAL NODES, PARSED SEGMENTS, COMMAS    CANNOT EXCEED KM
21 C  KA    2**(A-1)    TEST FOR A UPDATES
22 C  KB    2**B        TEST FOR B UPDATES
23 C  M     BIT LENGTH OF SYMBOLS IN INPUT STREAM    LOG ALPHA
24 C  MM    ALPHABET SIZE    ALPHA    2**M
25 C  MW    COMPUTER WORD LENGTH IN BITS
26 C  N     NO. OF COMPUTER WORDS OF INPUT LEFT IN INPUT DISC FILE
27 C  ND    NO. OF WORDS PER READ/WRITE BLOCK    ND=SL*BL
28 C  NSYM  NO. OF POTENTIAL SYMBOLS REMAINING BUT UNSEEN AS YET   (MM-BSYM)
29 C  N1    NUMBER OF INPUT DATA RECORDS
30 C  N2    LENGTH OF INPUT DATA RECORD
31 C  N3    NO. OF RECORDS PER READ BLOCK
32 C  OP    OUTPUT POINTERS - LOCATE COMPRESSED RECORD
33 C  R     INPUT BUFFER ARRAY    HOLDS SEQUENCE TO BE ENCODED
34 C  SL    NO. OF COMPUTER WORDS PER DISC SECTOR
35 C  STR   STARTING SECTOR ADDRESS IN FILE FO FOR INPUT DATA
36 C  SYM   SYMBOL REPRESENTATIVES    SYM(X)=REPRES. OF SYMBOL J, X=J+XCORM
37 C  TA    THRESHOLD FOR DECIDING TO USE A OR A-1 BITS TO ENCODE NEW SYMBOL
38 C  TB    THRESHOLD FOR DECIDING TO USE B OR B-1 BITS TO ENCODE POINTER
39 C  TS    TOTAL STORAGE AVAILABLE FOR SEARCH TREE AND SYMBOL ARRAYS
40 C  U     CURRENT BIT POSITION IN OUTPUT WORD Z(V)
41 C  V     CURRENT WORD IN OUTPUT ARRAY Z
42 C  XCOR  SIZE OF DIRECT STORAGE   (NO. OF NODES WHOSE LABELS CAN BE IN FE)
43 C  Z     OUTPUT BUFFER ARRAY    HOLDS ENCODED OUTPUT SEQUENCE
44       IMPLICIT INTEGER (A-Z)
45       LOGICAL LV
46       REAL S,SC
```

```
47      COMMON F(12001),R(5600),Z(5600),OP(3000)
48      DIMENSION FE(2),SYM(2),DR(2),FF(2)
49      DIMENSION PAR(28)                    @ PARAMETERS TO BE SAVED FOR DECODER
50      EQUIVALENCE (F,FE,FF),(F(2),SYM,DR)
51      EQUIVALENCE    (TS,PAR), (M,PAR(2)),(EQ,PAR(3)),(KM,PAR(4)),(MW,PA
52     6R(5)),(BL,PAR(6)),(SL,PAR(7)),(N2,PAR(8))
53      EQUIVALENCE (H,PAR(9)),(K,PAR(10)),(ASYM,PAR(11)),(BSYM,PAR(12)),
54     6(KA,PAR(13)),(KB,PAR(14)),(AMW,PAR(15)),(BMW,PAR(16)),
55     2(MM,PAR(17)),( N,PAR(18)),(XC2,PAR(19)),(XCOR2,PAR(20))
56      EQUIVALENCE  (YCOR,PAR(21)),  (ND,PAR(22)),(A,PAR(23)),
57     1(B,PAR(24)),(NSYM,PAR(25)),(XCOR,PAR(26)),
58     2(FS,PAR(27)),(N1,PAR(28))           @ FIRST SYMBOL, NO. OF INPUT RECORDS
59      EQUIVALENCE (LV,BV)
60      NAMELIST/DATA/ N1,N2,N3,STR
61 C
62 C    1. INITIALIZATION
63 C
64      CALL WAITER
65      X=ITIME(0)                           @ TO INITIATE TIMING OF RUN
66      CALL FSTRD(28,PAR,0,0,0,1)
67      N=N/MW
68      READ(5,DATA)
69      WRITE(6,11) (PAR(V),V=1,28)
70      CALL FSTRD(TS+1,F,0,0,1,1)           @ GET SEARCHTREE
71      Z1=1                                 @ INDEX OF CURRENT INPUT BLOCK
72      COST2=0                              @ RESET COST
73      ND1=ND+1
74      NR=ND                                @ NO. OF WORDS PER READ BLOCK
75      NRD=-1                               @ USED TO COUNT NO. OF READS -1
76      JL=ND*MW                             @ NO. OF BITS IN A R/W BLOCK
77      MM1=MM-1                             @ ALPHA-1
78      MM2=2*MM
79      MMW=MW-M                             @ COMPUTER WORD - INPUT SYMBOL LENGTH
80      MW2=MW/2                             @ HALF WORD
81      V=1                                  @ INDEX OF CURRENT OUTPUT WORD
82      NL=MW*N2                             @ RECORD LENGTH IN BITS
83      T2=ND*MW-NL*N3                       @ NO. OF UNUSED BITS AT END OF EACH BLOCK
84      T1=-T2                               @ T1 WILL COUNT NO. OF BITS PROCESSED
85       TB=2*H-KB                           @ THRESHOLD FOR POINTER LENGTH (B OR B-1)
86       TA=2*(NSYM-KA)                      @ THRESHOLD FOR NEW SYMBOL LENGTH (A,A-1)
87      RCT=N3                               @ RECORD COUNT
88  10 I=T                                   @ RESET BIT COUNT TO START NEXT BLOCK
89      T=T+NL                               @ END OF NEXT RECORD
90      C=1                                  @ ROOT OF SEARCH TREE
91      C3=1+MM2                             @ LOCATION FOR ROOT
92      C2=HASH(C,EQ)                        @ HASH VIRTUAL ADDRESS C
93      GO TO 40                             @ GET INPUT DATA
94 C
95 C    2. ENCODE AND STORE POINTER   (ALWAYS STORE B BITS EVEN IF PTR USES B-1)
96 C
97  20 U1=U-BMW            @ U+B-MW  NO. OF BITS TO STORE IN Z(V+1)
98      D=ASYM*(D/MM1)+D                     @ GREEN LEAVES VALUE OF POINTER
99      D=IABS(D)                            @ GUARD AGAINST -0
100     LV=D.GE.TB                           @ BV    POINTER LENGTH WILL BE B-BV
101     IF(LV) D=2*D-TB                      @ ENCODE POINTER BY B-1 BITS IF CAN
102     IF(U1.LE.0) GO TO 22                 @ WILL OUTPUT OVERLAP WORD BOUNDARY?
103     U2=MW-U                              @ NO. OF BITS TO STORE IN WORD Z(V)
104     IF(U2.NE.0) FLD(U,U2,Z(V))=FLD(BMW,U2,D)   @ STORE POINTER HEAD IN Z(V)
105     V=V+1                                @ INDEX OF CURRENT OUTPUT WORD
106     IF (V.NE.ND1) GO TO 25               @ TIME TO STORE OUTPUT?
107     CALL FSTWT( ND,Z,NW, BL,0,3)         @ STORE CODED OUTPUT IN DISC FILE
108     NW=NW+1                              @ NO. OF OUTPUT DATA BLOCKS STORED SO FAR
109     V=1                                  @ RESET INDEX
110  25 FLD(0,U1,Z(V))=D                     @ COMPLETE STORAGE OF ENCODED POINTER
```

```
111        U=U1-BV                          @ CURRENT BIT POSN IN OUTPUT WORD Z(V)
112        GO TO 23
113     22 FLD(U,B,Z(V))=D                  @ STORE ENCODED POINTER IN Z(V)
114        U=U+B-BV                         @ CURRENT BIT POSN IN OUTPUT WORD Z(V)
115     23 CONTINUE
116        IF(SCOND.EQ.0) GO TO 45          @ SKIP PHASE 3 UNLESS HAVE NEW SYMBOL
117 C
118 C      3. ENCODE AND STORE NEW SYMBOL
119 C
120        U1=U-AMW                         @ U+A-MW   NO. OF BITS TO STORE IN Z(V+1)
121        Y=DR(SCOND)                      @ REPLACE SYMBOL BY RANK IN UNSEEN LIST
122        LV=Y.GE.TA                       @ DEFINE BV    SYMBOL LENGTH WILL BE A-BV
123        IF(LV) Y=2*Y-TA                  @ USE A-1 BITS FOR NEW SYMBOL IF CAN
124        IF(U1.LE.0) GO TO 31             @ WILL OUTPUT OVERLAP WORD BOUNDARY?
125        U2=MW-U                          @ NO. OF BITS TO STORE IN WORD Z(V)
126        IF(U2.NE.0) FLD(U,U2,Z(V))=FLD(AMW,U2,Y)   @ STORE SYMBOL  HEAD IN Z(V)
127        V=V+1                            @ INDEX OF CURRENT OUTPUT WORD
128        IF (V.NE.ND1) GO TO 32           @ TIME TO STORE OUTPUT?
129        CALL FSTWT( ND,Z,NW, BL,0,3)     @ STORE CODED OUTPUT IN DISC FILE
130        NW=NW+1                          @ NO. OF OUTPUT DATA BLOCKS STORED SO FAR
131        V=1                              @ RESET INDEX
132     32 FLD(0,U1,Z(V))=Y                 @ STORE SYMBOL TAIL
133        U=U1-BV                          @ CURRENT BIT POSITION IN WORD Z(V)
134        GO TO 33
135     31 FLD(U,A,Z(V))=Y                  @ STORE NEW SYMBOL IN Z(V)
136        U=U+A-BV                         @ CURRENT BIT POSN IN OUTPUT WORD Z(V)
137     33 SCOND=0                          @ RESET SCOND FOR NEXT TRACE
138 C
139 C      4. TEST FOR EXHAUSTION OF INPUT - GET MORE IF NEEDED AND AVAILABLE
140 C
141     45 I=I-M                            @ RESET NO. OF BITS PROCESSED SO FAR
142        D=0                              @ INITIALIZE POINTER VALUE  (CODEWORD)
143        CNT=CNT+1                        @ NO. OF COMMAS  (K IF K<KM)
144     40 C=1                              @ BEGIN TRACE AT ROOT OF SEARCHTREE
145        IF (I.GE.T) GO TO 60             @ TEST FOR END OF CURRENT DATA BLOCK Z1
146        IF(RCT.NE.N3) GO TO 56           @ MORE INPUT NEEDED?
147        J=J+JL                           @ NO. OF BITS  READ SO FAR
148        NRD=NRD+1                        @ NO. OF INPUT DATA BLOCKS READ
149        WRITE(6,2) T1,COST2,S,K,H,Z1
150        IF(N.LT.NR) NR=N
151        CALL FSTRD(NR,R,NRD, BL,STR,0)   @ GET  NEXT ND   WORDS OF SEQUENCE
152        N=N-NR
153        RCT=0                            @ RESET RECORD COUNT
154        I=0                              @ START FIRST NEW BLOCK  - RESET BIT CNT
155        T=NL                             @ RECORD END MARK
156        T1=T1+T2                         @ ADD UNUSED BITS AT END OF BLOCK TO COUN
157        GO TO 56                         @ END OF INPUT FETCH PHASE
158 C
159 C      5. TRACE NEW INPUT ALONG SEARCH TREE STARTING AT THE ROOT (C=1)
160 C
161     50 IF(F(C5).EQ.0) GO TO 20          @ IF UNDEFINED, RETURN TO PHASE 2
162        C2=REHASH(X,EQ)                  @ NEW HASH GIVES REAL ADDRESS C2
163     53 C5=C2+XCOR2                      @ LOCN FOR STORED VIRTUAL ADDRESS
164        IF(F(C5).NE.C) GO TO 50          @ DOES STORED VIRTUAL ADDRESS MATCH INPUT
165        C3=(C2+1)/2                      @ MATCH - LOCATE INTERNAL NODE LABEL
166        C4=MW2*((C2+1)-2*C3)             @ COMPLETE LOCATION OF NODE LABEL
167        C3=C3+XC2                        @ LOCN FOR STORED INTERNAL NODE LABEL
168        E=FLD(C4,MW2,FF(C3))             @ INTERNAL NODE LABEL FOR C
169     57 M1=(I+MMW)/MW                    @ TO LOCATE NEXT INPUT SYMBOL
170        M2=(I+MMW)-MW*M1                 @ BIT POSN AT WHICH SYMBOL BEGINS
171        IF(MMW.GT.M2) GO TO 52           @ DOES SYMBOL CROSS COMPUTER WD BOUNDARY?
172        M3=MW-M2                         @ NO. OF BITS TO TAKE FROM R(M1)
173        M4=M-M3                          @ NO. OF BITS TO TAKE FROM R(M1+1)
```

```
174        Y=FLD(0,M4,R(M1+1))              @ GET TAIL OF SYMBOL FROM R(M+1)
175        FLD(MMW,M3,Y)=FLD(M2,M3,R(M1))   @ GET HEAD OF SYMBOL FROM R(M1)
176        GO TO 54
177     52 Y=FLD(M2,M,R(M1))                @ GET SYMBOL FROM R(M1)
178     54 IF(SYM(Y).NE.0) GO TO 55         @ NEW SYMBOL?
179        SCOND=Y+MM                       @ SAVE NEW SYMBOL
180        Y=NSYM
181        GO TO 59
182     55 Y=SYM(Y)                         @ REPLACE SYMBOL Y BY ITS REPRESENTATIVE
183     59 C=MM*E-Y+2                       @ REPLACE C BY APPROPRIATE SON NODE
184        IF(Y.NE.MM) D=C-E-1              @ REDEFINE LEAVES-ONLY POINTER
185     56 I=I+M            @ NO. OF BITS PROCESSED - GET NEXT INPUT SYMBOL
186        IF(C.LT.XCOR) GO TO 51           @ EARLY LABEL?
187        CU=CU+1                          @ NO. OF TIMES NEED TO HASH ADDRESS
188        C2=HASH(C,EQ)
189        GO TO 53
190     51 C3=(C+1)/2
191        C4=MW2*((C+1)-2*C3)
192        C3=C3+MM2                        @ LOCATION FOR LABEL OF NODE C
193        IF(FLD(C4,MW2,FE(C3)).EQ.0) GO TO 20   @ EXIT IF LABEL UNDEFINED
194        E=FLD(C4,MW2,FE(C3))             @ GET LABEL OF NODE C
195        GO TO 57
196 C
197 C      6. TERMINATION
198 C
199     60 CONTINUE
200        T1=T1+NL                         @ NO. OF BITS PROCESSED
201        COST2=MW*(V-1)+U+NW*JL           @ TOTAL COST - NO. OF OUTPUT BITS
202        SC=COST2                         @ FLOAT COST TO GET COMPRESSION RATIO
203        S=SC/T1                          @ COMPRESSION RATIO
204        FLD( 0, 6,OP(Z1))=U              @ STORE PTR TO BIT LOCN FOR NEXT RECORD
205        FLD( 6,13,OP(Z1))=V              @ STORE PTR TO WORD LOCN FOR NEXT RECORD
206        FLD(19,17,OP(Z1))=NW             @ STORE PTR TO BLOCK LOCN FOR NEXT RECORD
207        RCT=RCT+1                        @ INCREMENT RECORD COUNT
208        Z1=Z1+1                          @ INCREMENT BLOCK COUNT
209        IF(Z1.LE.N1) GO TO 10            @ GET NEXT INPUT BLOCK Z1 AND PROCESS
210        WRITE(6,12) COST2
211        Y=MM*K+1                         @ TOTAL NO. OF NODES IN FULL VIRTUAL TREE
212        WRITE(6,8) Y,H,K
213        SC=(SC+N1+MW)/T1                 @ CR WHEN ADD IN COST OF OUTPUT POINTERS
214        WRITE(6,15) S,SC                 @ COMPRESSION RATIO
215        CALL FSTWT(V,Z,NW, BL,0,3)       @ STORE CODED OUTPUT
216        BSYM=MM-NSYM
217        WRITE(6,5) BSYM                  @ NO. OF DISTINCT INPUT SYMBOLS FOUND
218        XCOR=XCOR-1
219        WRITE(6,4) XCOR
220        WRITE(6,9) (PAR(J),J=1,8)
221        CALL FSTWT(28,PAR,0,0,0,1)
222        CALL FSTWT(Z1,OP,0,0,0,4)        @ STORE OUTPUT POINTERS
223        W=T/M                            @ NO. OF INPUT SYMBOLS
224        S=CU
225        S = S/W                          @ FREQUENCY OF USE OF HASHED LABELS
226        WRITE(6,3) W,CNT,CU,S
227        X=ITIME(T1)                      @ PRINT ELAPSED TIME
228        CALL UNWAIT
229        STOP                             @ END OF PROGRAM
230 C
231      1 FORMAT(1H1)
232      2 FORMAT(1X,2I8,2X,F6.4, I9,6H NODES,I9,13H GREEN LEAVES,8I9)
233      3 FORMAT(1H0,3I9,2(2X,F6.4))
234      4 FORMAT(11H0EXTRA CORE,I6)
235      5 FORMAT(1H0,I5,8H SYMBOLS)
236      7 FORMAT(9(1X,O12))
```

```
237       8 FORMAT(1H0,I9,6H NODES,3X,I9,13H GREEN LEAVES,3X,I6,15H INTERNAL N
238         6ODES)
239       9 FORMAT(1X,I12,7I6)
240      11 FORMAT(1X,20I6)
241      12 FORMAT(7H0COST =,I7)
242      15 FORMAT(18H0COMPRESSION RATIO,2(3X,F6.4))
243         END
```

Program WLE39T1            SHORT-RECORD DECODER

```
        COMPILER (FLD=ABS),(XM=1)
C       A      LOG NSYM    NEW SYMBOL WAS ENCODED USING A OR A-1 BITS
C       B      LOG H    POINTER WAS ENCODED USING B OR B-1 BITS
C       BL     NO. OF DISC SECTORS PER READ-WRITE BLOCK
C       BSYM   NO. OF OF DISTINCT SYMBOLS SEEN SO FAR
C       C      VIRTUAL ADDRESS OF CURRENT NODE DURING TRACE OF PATH IN SEARCH TREE
C       C1     INTERNAL NODE LABEL OF FATHER OF NODE C
C       C2     REAL ADDRESS OF NODE OBTAINED BY HASHING VIRTUAL ADDRESS C
C       COST   TOTAL NO. OF BITS IN INPUT SEQUENCE TO BE DECODED
C       D      ENCODED POINTER TO BE TRANSLATED INTO VIRTUAL ADDRESS C OF LEAF
C       DR     DR(J)=JTH UNSEEN SYMBOL, WHOSE RANK IS J-1
C       EQ     NO. OF LOCATIONS IN HASH STORAGE
C       G      BACKWARD POINTER TO FATHER OF NODE GROUP
C       G      G(J)=VIRTUAL ADDRESS OF NODE WHOSE LABEL IS J
C       GG     DESCENDANT LIST    GG(J)=DISTANCE TO LAST DESCENDANT OF NODE J
C       H      NO. OF GREEN LEAVES IN SEARCH TREE
C       I      LENGTH (IN BITS) OF OUTPUT  -  POINTER TO CURRENT OUTPUT BIT
C       K      NO. OF INTERNAL NODES, PARSED SEGMENTS, COMMAS    CANNOT EXCEED KM
C       KA     2**(A-1)
C       KB     2**B
C       KM     MAX TREE SIZE    SHOULD NOT EXCEED 2**MW2 NOR EQ
C       L      TEMPORARY STORAGE FOR DECODED STRING OF SYMBOLS IN REVERSE ORDER
C       M      BIT LENGTH OF SYMBOLS IN DECODED OUTPUT STREAM    LOG ALPHA
C       MM     ALPHABET SIZE    ALPHA    2**M
C       MW     COMPUTER WORD LENGTH IN BITS
C       N      LENGTH OF INPUT RECORD TO BE DECODED
C       OP     TABLE OF OUTPUT POINTERS FOR COMPRESSED DATA
C       R      DECODED SEQUENCE
C       S      NO. OF OUTPUT BITS TEMPORARILY STORED IN REVERSE SYMBOL ORDER IN L
C       SL     NO. OF COMPUTER WORDS PER DISC SECTOR
C       SYM    SYMBOL ARRAY    SYM(J)=SYMBOL WHOSE REPRESENTATIVE IS J
C       T      NO. OF INPUT BITS PROCESSED SO FAR
C       TA     THRESHOLD FOR NEW SYMBOL LENGTH, A OR A-1
C       TB     THRESHOLD FOR POINTER LENGTH , B OR B-1
C       U      CURRENT BIT POSITION IN INPUT WORD Z(V)
C       V      CURRENT WORD IN INPUT ARRAY Z
C       Z      INPUT ARRAY  -    COMPRESSED RECORD TO BE DECODED
        IMPLICIT INTEGER (A-Z)
        LOGICAL LV                    @ BV    1 IF USE ECONOMY LABEL
        COMMON F(128),G(8000),OP0,OP(3000),GG0,GG(12001)
        DIMENSION R(5600),Z(5600),L(200)
        DIMENSION PAR(28)             @ PARAMETERS  WERE SAVED FOR DECODER
        DIMENSION SYM(2),GE(2),DR(2)
        EQUIVALENCE (F,SYM,DR),(GE,GG)
        EQUIVALENCE   (TS,PAR), (M,PAR(2)),(EQ,PAR(3)),(KM,PAR(4)),(MW,PA
       6R(5)),(BL,PAR(6)),(SL,PAR(7)),(N2,PAR(8))
        EQUIVALENCE (H,PAR(9)),(K,PAR(10)),(ASYM,PAR(11)),(BSYM,PAR(12)),
       6(KA,PAR(13)),(KB,PAR(14)),(AMW,PAR(15)),(BMW,PAR(16)),
       2(MM,PAR(17)),( N,PAR(18)),(XC2,PAR(19)),(XCOR2,PAR(20))
        EQUIVALENCE  (YCOR,PAR(21)),    (ND,PAR(22)),(A,PAR(23)),
       1(B,PAR(24)),(NSYM,PAR(25)),(XCOR,PAR(26)),
       2(FS,PAR(27)),(N1,PAR(28))     @ FIRST SYMBOL, NO. OF RECORDS
        EQUIVALENCE (BV,LV)
```

```
      DATA CL/200/                  @ DIMENSION OF TEMPORARY ARRAY L
C
C     1. INITIALIZATION
C
      X=ITIME(0)
      CALL FSTRD(28,PAR,0,0,0,1)    @ GET STORED PARAMETERS
      MW1=MW-1
      MW2=MW/2                      @ HALF WORD
      MMW=MW-M                      @ COMPUTER WORD - OUTPUT SYMBOL LENGTH
      MM1=MM-1                      @ ALPHA-1
      MM2=2*MM                      @ 2*ALPHA
      MM3=MM2-3                     @ 2*ALPHA - 3
      MWM=MW/M                      @ NO. OF SYMBOLS IN MACHINE WORD
      TB=2*H-KB                     @ THRESHOLD FOR POINTER LENGTH, B OR B-1
      TA=2*(NSYM-KA)                @ THRESHOLD FOR NEW SYMBOL LENGTH (A,A-1)
      CALL FSTRD(MM2,F,0,0,1,1)     @ GET SYMBOL TABLES
      DO 12 J=0,MMW,M
  12  FLD(J,M,S0)=FS                @ FILL WORD S0 WITH FIRST SYMBOL
      Y=(TS+SL)/SL
      CALL FSTRD(K,G,Y,1,1,1)       @ GET BACKWARD TREE
      Y=Y+(K+SL-1)/SL               @ TO LOCATE DESCENDANT LIST
      CALL FSTRD(TS+2,GG0,Y,1,1,1)  @ EXTENSION LENGTH LIST
      Y=Y+TS/SL+1
      CALL FSTRD(MM,SYM,Y,1,1,1)    @ FETCH SYM INVERSE TABLE FOR DECODER
      CALL FSTRD(N1,OP,0,0,0,4)     @ GET TABLE OF OUTPUT POINTERS
      FLD(6,13,OP0)=1               @ LOAD START OF INPUT
  10  READ(5,1) Z1                  @ INPUT RECORD
      L1=OP(Z1-1)                   @ START OF DATA RECORD
      L2=OP(Z1)                     @ END OF DATA RECORD TO BE RETRIEVED
      IF(L2.EQ.0) GO TO 88          @ ZERO MEANS Z1 IS AN UNCODED RECORD
      U=FLD(0,6,L1)                 @ STARTING BIT POSN
      U2=FLD(0,6,L2)                @       END BIT POSN
      V1=FLD(6,13,L1)               @ STARTING WORD POSN
      V2=FLD(6,13,L2)               @       END WORD POSN
      W1=FLD(19,17,L1)              @ STARTING WORD BLOCK
      W2=FLD(19,17,L2)              @       END WORD BLOCK
      V3=(V1-1)/SL                  @ BLOCK TO READ
      N=ND*(W2-W1)+V2-V1            @ NO. OF WORDS TO READ - LENGTH OF INPUT
      CALL FSTRD(N+SL,Z,W1,BL,V3,3) @ GET COMPRESSED DATA RECORD Z1
      COST=MW*N+U2-U                @ LENGTH IN BITS OF COMPRESSED RECORD
      V=V1-SL*V3                    @ START POSN FOR RECORD IN ARRAY Z
      IF(NSYM.GT.0) CSYM=NSYM-1
      NSL=N+SL
      G(1)=1
      T=0                           @ RESET INPUT BIT COUNTER
      I=0                           @ RESET OUTPUT BIT POINTER
      GO TO 30                      @ READY TO FETCH FIRST POINTER
C
C     2. REVERSE DECODED STRING L AND STORE IN OUTPUT BUFFER R
C
  20  DO 25 J=S,M,-M                @ FOR ALL SYMBOLS STORED IN ARRAY L
      I=I+M                         @ NO. OF BITS CURRENTLY IN OUTPUT BUFFER
      M1=(I+MMW)/MW                 @ INDEX OF CURRENT OUTPUT WORD IN ARRAY R
      M2=(I+MMW)-MW*M1              @ BIT POSITION FOR NEXT OUTPUT IN R(M1)
      A1=(J+MMW)/MW                 @ INDEX OF WORD IN L HOLDING NEXT SYMBOL
      A2=(J+MMW)-MW*A1              @ BIT POSITION OF NEXT SYMBOL IN L(A1)
      IF(MMW.GE.A2) GO TO 21        @ WILL SYMBOL CROSS WORD BOUNDARY IN L?
      A3=MW-A2                      @ NO. OF BITS TO GET FROM L(A1)
      A4=M-A3                       @ NO. OF BITS TO GET FROM L(A1+1)
      Y=FLD(0,A4,L(A1+1))           @ GET TAIL OF SYMBOL FROM L(A1+1)
      FLD(MMW,A3,Y)=FLD(A2,A3,L(A1)) @ GET HEAD OF SYMBOL FROM L(A1)
      GO TO 24
  21  Y=FLD(A2,M,L(A1))             @ GET DECODED SYMBOL FROM L(A1)
```

```
    24 IF(MMW.GE.M2) GO TO 28                    @ WILL SYMBOL CROSS WORD BOUNDARY IN R?
       M3=MW-M2                                  @ NO. OF BITS TO STORE IN R(M1)
       M4=M-M3                                   @ NO. OF BITS TO STORE IN R(M1+1)
       FLD(0,M4,R(M1+1))=Y                       @ STORE TAIL OF SYMBOL IN R(M1+1)
       FLD(M2,M3,R(M1))=FLD(MMW,M3,Y)            @ STORE HEAD OF SYMBOL IN R(M1)
       GO TO 25
    28 FLD(M2,M,R(M1))=Y                         @ STORE DECODED SYMBOL FROM L IN R(M1)
    25 CONTINUE                                  @ END OF OUTPUT STORAGE PHASE
       IF(T.GE.COST) GO TO 80                    @ INPUT DATA EXHAUSTED?
C
C     3. FETCH POINTER.
C
    30 U1=U-BMW              @ U+B-MW            NO. OF BITS TO GET FROM Z(V+1)
       IF(U1.LE.0) GO TO 31                      @ DOES POINTER OVERLAP WORD BOUNDARY?
       U2=MW-U                                   @ NO. OF BITS TO GET FROM Z(V)
       D=FLD(0,U1,Z(V+1))                        @ GET TAIL OF NEXT POINTER
       IF(U2.NE.0) FLD(BMW,U2,D)=FLD(U,U2,Z(V))  @ GET HEAD OF NEXT POINTER
       V=V+1                                     @ INCREMENT INPUT WORD COUNT
       U=U1                                      @ CURRENT BIT POSITION IN INPUT WORD Z(V)
       GO TO 35
    31 D=FLD(U,B,Z(V))                           @ GET NEXT ENCODED POINTER
       U=U+B                                     @ UPDATE BIT POSN INDICATOR FOR INPUT WD
    35 LV=D.GE.TB                                @ POINTER USES B-BV BITS    DEFINE BV
       IF(LV) D=(D+TB)/2                         @ RECOVER GREEN-LEAVES VALUE OF POINTER
       U=U-BV                                    @ CURRENT BIT POSN IN WORD Z(V)
C
C     4. CONVERT POINTER TO VIRTUAL ADDRESS OF LEAF
C
       IF(D.NE.0) D=D+CSYM*((D-1)/BSYM)          @ REPLACE GREEN BY LEAVES-ONLY VALUE
       C=D+(D+MM3)/MM1                           @ CONVERT TO VIRTUAL ADDRESS
       IF(D.LT.YCOR) GO TO 47                    @ FOR SMALL D USE DIRECT STORE
       D2=HASH(D,EQ)                             @ HASH POINTER D TO GET LOCN IN GG
       GO TO 44
    49 D2=REHASH(X,EQ)                           @ REHASH TO OBTAIN NEW LOCATION
    44 D5=D2+XCOR2                               @ LOCN FOR STORED VALUE TO CF WITH D
       IF(GG(D5).NE.0) GO TO 46                  @    EXTENSION CASE
       XL=0                                      @ NO EXTENSION
       GO TO 45
    46 IF(GG(D5).NE.D) GO TO 49                  @ ACCEPT LOCN ONLY IF VALUE AGREES WITH D
       D3=(D2+1)/2                               @ WORD CONTAINING DESCENDANT OF D
       D4=MW2*((D2+1)-2*D3)                      @ BIT LOCATION WITHIN D3
       D3=D3+XC2                                 @ WORD CONTAINING DESCENDANT OF D
       GO TO 48                                  @ FETCH LAST DESCENDANT FOR POINTER D
    47 D3=(D+1)/2                                @ DIRECT STORE LOCN FOR DESCENDANT OF D
       D4=MW2*((D+1)-2*D3)                       @ BIT POSITION WITHIN WORD D3
    48 XL=FLD(D4,MW2,GE(D3))                     @ EXTENSION LENGTH TO LAST DESCENDANT
       IF(XL.EQ.0) GO TO 45
       XL1=XL/MWM                                @ NO. OF WORDS TO FILL WITH FIRST SYMBOL
       IF(XL1.EQ.0) GO TO 43
       DO 42 X=1,XL1
    42 L(X)=S0                                   @ FIRST SYMBOL FILLS WORD L(X)
    43 XL2=(XL-MWM*XL1)*M-M
       DO 41 S=0,XL2,M
    41 FLD(S,M,L(XL1+1))=FS                      @ FIRST SYMBOL IN POSN S OF WORD L(X+1)
    45 T=T+B-BV                                  @ NO. OF BITS PROCESSED
       S=XL*M                                    @ INITIALIZE COUNT OF DECODED BIT STRING
C
C     5. TRACE NEXT ARC IN PATH FROM LEAF TO ROOT AND DECODE ASSOCIATED SYMBOL
C
    50 S=S+M                                     @ BIT LENGTH OF DECODED STRING L
       A1=(S+MMW)/MW                             @ INDEX OF CURRENT WORD IN TEMP OUTPUT L
       IF(A1.GE.CL)     GO TO 85                 @ IS TEMPORARY STORAGE L EXCEEDED?
       A2=(S+MMW)-MW*A1                          @ BIT POSITION FOR NEXT SYMBOL OUT TO L
       X=C-2                                     @ SO X MOD MM WILL RUN FROM 0 TO MM1
```

```
      C1=X/MM+1                      @ INTERNAL NODE LABEL OF FATHER OF C
      C=G(C1)                        @ REPLACE C BY VIRTUAL ADDRESS OF FATHER
      X=MM*C1-X                      @ -X MOD MM    DECODED SYMBOL REPRESENTA
      IF(SYM(X).NE.0) GO TO 70       @ SKIP UNLESS NEW SYMBOL
C
C     6. READ NEW SYMBOL.
C
      U1=U+A-MW                      @ U+A-MW  NO. OF BITS TO GET FROM Z(V+1)
      IF(U1.LE.0) GO TO 61           @ SKIP UNLESS SYMBOL CROSSES WORD BOUNDRY
      U2=MW-U                        @ NO. OF BITS TO GET FROM Z(V)
      Y=FLD(0,U1,Z(V+1))             @ GET NEW SYMBOL TAIL
      IF(U2.NE.0) FLD(AMW,U2,Y)=FLD(U,U2,Z(V))   @ GET HEAD OF NEW SYMBOL
      V=V+1                          @ INCREMENT INDEX OF INPUT WORD IN Z
      U=U1                           @ CURRENT BIT POSITION IN INPUT WORD Z(V)
      GO TO 62
   61 Y=FLD(U,A,Z(V))                @ GET NEW SYMBOL
      U=U+A                          @ CURRENT BIT POSITION IN INPUT WORD Z(V)
   62 LV=Y.GE.TA                     @ NEW SYMBOL USES A-BV BITS   DEFINE BV
      IF(LV) Y=(Y+TA)/2              @ RECOVER NEW SYMBOL RANK
      U=U-BV                         @ CURRENT BIT POSN IN WORD Z(V)
      Y=Y+MM+1                       @ INCREMENT SYMBOL RANK TO AVOID ZERO
      Y=DR(Y)                        @ REPLACE Y BY SYMBOL WHOSE RANK IS Y
      T=T+A-BV                       @ NO. OF INPUT BITS PROCESSED
      GO TO 71
C
C     7. STORE DECODED SYMBOL IN TEMPORARY ARRAY L
C
   70 Y=SYM(X)-1                     @ CORRECT SYMBOL VALUE
   71 IF(MMW.GE.A2) GO TO 77         @ SKIP UNLESS SYMBOL CROSSES WORD BNDARY
      A3=MW-A2                       @ NO. OF BITS TO STORE IN L(A1)
      A4=M-A3                        @ NO. OF BITS TO STORE IN L(A1+1)
      FLD(0,A4,L(A1+1))=Y            @ PUT TAIL OF SYMBOL INTO L(A1+1)
      FLD(A2,A3,L(A1))=FLD(MMW,A3,Y) @ PUT HEAD OF SYMBOL INTO L(A1)
      IF(C-1) 50,20,50               @ TRACE NEXT ARC UNLESS AT ROOT
   77 FLD(A2,M,L(A1))=Y              @ STORE DECODED SYMBOL IN L
      IF(C-1) 50,20,50               @ TRACE NEXT ARC UNLESS AT ROOT
C
C     8. TERMINATION
C
   80 CONTINUE
      WRITE(6,4) Z1,COST,I           @ INPUT RECORD, INPUT LENGTH, OUTPUT LNGT
      WRITE(6,2) (R(J),J=1,N2)       @ WRITE DECODED RECORD
      XX=XX+1                        @ NO. OF RECORDS DECODED
      GO TO 10                       @ RETURN TO START
   85 WRITE(6,5)                     @ EXCEEDED CAPACITY OF L
      STOP                           @ END OF PROGRAM
   88 WRITE(6,4) Z1,N,W1,W2,V1,V2,U,U2
      WRITE(6,6) L1,L2
      X=ITIME(XX)                    @ PRINT TOTAL ELAPSED TIME
      STOP
C
    1 FORMAT(I5)
    2 FORMAT((1X,20A6))              @ OUTPUT
    4 FORMAT(1X,17I7)
    5 FORMAT(27HOTEMPORARY STORAGE EXCEEDED)
    6 FORMAT(8(2X,O12))
    8 FORMAT(1H0,I7,15H INTERNAL NODES,3X,I7,7H LEAVES)
      END
```

I claim:

1. Apparatus for compressing and decompressing short data records, said records being comprised of data over a predetermined alphabet, said apparatus comprising:

preprocessor means responsive to a sample of said data over said predetermined alphabet for constructing a searchtree database therefrom using Lempel-Ziv data compression, said searchtree database being incrementally grown until a predetermined limit is attained and thereafter maintained fixed, thereby constructing a fixed searchtree database, storage means for storing said fixed searchtree database, encoder means responsive to said fixed searchtree database in said storage means and to said short data records for compressing said short data records in accordance with said fixed searchtree database using said Lempel-Ziv data compression, thereby generating encoded records, said encoded records being stored in said storage means at locations thereof, encoded-record directory means responsive to said encoder means for generating a directory of said encoded records in accordance with said locations, said directory means being stored in said storage means, and decoder means responsive to said fixed searchtree database, said encoded records and said directory for decompressing, in accordance with said fixed Searchtree Database using Lempel-Ziv data decompression, an encoded record located by means of said directory, thereby generating a decompressed short-record.

2. The apparatus of claim 1 wherein said predetermined limit comprises exhaustion of said sample of said data.

3. The apparatus of claim 1 wherein said predetermined limit comprises exhaustion of said storage means for said fixed searchtree database.

4. The apparatus of claim 1 further including record modifier means responsive to said decompressed short-record for providing a modified short-record, said modified short-record being applied to said encoder means for recompression and storage back into said storage means.

5. The apparatus of claim 1 wherein said alphabet is comprised of a predetermined number of symbols, said Lempel-Ziv data compression and decompression utilized by said preprocessor means, said encoder means and said decoder means utilizes a count of the number of said symbols of said alphabet not yet encountered, said preprocessor means including means for maintaining said count fixed at the number of said symbols not yet encountered when said predetermined limit is attained, thereby providing a fixed new symbol count, said fixed new symbol count being provided as part of said fixed searchtree database.

6. The apparatus of claim 5 wherein said searchtree database represents a searchtree having a plurality of nodes, said searchtree database further including a last-descendant list utilized by said decoder means, said last-descendant list containing locations for said nodes, respectively, each said location containing the number of repetitions of the first symbol of said alphabet encountered by said preprocessor means to append to a string of symbols decoded by said decoder means.

* * * * *